US012061121B2

(12) United States Patent
Hosaka et al.

(10) Patent No.: US 12,061,121 B2
(45) Date of Patent: Aug. 13, 2024

(54) TEMPERATURE DETECTING ELEMENT AND IMAGING APPARATUS

(71) Applicant: SONY SEMICONDUCTOR SOLUTIONS CORPORATION, Kanagawa (JP)

(72) Inventors: Hajime Hosaka, Kanagawa (JP); Yoshikazu Nitta, Kanagawa (JP); Kenichi Okumura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 686 days.

(21) Appl. No.: 17/278,185

(22) PCT Filed: Aug. 16, 2019

(86) PCT No.: PCT/JP2019/032139
§ 371 (c)(1),
(2) Date: Mar. 19, 2021

(87) PCT Pub. No.: WO2020/070985
PCT Pub. Date: Apr. 9, 2020

(65) Prior Publication Data
US 2021/0364360 A1 Nov. 25, 2021

(30) Foreign Application Priority Data
Oct. 2, 2018 (JP) ................. 2018-187273

(51) Int. Cl.
*G01J 5/48* (2022.01)
*G01J 5/00* (2022.01)
*H04N 5/33* (2023.01)
(52) U.S. Cl.
CPC ............... *G01J 5/48* (2013.01); *H04N 5/33* (2013.01); *G01J 2005/0077* (2013.01)

(58) Field of Classification Search
CPC ........ G01J 5/48; G01J 2005/0077; G01J 5/06; G01J 5/0806; G01J 5/20; H04N 5/33; H04N 25/79; H01L 31/10
See application file for complete search history.

(56) References Cited

U.S. PATENT DOCUMENTS

| 2011/0228142 A1 | 9/2011 | Brueckner et al. |
| 2015/0116527 A1* | 4/2015 | Rossi .................. H04N 25/41 348/218.1 |

(Continued)

FOREIGN PATENT DOCUMENTS

| CN | 105900238 A | 8/2016 |
| CN | 106716486 A | 5/2017 |

(Continued)

OTHER PUBLICATIONS

International Search Report and Written Opinion of PCT Application No. PCT/JP2019/032139, issued on Nov. 5, 2019, 10 pages of ISRWO.

*Primary Examiner* — Brandi N Hopkins
*Assistant Examiner* — Janice M Soto
(74) *Attorney, Agent, or Firm* — CHIP LAW GROUP

(57) ABSTRACT

There is provided a temperature detecting element that includes a light-collecting portion and a sensor portion. The light collecting portion is constituted by a first light-collecting portion to which infrared light is incident and a second light-collecting portion to which infrared light having been exited from the first light-collecting portion is incident. The sensor portion is a portion to which infrared light having been exited from the second light-collecting portion is incident. At least one of the first light-collecting portion and the second light-collecting portion is provided on a base that covers the temperature detecting element.

17 Claims, 56 Drawing Sheets

(56) References Cited

U.S. PATENT DOCUMENTS

| | | | |
|---|---|---|---|
| 2016/0041038 A1* | 2/2016 | Geiger | G01J 5/0806 |
| | | | 250/338.1 |
| 2016/0133762 A1* | 5/2016 | Blasco Claret | H04N 25/134 |
| | | | 438/69 |
| 2017/0111558 A1 | 4/2017 | Brueckner et al. | |
| 2018/0347979 A1* | 12/2018 | Oigawa | G01C 11/30 |

FOREIGN PATENT DOCUMENTS

| | | |
|---|---|---|
| DE | 102009049387 A1 | 4/2011 |
| DE | 102014212104 A1 | 12/2015 |
| EP | 2428034 A2 | 3/2012 |
| EP | 2429176 A1 | 3/2012 |
| EP | 2432213 A1 | 3/2012 |
| EP | 3007228 A | 4/2016 |
| EP | 3162045 A1 | 5/2017 |
| JP | 10-209414 A | 8/1998 |
| JP | 2003-156390 A | 5/2003 |
| JP | 2007227676 A | 9/2007 |
| JP | 2010-067624 A | 3/2010 |
| JP | 2012-038768 A | 2/2012 |
| JP | 2012-507250 A | 3/2012 |
| JP | 2012-177676 A | 9/2012 |
| JP | 2013-157606 A | 8/2013 |
| JP | 2016-526294 A | 9/2016 |
| JP | 2017502277 A | 1/2017 |
| JP | 2017-520794 A | 7/2017 |
| KR | 10-2011-0074984 A | 7/2011 |
| KR | 10-2017-0023103 A | 3/2017 |
| TW | 201504602 A | 2/2015 |
| TW | 201606354 A | 2/2016 |
| WO | 2011/045324 A2 | 4/2011 |
| WO | 2014/142750 A1 | 9/2014 |
| WO | 2014/188018 A1 | 11/2014 |
| WO | 2015/197710 A1 | 12/2015 |
| WO | WO-2015037306 A | 3/2017 |

\* cited by examiner

FIG. 3
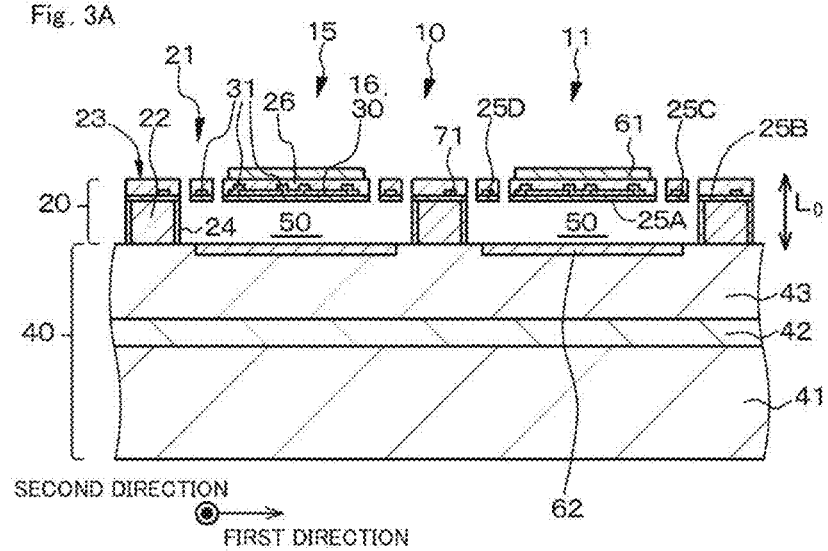
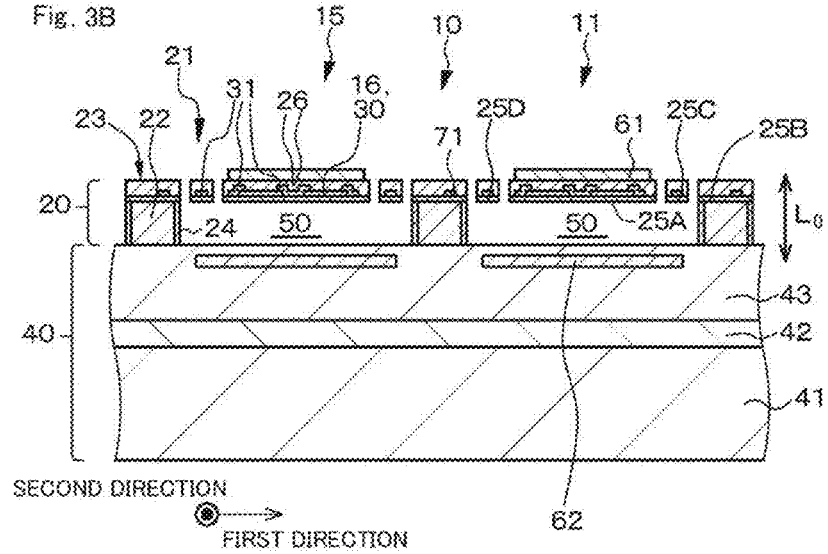

FIG. 7
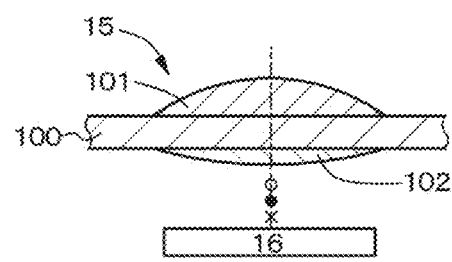
Fig. 7A
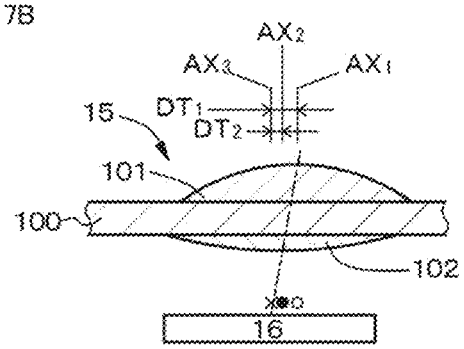
Fig. 7B
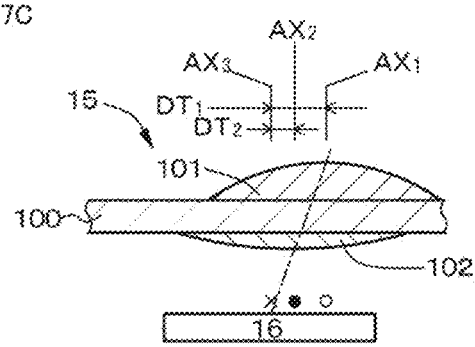
Fig. 7C

FIG. 8
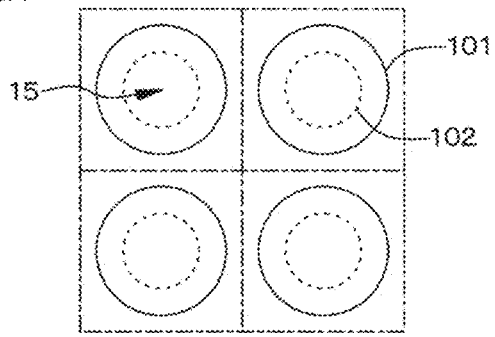
Fig. 8A
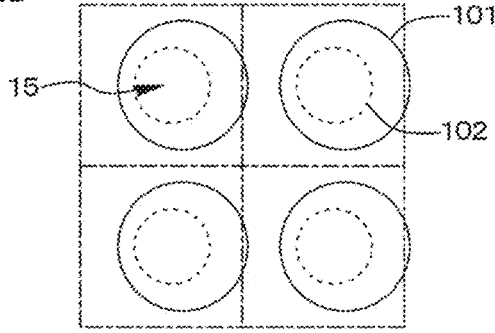
Fig. 8B
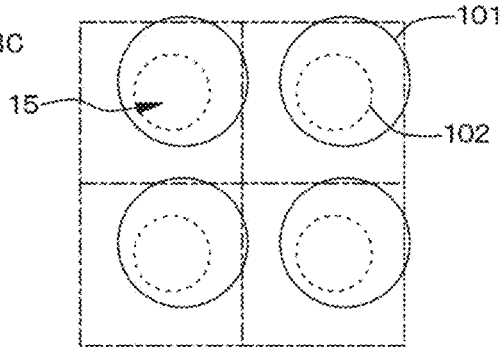
Fig. 8C

FIG. 10
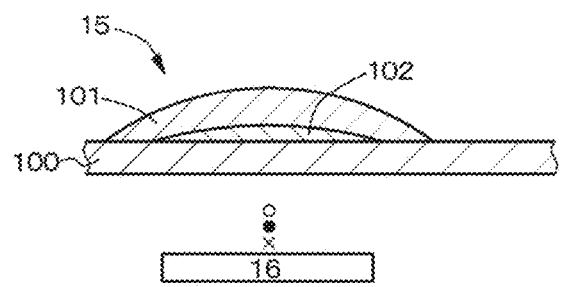
Fig. 10A
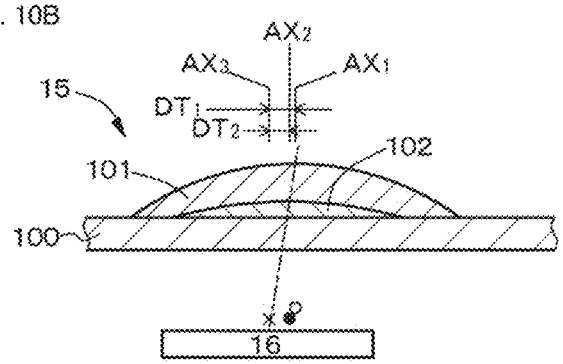
Fig. 10B
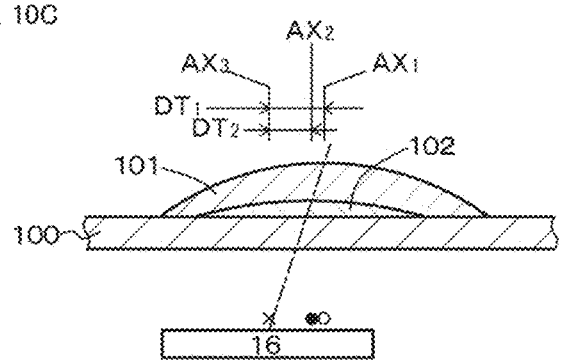
Fig. 10C

FIG. 11
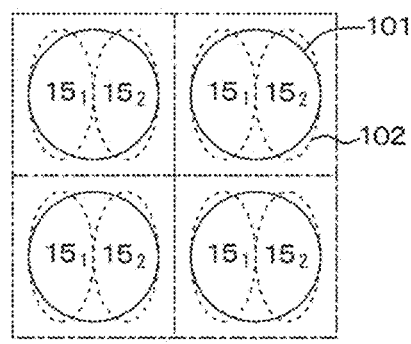
Fig. 11A
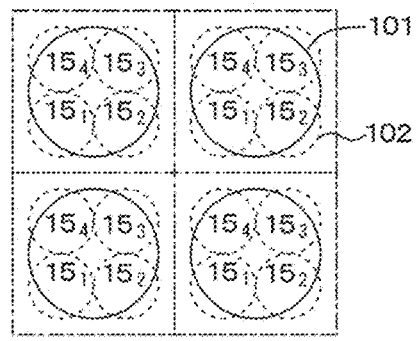
Fig. 11B

FIG. 15
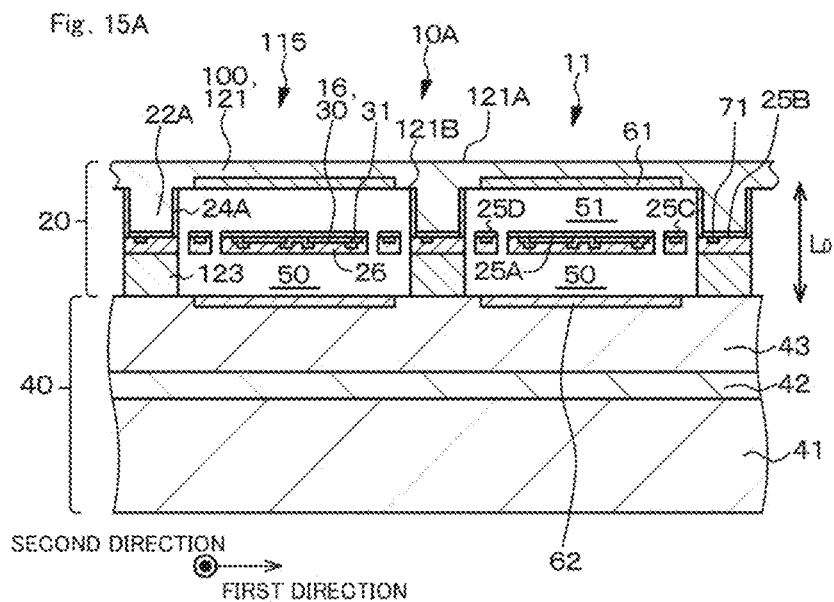
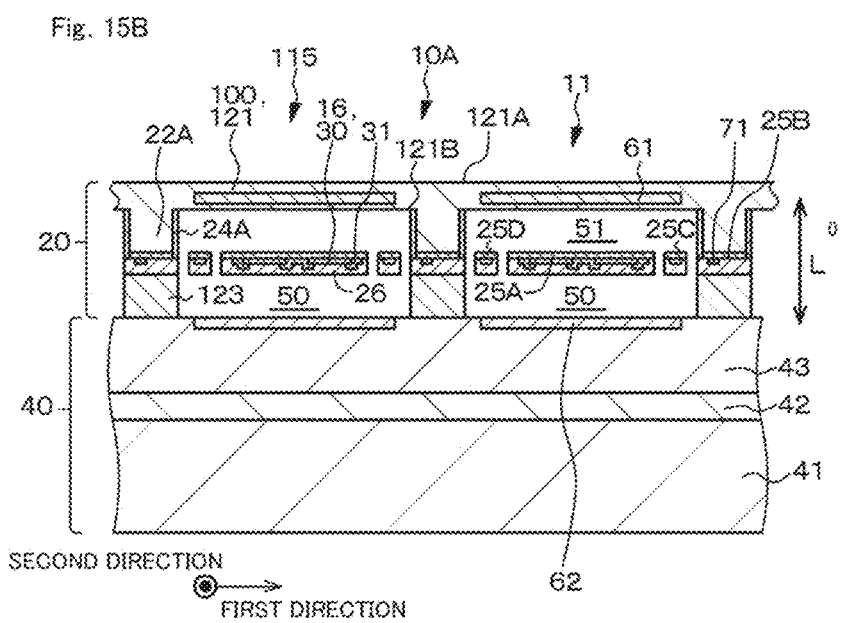

FIG. 17
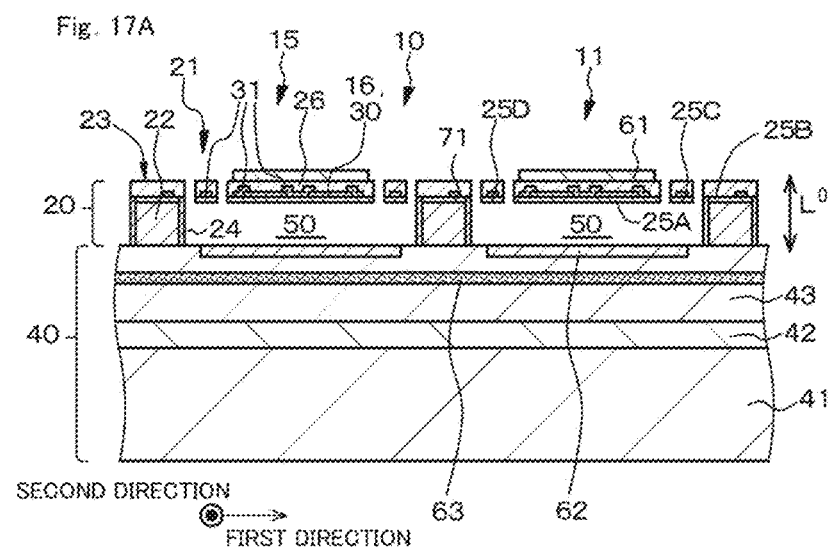
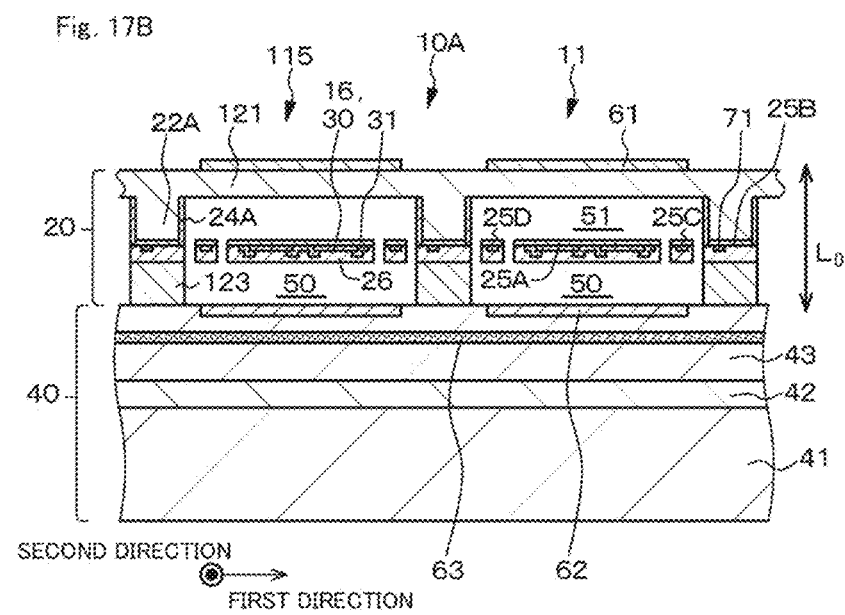

FIG. 18
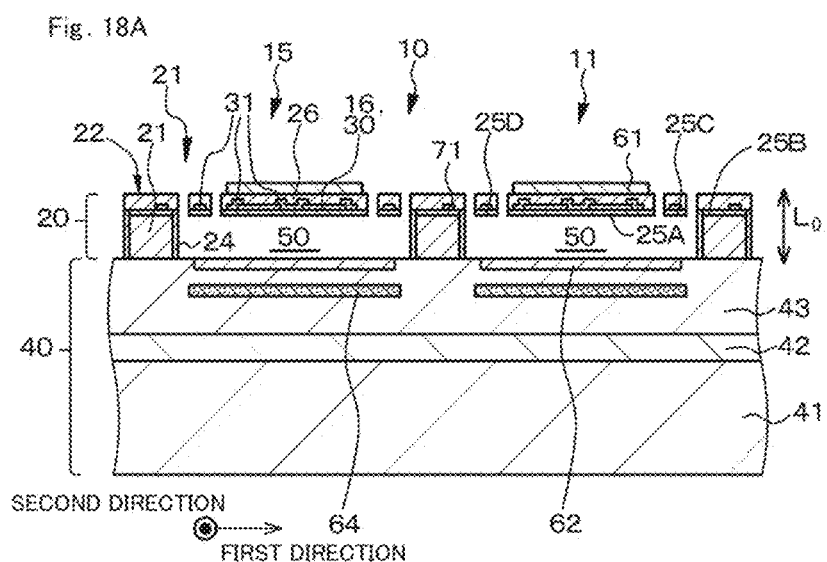
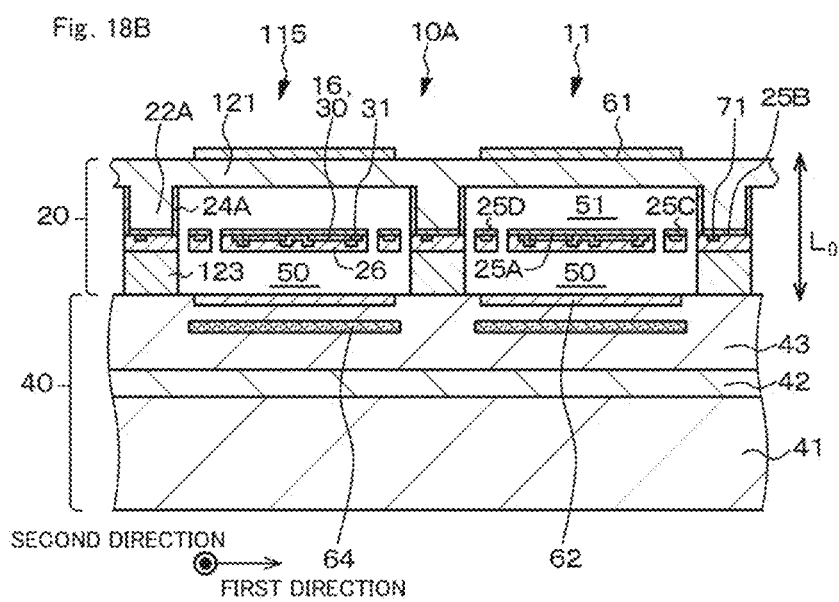

FIG. 21
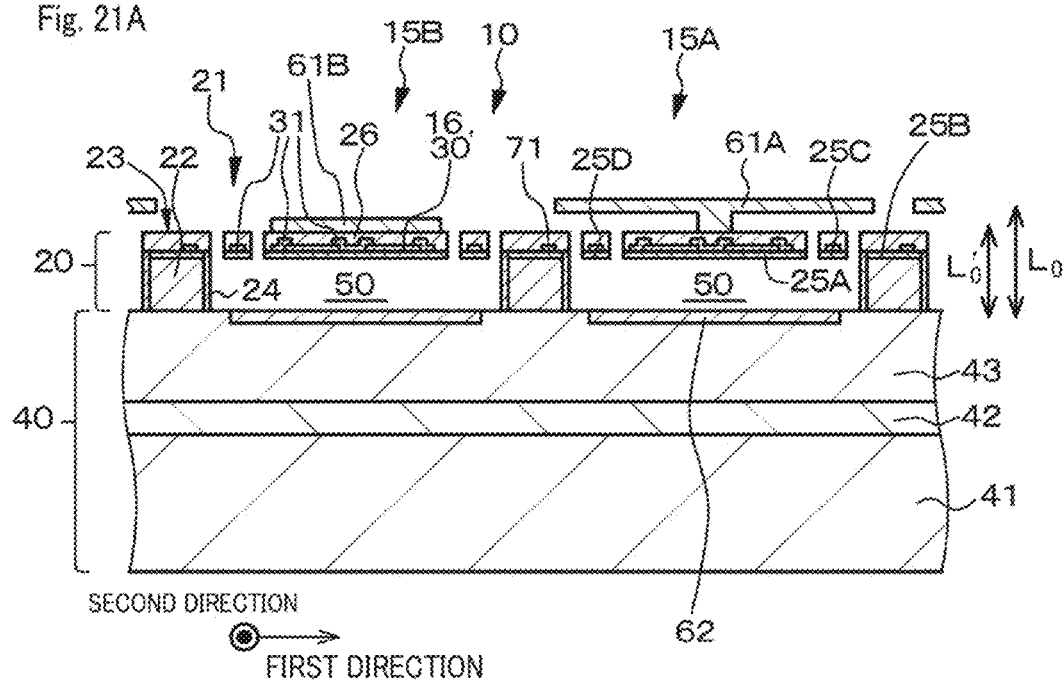
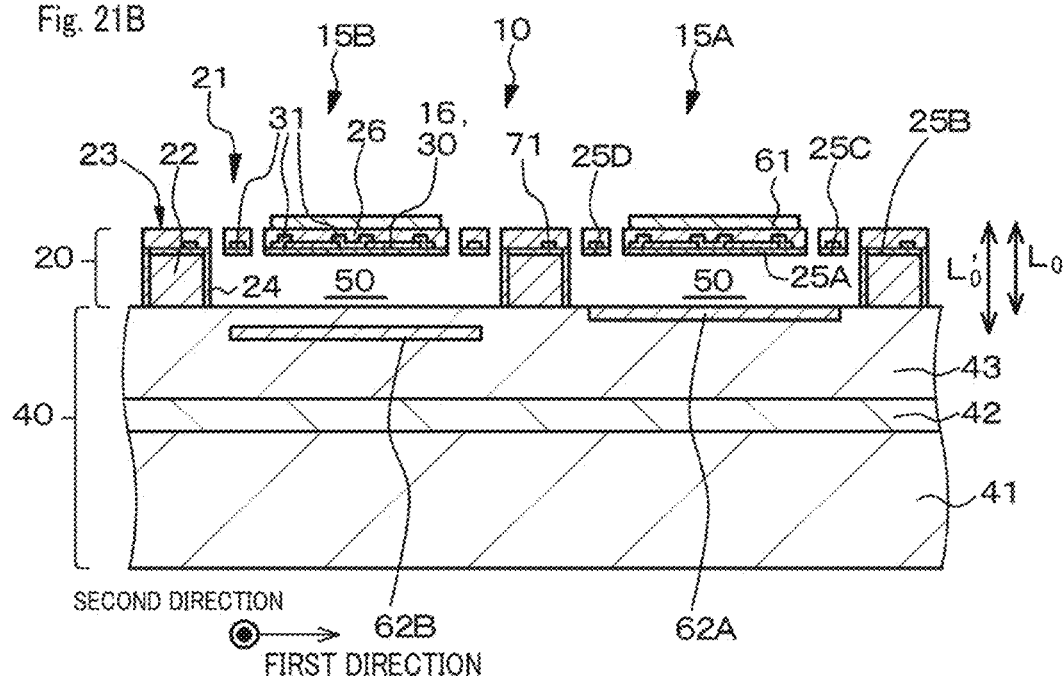

FIG. 22
Fig. 22A
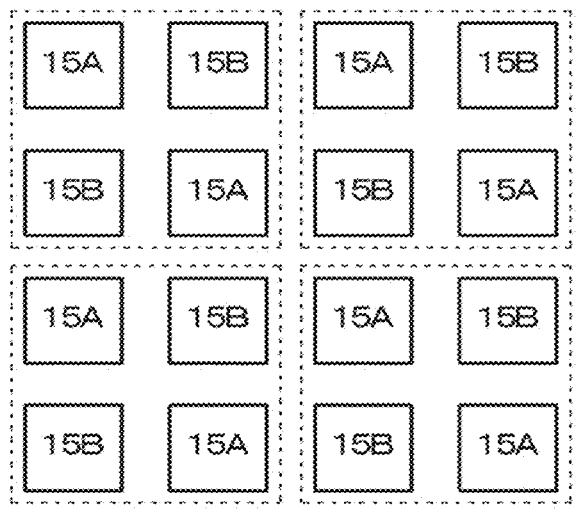
Fig. 22B
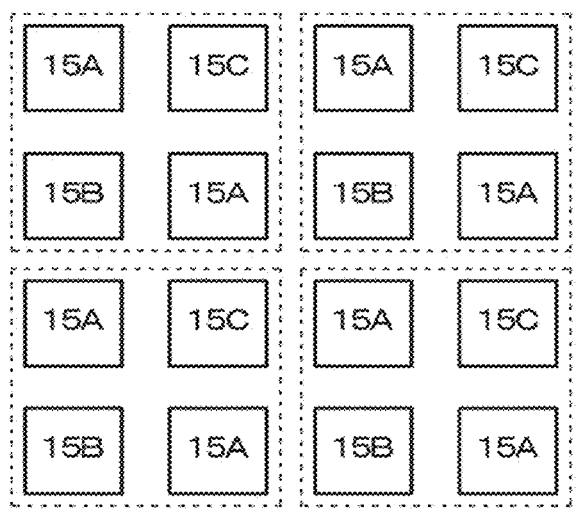

FIG. 35
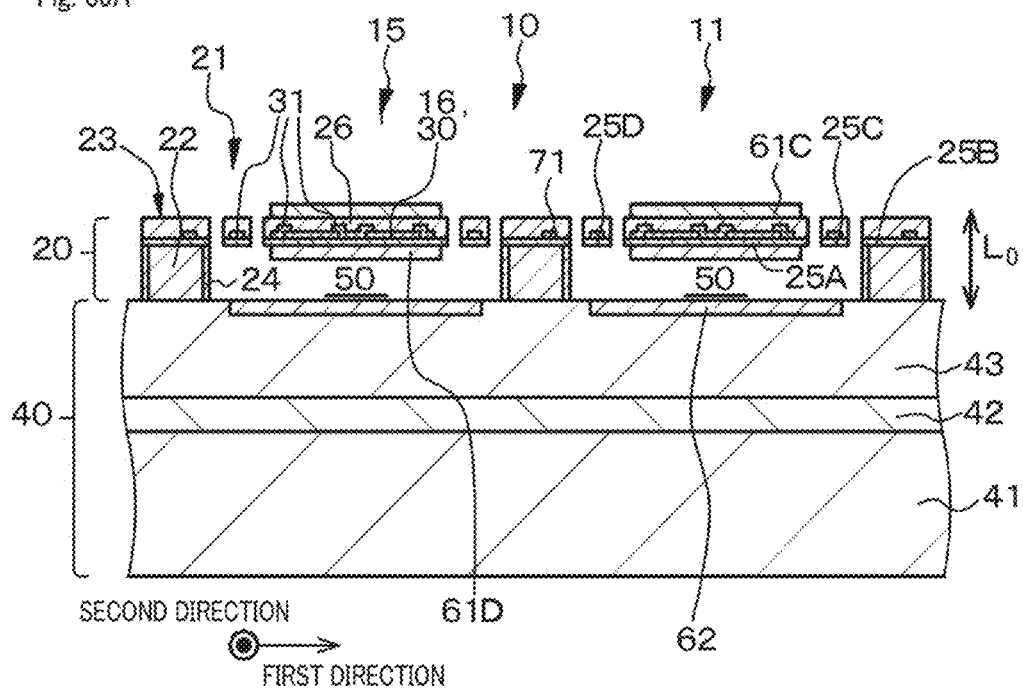
Fig. 35A
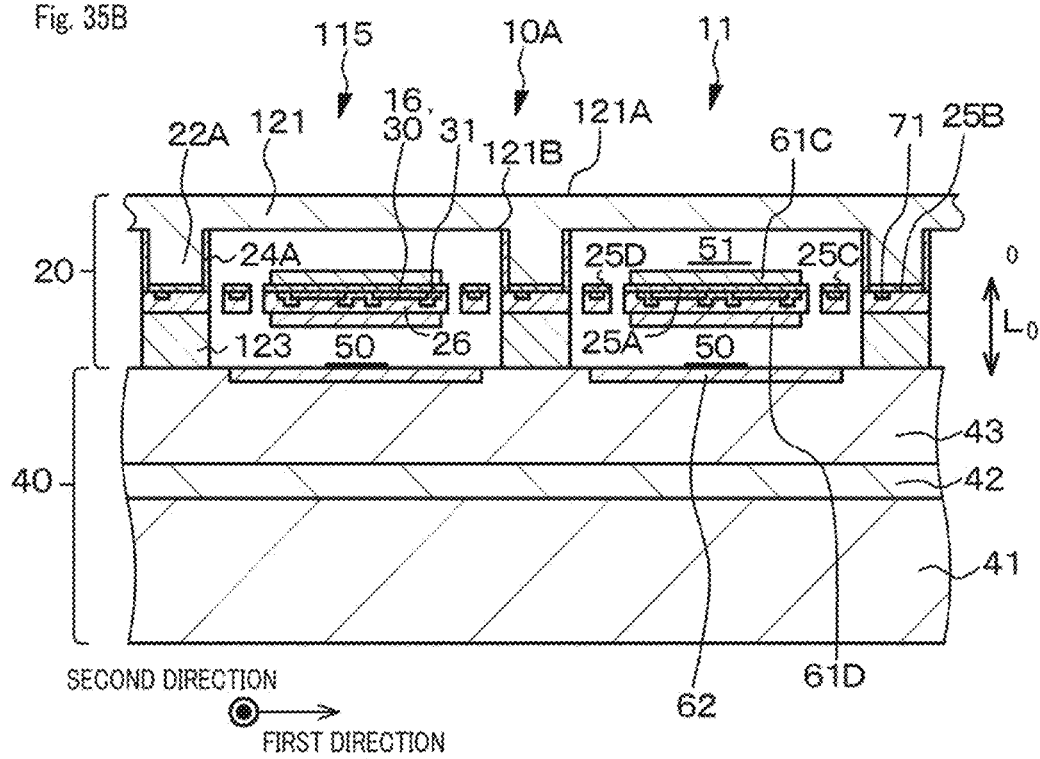
Fig. 35B

FIG. 36
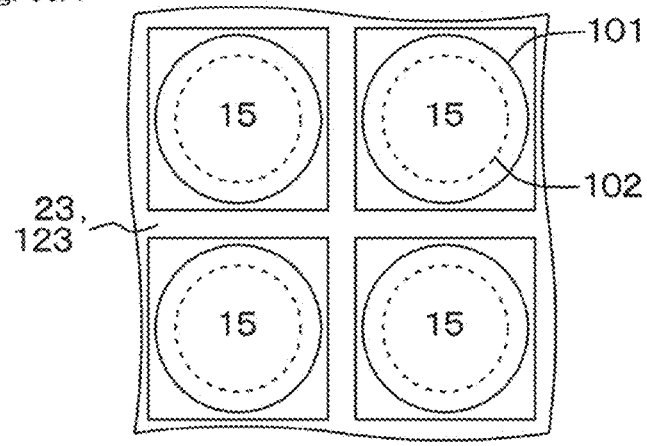
Fig. 36A
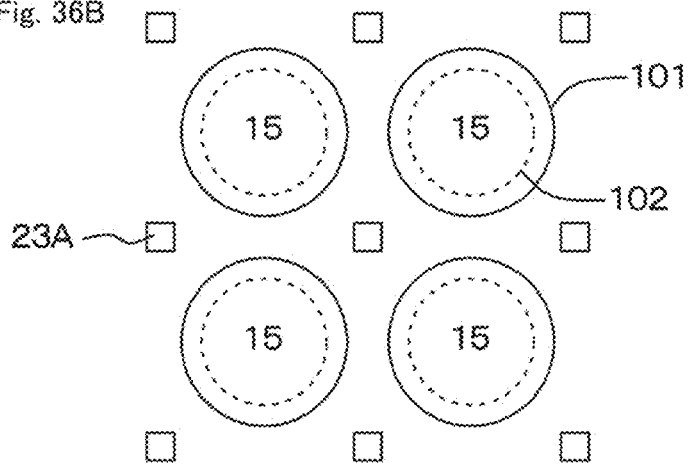
Fig. 36B

FIG. 40

DISPLAY EXAMPLE IN WHICH FOCUS IS CLOSER THAN SUBJECT

DISPLAY EXAMPLE IN WHICH FOCUS IS FARTHER THAN SUBJECT

DISPLAY EXAMPLE IN WHICH SUBJECT IS IN FOCUS

FIG. 43
Fig. 43A
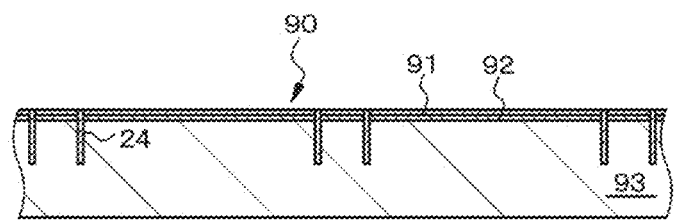
Fig. 43B
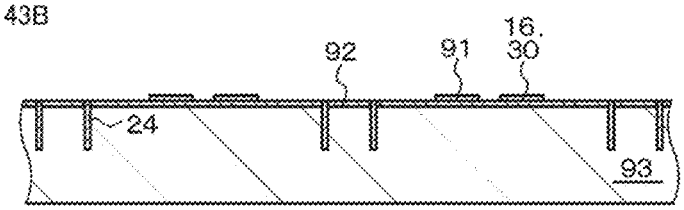
Fig. 43C
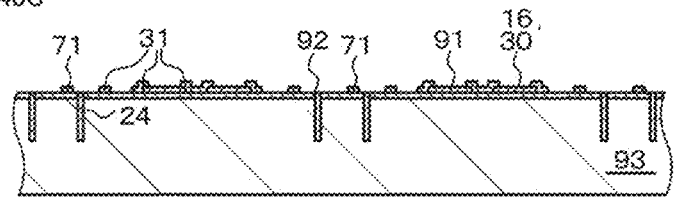
Fig. 43D
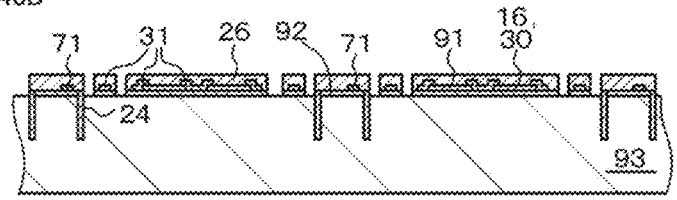

FIG. 44
Fig. 44A
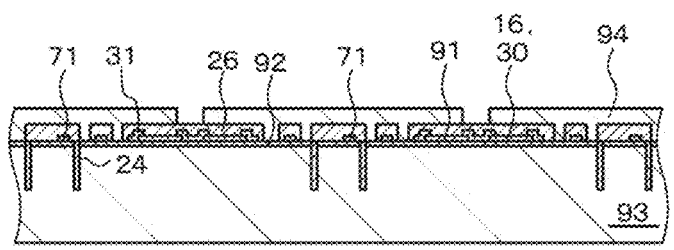
Fig. 44B
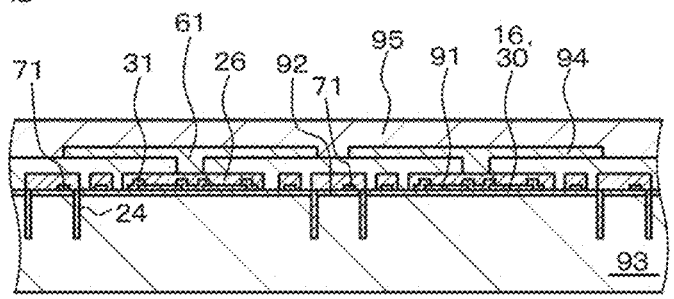
Fig. 44C
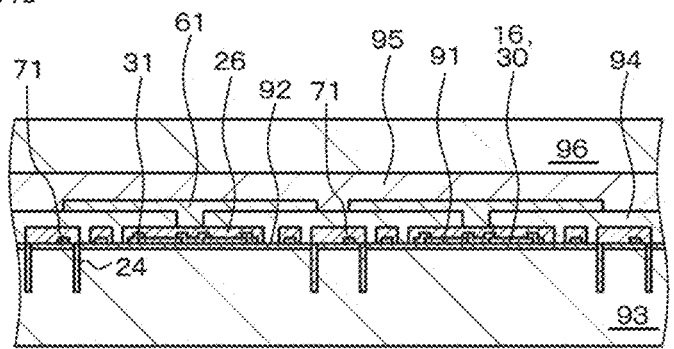

FIG. 45
Fig. 45A
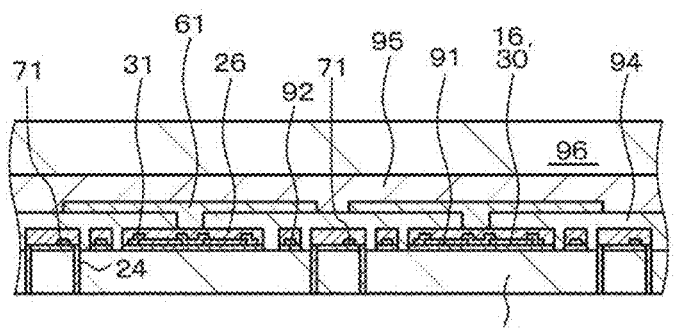
Fig. 45B
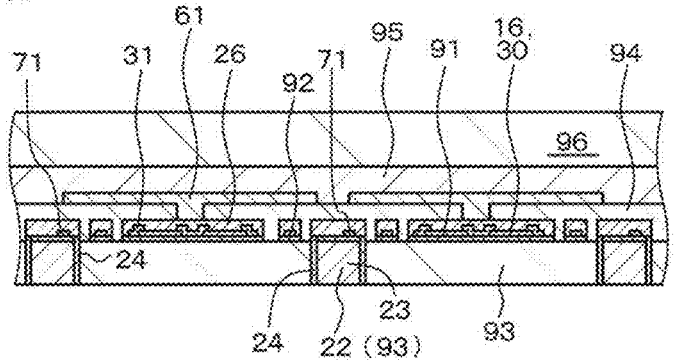

FIG. 46
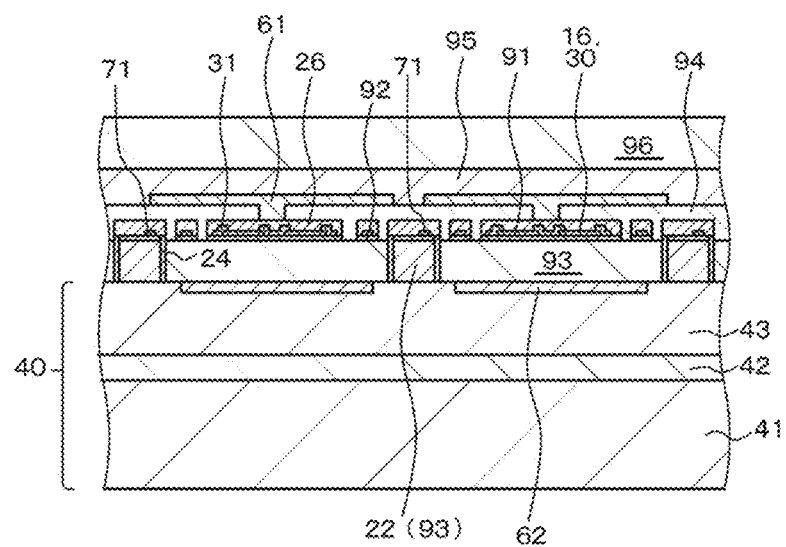
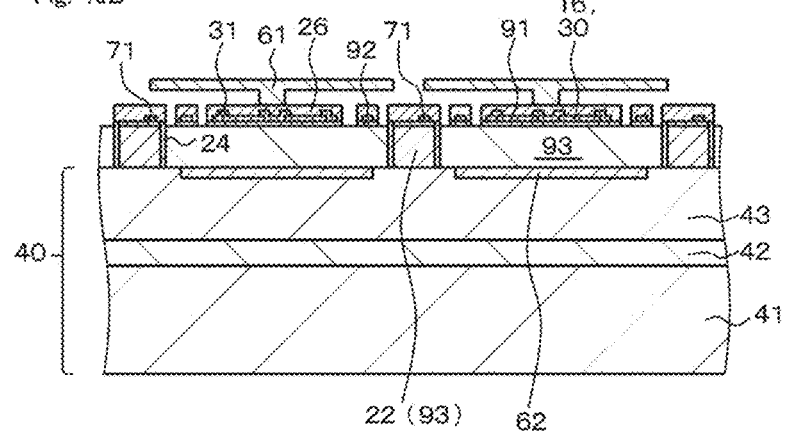

FIG. 47
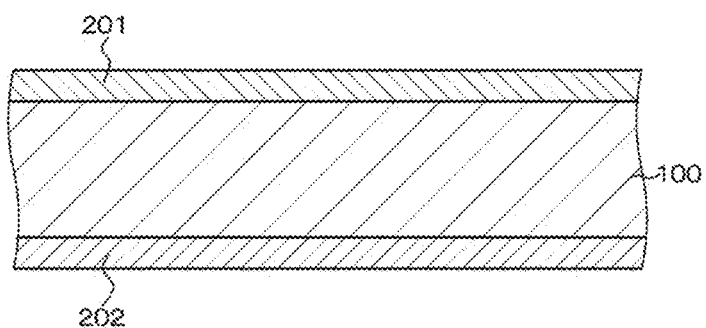
Fig. 47A
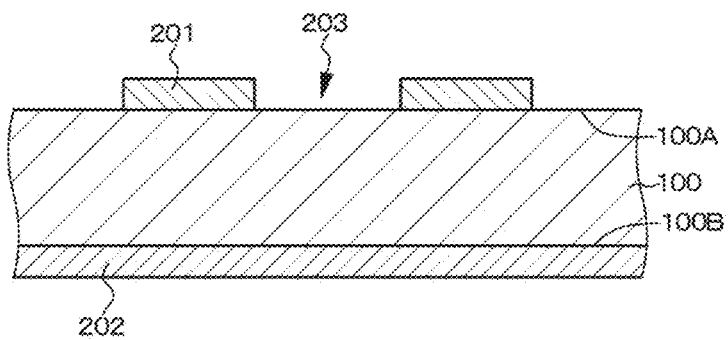
Fig. 47B

FIG. 48
Fig. 48A
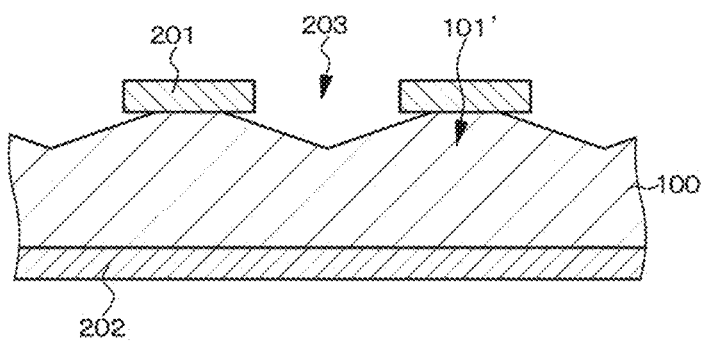
Fig. 48B
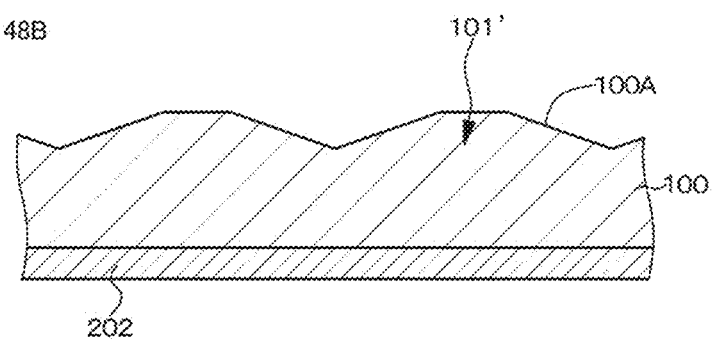
Fig. 48C
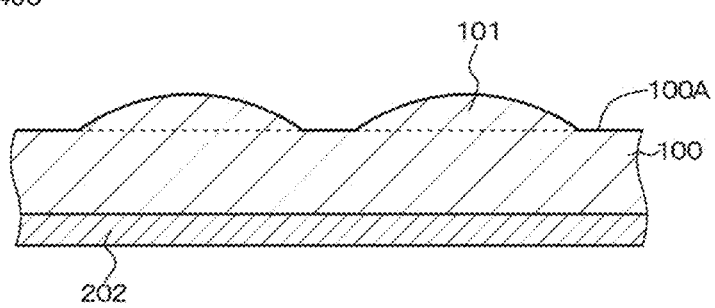

FIG. 49
Fig. 49A
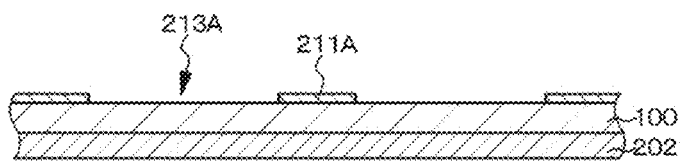
Fig. 49B
Fig. 49C
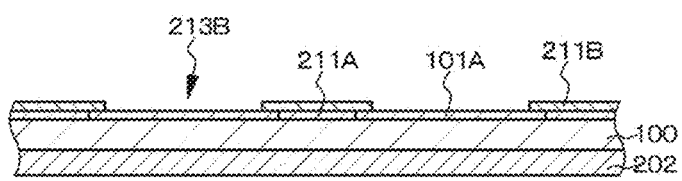
Fig. 49D
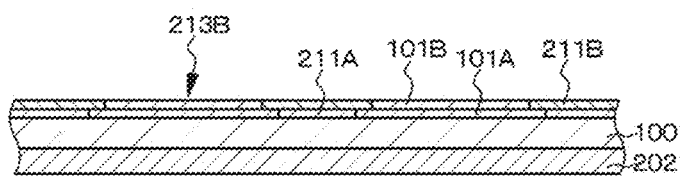

FIG. 50
Fig. 50A
Fig. 50B

FIG. 51
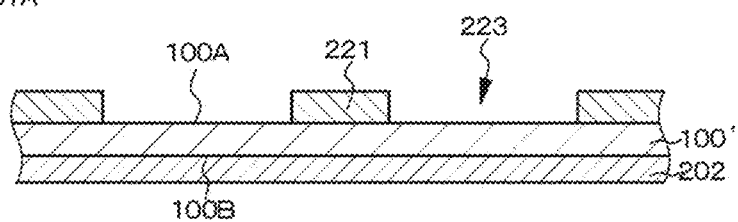
Fig. 51A
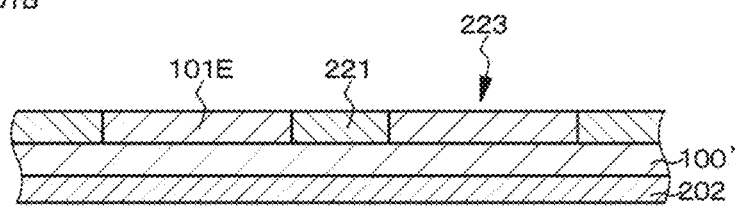
Fig. 51B
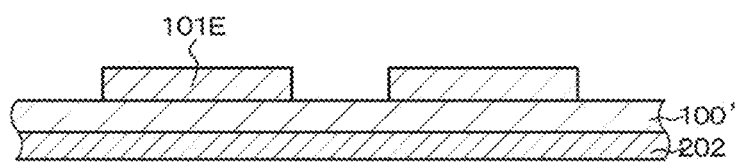
Fig. 51C
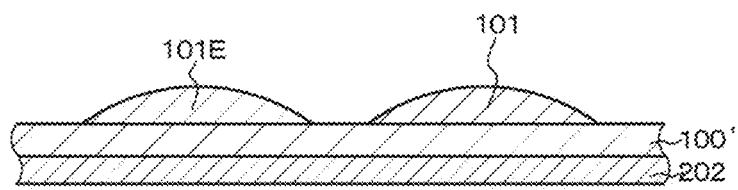
Fig. 51D FIG. 52
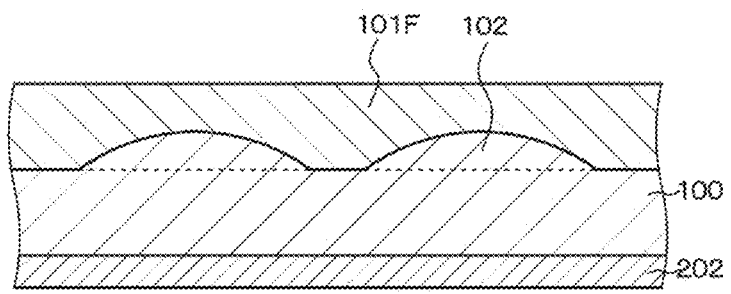
Fig. 52A
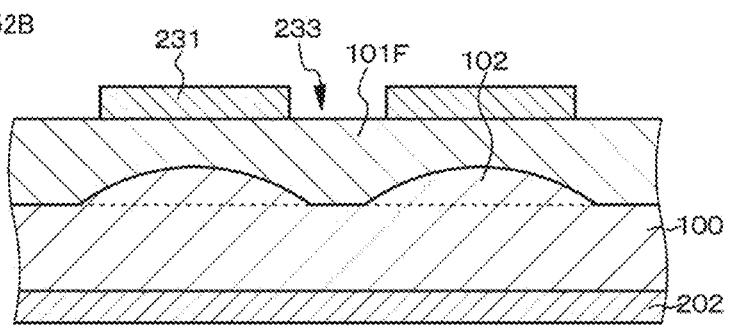
Fig. 52B
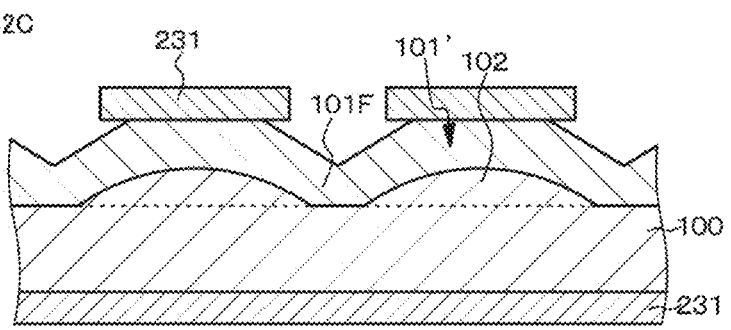
Fig. 52C FIG. 53
Fig. 53A
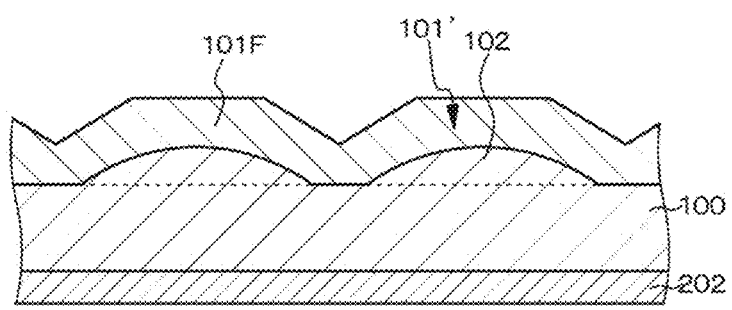
Fig. 53B
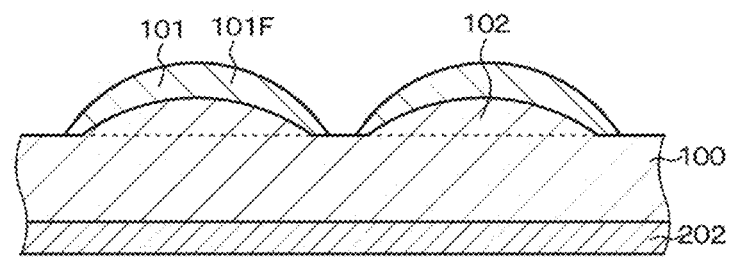

FIG. 54
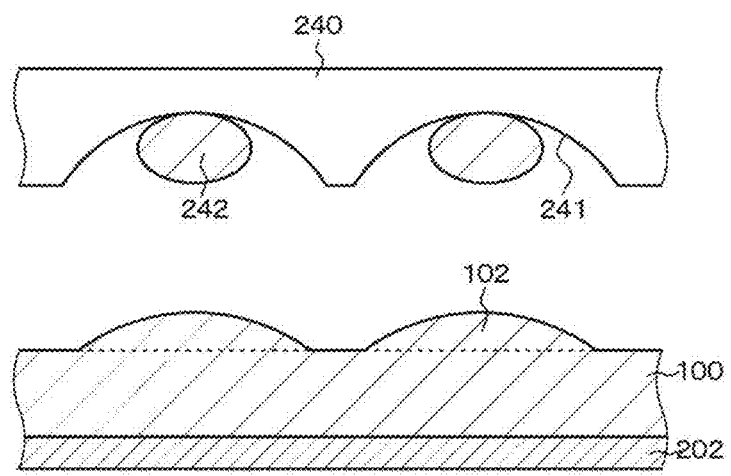
Fig. 54A
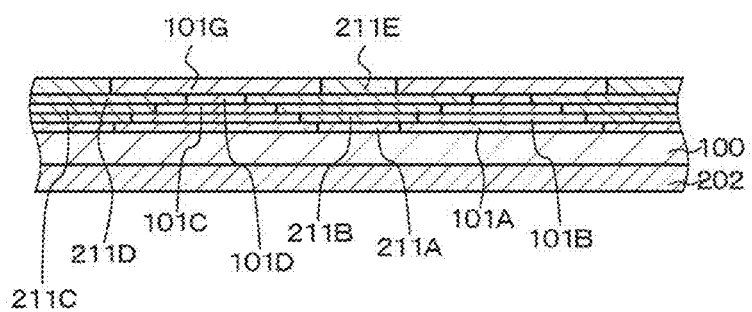
Fig. 54B

FIG. 55
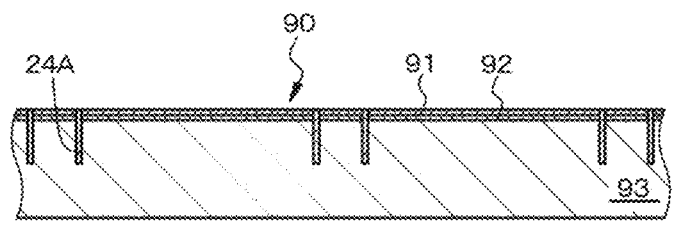
Fig. 55A
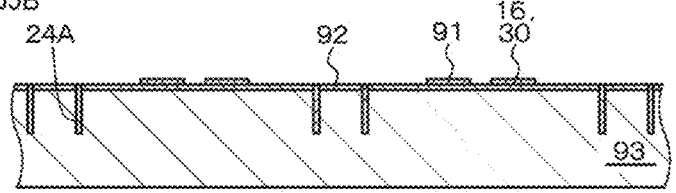
Fig. 55B
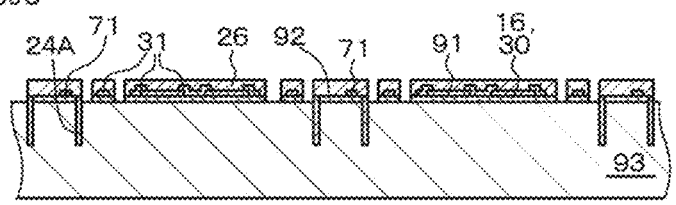
Fig. 55C

FIG. 56
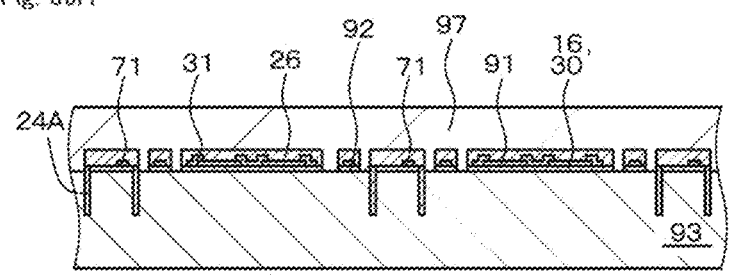
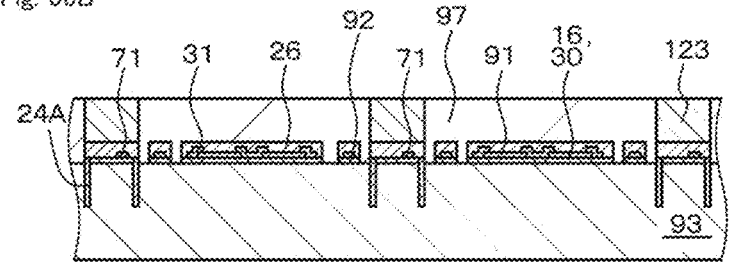
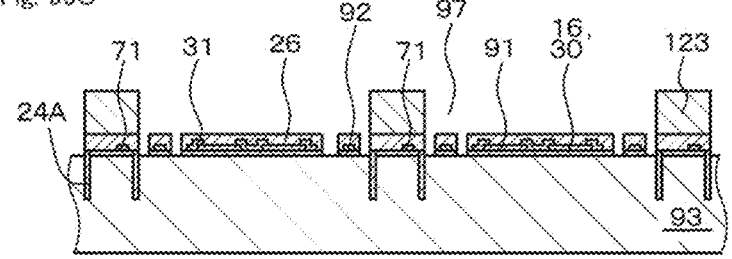
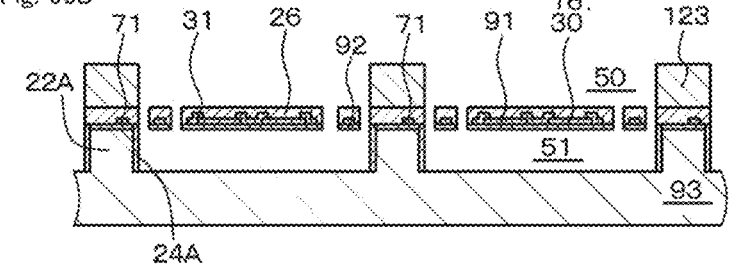

TEMPERATURE DETECTING ELEMENT AND IMAGING APPARATUS

CROSS REFERENCE TO RELATED APPLICATIONS

This application is a U.S. National Phase of International Patent Application No. PCT/JP2019/032139 filed on Aug. 16, 2019, which claims priority benefit of Japanese Patent Application No. JP 2018-187273 filed in the Japan Patent Office on Oct. 2, 2018. Each of the above-referenced applications is hereby incorporated herein by reference in its entirety.

TECHNICAL FIELD

The present disclosure relates to a temperature detecting element and an imaging apparatus and, more specifically, to a temperature detecting element that detects a temperature based on infrared light and an imaging apparatus incorporating the temperature detecting element.

BACKGROUND ART

As an infrared sensor (a temperature detecting element) that detects a temperature based on infrared light, for example, a well-known infrared sensor that is disclosed in JP 2003-156390 A includes:
a substrate;
a plurality of cells which are planarly arranged on the substrate and which respectively include a heat-sensitive element portion configured to convert a temperature change into an electric signal and a heat-insulating support leg configured to support the heat-sensitive element portion on the substrate;
an output portion configured to output the electric signal of the heat-sensitive element portion; and
a sealing member configured to individually vacuum-seal the plurality of cells. In the infrared sensor disclosed in the Japanese Patent Application Publication, furthermore, the sealing member includes a lid portion which transmits infrared light, and a lens is provided on the lid portion.

CITATION LIST

Patent Literature

PTL 1

JP 2003-156390 A

SUMMARY

Technical Problem

Since a lens of each infrared sensor disclosed in the Japanese Patent Application Publication is constituted by a plano-convex lens, there is a problem in that light-collecting power is insufficient and that producing large light-collecting power requires reducing a radius of curvature of the plano-convex lens, which makes machining of the lens difficult.

In consideration thereof, an object of the present disclosure is to provide a temperature detecting element having a configuration and a structure that enable large light-collecting power to be produced and an imaging apparatus including the temperature detecting element.

Solution to Problem

A temperature detecting element according to the present disclosure for achieving the object described above is a temperature detecting element including:
a light-collecting portion constituted by a first light-collecting portion to which infrared light is incident and a second light-collecting portion to which infrared light having been exited from the first light-collecting portion is incident; and
a sensor portion to which infrared light having been exited from the second light-collecting portion is incident, wherein
at least one of the first light-collecting portion and the second light-collecting portion is provided on a base configured to cover the temperature detecting element.

An imaging apparatus according to the present disclosure for achieving the object described above includes
a temperature detecting element array region which is constituted by a plurality of temperature detecting elements and which is covered by a base through which infrared light passes, wherein
each temperature detecting element includes:
a light-collecting portion constituted by a first light-collecting portion to which infrared light is incident and a second light-collecting portion to which infrared light having been exited from the first light-collecting portion is incident; and
a sensor portion to which infrared light having been exited from the second light-collecting portion is incident, and
at least one of the first light-collecting portion and the second light-collecting portion is provided on the base.

BRIEF DESCRIPTION OF DRAWINGS

FIGS. 3A and 3B are, respectively, schematic partial end views of modifications (a second modification and a third modification) of the imaging apparatus according to the first embodiment.

FIGS. 7A, 7B, and 7C are schematic partial end views of a temperature detecting element according to a second embodiment.

FIGS. 8A, 8B, and 8C are diagrams schematically showing an arrangement of a first light-collecting portion and a second light-collecting portion in the temperature detecting element according to the second embodiment.

FIGS. 10A, 10B, and 10C are schematic partial end views of a modification of the temperature detecting element according to the second embodiment.

FIGS. 11A and 11B are diagrams schematically showing an arrangement of a first light-collecting portion and a second light-collecting portion in a temperature detecting element according to a third embodiment and a modification thereof.

FIGS. 15A and 15B are, respectively, schematic partial end views of modifications (a second modification and a third modification) of the imaging apparatus according to the fourth embodiment.

FIGS. 17A and 17B are schematic partial end views of an imaging apparatus according to a fifth embodiment and a modification thereof.

FIGS. 18A and 18B are schematic partial end views of an imaging apparatus according to a sixth embodiment and a modification thereof.

FIGS. 21A and 21B are schematic partial end views of an imaging apparatus according to a seventh embodiment and a modification thereof.

FIGS. 22A and 22B are, respectively, diagrams schematically showing an arranged state of a temperature detecting element in the imaging apparatus according to the seventh embodiment.

FIGS. 35A and 35B are, respectively, schematic partial end views of an imaging apparatus according to a modification of the first embodiment and yet another modification of the fourth embodiment.

FIGS. 36A and 36B are diagrams schematically showing an arrangement of a temperature detecting element, a columnar member, a first light-collecting portion, and a second light-collecting portion in a temperature detecting element according to the first embodiment and a modification thereof.

FIGS. 43A, 43B, 43C, and 43D are schematic partial end views of an SOI substrate or the like for explaining a manufacturing method of the imaging apparatus according to the first embodiment.

FIGS. 44A, 44B, and 44C are schematic partial end views of an SOI substrate or the like which are continuations from FIG. 43D for explaining the manufacturing method of the imaging apparatus according to the first embodiment.

FIGS. 45A and 45B are schematic partial end views of an SOI substrate or the like which are continuations from FIG. 44C for explaining the manufacturing method of the imaging apparatus according to the first embodiment.

FIGS. 46A and 46B are schematic partial end views of an SOI substrate or the like which are continuations from FIG. 45B for explaining the manufacturing method of the imaging apparatus according to the first embodiment.

FIGS. 47A and 47B are schematic partial end views of a base or the like for explaining a method of forming a first light-collecting portion according to the first embodiment.

FIGS. 48A, 48B, and 48C are schematic partial end views of a base or the like which are continuations from FIG. 47B for explaining the method of forming a first light-collecting portion according to the first embodiment.

FIGS. 49A, 49B, 49C, and 49D are schematic partial end views of a base or the like for explaining another method of forming the first light-collecting portion according to the first embodiment.

FIGS. 50A and 50B are schematic partial end views of a base or the like which are continuations from FIG. 49D for explaining the other method of forming the first light-collecting portion according to the first embodiment.

FIGS. 51A, 51B, 51C, and 51D are schematic partial end views of a base or the like for explaining yet another method of forming the first light-collecting portion according to the first embodiment.

FIGS. 52A, 52B, and 52C are schematic partial end views of a base or the like for explaining a method of forming the first light-collecting portion and a second light-collecting portion according to the first embodiment.

FIGS. 53A and 53B are schematic partial end views of a base or the like which are continuations from FIG. 52C for explaining the method of forming the first light-collecting portion and the second light-collecting portion according to the first embodiment.

FIGS. 54A and 54B are schematic partial end views of a base or the like for explaining another method of forming the first light-collecting portion and the second light-collecting portion according to the first embodiment.

FIGS. 55A, 55B, and 55C are schematic partial end views of an SOI substrate or the like for explaining a manufacturing method of the imaging apparatus according to the fourth embodiment.

FIGS. 56A, 56B, 56C, and 56D are schematic partial end views of an SOI substrate or the like which are continuations from FIG. 55C for explaining the manufacturing method of the imaging apparatus according to the fourth embodiment.

DESCRIPTION OF EMBODIMENTS

Figure 1:
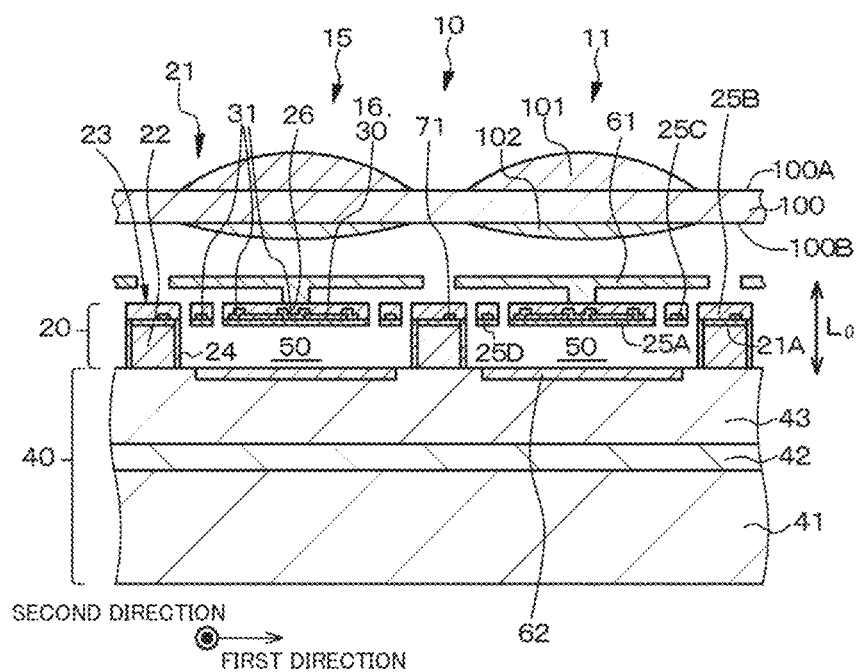
FIG. 1 is a schematic partial end view of an imaging apparatus according to a first embodiment.

Hereinafter, while the present disclosure will be described based on embodiments with reference to the drawings, it is to be understood that the present disclosure is not limited to the embodiments and that the various numerical values and materials described in the embodiments are merely exemplary. The descriptions will be given in the following order.
1. General description of temperature detecting element and imaging apparatus according to present disclosure
2. First embodiment (temperature detecting element and imaging apparatus according to present disclosure or, more specifically, imaging apparatus with face-to-back structure and modification thereof)
3. Second embodiment (modification of first embodiment)
4. Third embodiment (modifications of first and second embodiments)
5. Fourth example (modification of first embodiment or, more specifically, imaging apparatus with face-to-face structure)
6. Fifth embodiment (modifications of first to fourth embodiments)
7. Sixth embodiment (modifications of first to fifth embodiments)
8. Seventh embodiment (imaging apparatuses according to second and third aspects of present disclosure)
9. Eighth embodiment (imaging apparatus according to fourth aspect of present disclosure)
10. Ninth embodiment (imaging apparatus according to fifth aspect of present disclosure)
11. Tenth embodiment (imaging apparatus according to sixth aspect of present disclosure)
12. Eleventh embodiment (noise reduction method in imaging apparatus)
13. Twelfth embodiment (application of imaging apparatus according to present disclosure)
14. Thirteenth embodiment (application of imaging apparatus according to third embodiment)
15. Other <General Description of Temperature Detecting Element and Imaging Apparatus According to Present Disclosure>

In the temperature detecting element according to the present disclosure, a mode can be adopted in which a first light-collecting portion is provided on a first surface of a base that is an infrared incident surface and a second light-collecting portion is provided on a second surface that opposes the first surface of the base or a mode can be adopted in which the first light-collecting portion and the second light-collecting portion are provided on the first surface of the base that is an infrared incident surface.

In the infrared sensor disclosed in the Japanese Patent Application Publication described earlier, an axis that passes through a center of a lens coincides with an axis that passes through a center of a heat-sensitive element portion. Therefore, when infrared light is diagonally incident to a cell depending on a cell arrangement position among a plurality of cells, there is a problem in that, as a result of a decrease in an amount of infrared light incident to a heat-sensitive element portion, sensitivity of the cell may decline or become uneven.

However, in the temperature detecting element according to the present disclosure including the preferable modes described above, a mode can be adopted in which an orthogonally projected image of a center of the first light-collecting portion to a sensor portion, an orthogonally projected image of a center of the second light-collecting portion to the sensor portion, and a center of the sensor portion are at different positions and, in this case, a mode can be adopted in which the orthogonally projected image of the center of the first light-collecting portion, the orthogonally projected image of the center of the second light-collecting portion, and the center of the sensor portion are positioned on a single straight line. Therefore, since adopting such a mode enables infrared light to be reliably incident to the sensor portion regardless of an arranged position of the temperature detecting element in the temperature detecting element array region, an occurrence of a problem in that sensitivity of the temperature detecting element declines or becomes uneven can be prevented. A similar description will apply to preferable modes in the imaging apparatus according to the present disclosure to be described later.

Furthermore, in the temperature detecting element according to the present disclosure including the various preferable modes described above, a mode can be adopted in which the sensor portion is configured to detect a temperature based on infrared light.

In the imaging apparatus according to the present disclosure, a mode can be adopted in which, in each temperature detecting element, when $DT_1$ denotes a distance between an orthogonally projected image of the center of the first light-collecting portion to the sensor portion and the center of the sensor portion and $DT_2$ denotes a distance between an orthogonally projected image of the center of the second light-collecting portion to the sensor portion and the center of the sensor portion, values of $DT_1$ and $DT_2$ differ depending on a position occupied by the temperature detecting element in the temperature detecting element array region. In other words, a mode can be adopted in which the greater the separation of a temperature detecting element from a center of the temperature detecting element array region, the longer a distance between a first axis $AX_1$ that passes through the center of the first light-collecting portion and a third axis $AX_3$ that passes through the center of the sensor portion and the longer a distance between a second axis $AX_2$ that passes through the center of the second light-collecting portion and the third axis $AX_3$ that passes through the center of the sensor portion. In addition, in these cases, a mode can be adopted in which the orthogonally projected image of the center of the first light-collecting portion, the orthogonally projected image of the center of the second light-collecting portion, and the center of the sensor portion are positioned on a single straight line. Furthermore, in these cases, a mode can be adopted in which the more distant the position of the temperature detecting element is from a center portion of the temperature detecting element array region, the larger the values of $DT_1$ and $DT_2$.

In the imaging apparatus according to the present disclosure including the various preferable modes described above, a configuration can be adopted in which a single first light-collecting portion is provided so as to straddle a plurality of temperature detecting elements.

In addition, in this case, a configuration can be adopted in which a single first light-collecting portion is provided so as to straddle two temperature detecting elements, a configuration can be further adopted in which an imaging lens (an imaging optical system) is provided on an infrared light incidence side of the base, one first light-collecting portion is configured to form a real image in a first region (for example, a right-half region) of a pupil of the imaging lens (an exit pupil of the imaging optical system: hereinafter, a similar description will apply) in the second light-collecting portion of one of the two temperature detecting elements and form a real image in a second region (for example, a left-half region) of the pupil of the imaging lens in the second light-collecting portion of the other of the two temperature detecting elements and, in this case, a configuration can be further adopted in which a parallax (or a deviation) exists in images obtained by the two temperature detecting elements. In other words, two monocular parallax images can be obtained. Such a configuration can be applied to all of the temperature detecting elements that constitute the imaging apparatus or can also be applied to a part of the temperature detecting elements that constitute the imaging apparatus.

Alternatively, in this case, a configuration can be adopted in which a single first light-collecting portion is provided so as to straddle four temperature detecting elements, a configuration can be further adopted in which an imaging lens (an imaging optical system) is provided on an infrared light incidence side of the base, one first light-collecting portion is configured to form a real image in a first region (for example, a region of a first quadrant) of a pupil of the imaging lens (an exit pupil of the imaging optical system) in the second light-collecting portion of a first temperature detecting element among the four temperature detecting elements, form a real image in a second region (for example, a region of a second quadrant) of the pupil of the imaging lens in the second light-collecting portion of a second temperature detecting element among the four temperature detecting elements, form a real image in a third region (for example, a region of a third quadrant) of the pupil of the imaging lens in the second light-collecting portion of a third temperature detecting element among the four temperature detecting elements, and form a real image in a fourth region (for example, a region of a fourth quadrant) of the pupil of the imaging lens in the second light-collecting portion of a fourth temperature detecting element among the four temperature detecting elements and, in this case, a configuration can be further adopted in which a parallax (or a deviation) exists in images obtained by the four temperature detecting elements. In other words, four monocular parallax images can be obtained. A parallax exists in images obtained by a temperature detecting element group made up of two juxtaposed temperature detecting elements among the four temperature detecting elements and a temperature detecting element group made up of the two remaining juxtaposed temperature detecting elements excluding two diagonally-arranged temperature detecting elements. Such a configuration can be applied to all of the temperature detecting elements that constitute the imaging apparatus or can also be applied to a part of the temperature detecting elements that constitute the imaging apparatus.

In addition, the imaging apparatus configured as described above can be applied to autofocusing means using a parallax (or a deviation of an image), focus deviation detecting means using a parallax (or a deviation of an image), vehicular collision avoiding means using a parallax (or a deviation of an image), a display apparatus or goggles that enables binocular stereoscopic viewing of a thermal image (an image obtained by an imaging apparatus configured as described above) using a parallax, a head-mounted display (for example, goggles for firefighters), and the like.

Furthermore, in the imaging apparatus according to the present disclosure including the various preferable modes and configurations described above, a mode can be adopted in which a first light-collecting portion is provided on a first surface of a base that is an infrared incident surface and a second light-collecting portion is provided on a second surface that opposes the first surface of the base or a mode can be adopted in which the first light-collecting portion and the second light-collecting portion are provided on the first surface of the base that is an infrared incident surface.

Moreover, in the imaging apparatus according to the present disclosure including the various preferable modes and configurations described above, a mode can be adopted in which the sensor portion is configured to detect a temperature based on infrared light.

The base can be constituted by a first substrate, a protective member (a protective substrate), and a sealing member to be described later. In this case, the first substrate, the protective member, and the sealing member to be described later are constituted by a material that is transparent with respect to infrared light or, in other words, a material that transmits infrared light. Specifically, for example, the first substrate can be constituted by a silicon semiconductor substrate or a SOI substrate. In addition, examples of a material that constitutes the protective member and the sealing member include a silicon semiconductor substrate, a quartz substrate, a plastic substrate, a plastic film, a germanium substrate, and a substrate made of a material that transmits infrared light (specifically, $CaF_2$, $BaF_2$, $Al_2O_3$, ZnSe, or the like), and examples of plastic include polyethylene resin. The base can be constituted by the first substrate, the protective member, and the sealing member.

The first light-collecting portion and the second light-collecting portion are also constituted by a material that is transparent with respect to infrared light or, in other words, a material that transmits infrared light. The first light-collecting portion and the second light-collecting portion may be integrally formed with the base or, in other words, the first light-collecting portion and the second light-collecting portion may be formed of a same material as the base and provided so as to extend from the base, or the first light-collecting portion and the second light-collecting portion may be formed of a different material from the base and provided on a first surface or a second surface of the base. When the first light-collecting portion is provided on the first surface of the base and the second light-collecting portion is provided on the second surface of the base, the first light-collecting portion and the second light-collecting portion have a mode of a plano-convex lens. In this case, examples of a planar shape of the first light-collecting portion and the second light-collecting portion include a circle, an ellipse, a rectangle with four rounded corners, and a polygon. In addition, a value of a radius of curvature in a curved portion of the first light-collecting portion and a value of a radius of curvature in a curved portion of the second light-collecting portion may be a same value or may be different values. When the first light-collecting portion and the second light-collecting portion are provided on the first surface of the base, the first light-collecting portion and the second light-collecting portion constitute a kind of a convex meniscus lens. In this case, examples of a planar shape of the first light-collecting portion and the second light-collecting portion include a circle, an ellipse, a rectangle with four rounded corners, and a polygon. Alternatively, the first light-collecting portion and the second light-collecting portion can have a cylindrical lens shape or a Fresnel lens shape and can be constituted by diffractive gratings. When the first light-collecting portion is to be provided on the first surface of the base and the second light-collecting portion is to be provided on a second surface of the base using a material that differs from the base, the first light-collecting portion can be constituted by, for example, monocrystalline, polycrystalline, or amorphous silicon, germanium, polyethylene resin, or chalcogenide glass, and the second light-collecting portion can be constituted by, for example, monocrystalline, polycrystalline, or amorphous silicon, germanium, polyethylene resin, or chalcogenide glass. It should be noted that the material that constitutes the first light-collecting portion and the material that constitutes the second light-collecting portion may be a same material or may be different materials. In addition, when the first light-collecting portion and the second light-collecting portion are to be provided on the first surface of the base, while the first light-collecting portion and the second light-collecting portion can be constituted by, for example, monocrystalline, polycrystalline, or amorphous silicon, germanium, polyethylene resin, or chalcogenide glass, in this case, the material constituting the first light-collecting portion and the material constituting the second light-collecting portion are different materials. The light-collecting portions can be formed based on an etching method or, alternatively, formed based on a nanoimprint method, a vapor deposition method, or the like. Infrared light incident to the first light-collecting portion passes through the first light-collecting portion and the second light-collecting portion to be collected by a sensor portion or an infrared absorbing layer to be described later. The sensor portion or the infrared absorbing layer to be described later may or may not exist on a focal point of the second light-collecting portion.

In the imaging apparatus according to the present disclosure including the various preferable modes and configurations described above, a mode can be adopted in which
the imaging apparatus is constituted by a first structure and a second structure,
the first structure includes
a first substrate and
a drive line and a signal line connected to a temperature detecting element,
the temperature detecting element is provided on the first substrate,
the second structure includes
a second substrate and
a drive circuit which is provided on the second substrate and which is coated by a coating layer,
the first substrate is joined to the coating layer,
a void is provided between the temperature detecting element and the coating layer, and
the drive line and the signal line are electrically connected to the drive circuit. In addition, by adopting such a mode, since the first substrate is joined to the coating layer formed on the second substrate and the void provided between the temperature detecting element and the coating layer enables the void to be provided with high accuracy in the temperature detecting element, the temperature detecting element with high temperature detection accuracy can be provided. For convenience's sake, the imaging apparatus according to the present disclosure in such a mode will be referred to as an "imaging apparatus according to a first aspect of the present disclosure".

In the imaging apparatus according to the first aspect of the present disclosure, the base may be constituted by the first substrate or a mode may be adopted in which the base differs from the first substrate such as a mode in which the base is made of a sealing member or a protective member (a protective substrate) to be described later.

In the imaging apparatus according to the first aspect of the present disclosure, a mode can be adopted in which the imaging apparatus includes
a plurality of temperature detecting elements arranged in a first direction and a second direction that differs from the first direction,
the imaging apparatus further includes
a plurality of drive lines which are arranged along the first direction and to which a plurality of temperature detecting elements are respectively connected and
a plurality of signal lines which are arranged along the second direction and to which a plurality of temperature detecting elements are respectively connected, the first structure has a temperature detecting element array region including temperature detecting elements and a peripheral region that encloses the temperature detecting element array region, and
the drive lines and the signal lines are electrically connected to the drive circuit in the peripheral region. For convenience's sake, the imaging apparatus according to the present disclosure in such a mode will be referred to as an "imaging apparatus according to a 1-A-th aspect of the present disclosure". Alternatively, the imaging apparatus according to the first aspect of the present disclosure can be structured so as to include Q-number (where $Q \geq 1$) of one-dimensionally arranged temperature detecting elements.

In the imaging apparatus according to the first aspect of the present disclosure including the 1-A-th aspect of the present disclosure (hereinafter, for convenience's sake, referred to as an "imaging apparatus according to the first aspect of the present disclosure and the like"), a configuration can be adopted in which a partition wall or a columnar member (hereinafter, collectively referred to as a "partition wall or the like") is formed in a portion of the first substrate portion that is positioned between a temperature detecting element and another temperature detecting element, and a bottom portion of the partition wall or the like is joined to the coating layer. For convenience's sake, an imaging apparatus configured as described above will be referred to as an "imaging apparatus with a face-to-back structure". When a surface of the first substrate that opposes the second substrate is referred to as a "second surface of the first substrate" and a surface of the first substrate that opposes the second surface of the first substrate is referred to as a "first surface of the first substrate", the temperature detecting element is provided on the first substrate on a side of the first surface. In the imaging apparatus with a face-to-back structure, a mode can be adopted in which the base differs from the first substrate such as a mode in which the base is made of a sealing member or a protective member (a protective substrate) to be described later.

In addition, in the imaging apparatus with a face-to-back structure, a configuration can be adopted in which an exposed surface of the coating layer that is exposed to the void is constituted by at least one type of material layer selected from a group consisting of an insulating material layer, a metal material layer, an alloy material layer, and a carbon material layer, and a side wall among the partition wall or the like is constituted by at least one type of material layer selected from a group consisting of an insulating material layer, a metal material layer, an alloy material layer, and a carbon material layer. An interior of the partition wall or the like that is enclosed by the side wall among the partition wall or the like is constituted by a part of the first substrate. In some cases, the interior of the partition wall or the like may be constituted by a same material as the material that constitutes the side wall among the partition wall or the like or constituted by a material that differs from the materials that constitute the first substrate and the side wall among the partition wall or the like.

Alternatively, in the imaging apparatus with a face-to-back structure, a configuration can be adopted in which an exposed surface of the coating layer that is exposed to the void is constituted by at least one type of material layer selected from a group consisting of an insulating material layer, a metal material layer, an alloy material layer, and a carbon material layer. In addition, in the imaging apparatus with a face-to-back structure that is configured as described above, a configuration can be adopted in which a side wall among the partition wall or the like is constituted by at least one type of material layer selected from a group consisting of an insulating material layer, a metal material layer, an alloy material layer, and a carbon material layer.

Examples of the insulating material layer constituting the exposed surface of the coating layer that is exposed to the void include an insulating material layer made of an oxide (specifically, for example, $SiO_X$ ($1 \leq X \leq 2$), SiOF, or SiOC), an insulating material layer made of a nitride (specifically, for example, SiN), an insulating material layer made of an oxynitride (specifically, for example, SiON), and an adhesive material layer; examples of the metal material layer constituting the exposed surface of the coating layer that is exposed to the void include gold (Au), copper (Cu), aluminum (Al), tungsten (W), and titanium (Ti); examples of the alloy material layer constituting the exposed surface of the coating layer that is exposed to the void include an alloy layer or a solder layer containing these metals; and examples of the carbon material layer constituting the exposed surface of the coating layer that is exposed to the void include a carbon film and a carbon nanotube.

In addition, examples of the insulating material layer, the metal material layer, the alloy material layer, and the carbon material layer that constitute the side wall among the partition wall or the like include the various materials described above.

There are 16 combinations of (the material of the insulating material layer that constitutes the exposed surface of the coating layer that is exposed to the void, the material of the insulating material layer that constitutes the side wall among the partition wall or the like), namely, (insulating material layer, insulating material layer), (insulating material layer, metal material layer), (insulating material layer, alloy material layer), (insulating material layer, carbon material layer), (metal material layer, insulating material layer), (metal material layer, metal material layer), (metal material layer, alloy material layer), (metal material layer, carbon material layer), (alloy material layer, insulating material layer), (alloy material layer, metal material layer), (alloy material layer, alloy material layer), (alloy material layer, carbon material layer), (carbon material layer, insulating material layer), (carbon material layer, metal material layer), (carbon material layer, alloy material layer), and (carbon material layer, carbon material layer).

The insulating material layer that constitutes the exposed surface of the coating layer that is exposed to the void and the insulating material layer that constitutes the side wall among the partition wall or the like may be constituted by a same material or constituted by different materials. The metal material layer that constitutes the exposed surface of the coating layer that is exposed to the void and the metal material layer that constitutes the side wall among the partition wall or the like may be constituted by a same material or constituted by different materials. The alloy material layer that constitutes the exposed surface of the coating layer that is exposed to the void and the alloy material layer that constitutes the side wall among the partition wall or the like may be constituted by a same material or constituted by different materials. The carbon material layer that constitutes the exposed surface of the coating layer that is exposed to the void and the carbon material layer that constitutes the side wall among the partition wall or the like may be constituted by a same material or constituted by different materials. Similar descriptions will apply to the imaging apparatus with a face-to-face structure to be described later. However, the term "side wall among the partition wall or the like" is to be replaced with the term "partition wall or the like".

In the imaging apparatus with a face-to-back structure including the various preferable configurations described above, a configuration can be adopted in which an infrared absorbing layer is formed on a side to which infrared light is incident (a side of a first surface of the base), and an infrared reflecting layer is formed in a region of the coating layer that is positioned in a bottom portion of the void. The infrared reflecting layer may be formed in a portion of the coating layer that is positioned in the bottom portion of the void, formed in a part of the portion of the coating layer that is positioned in the bottom portion of the void, or formed so as to protrude outside the portion of the coating layer that is positioned in the bottom portion of the void. In addition, in this case, the infrared absorbing layer may be formed on an insulating film that is formed on the sensor portion or the infrared absorbing layer may be formed in a state where a gap (a space) exists between the infrared absorbing layer and the sensor portion. Furthermore, in this case, a configuration can be adopted in which the infrared reflecting layer is formed on a top surface of the coating layer (including on the top surface of the coating layer or a part of the top surface of the coating layer) or formed inside the coating layer. Moreover, in this case, a configuration can be adopted in which when a wavelength of infrared light to be absorbed by the infrared absorbing layer is denoted by $\lambda_{IR}$, an optical distance $L_0$ between the infrared absorbing layer and the infrared reflecting layer (a distance that takes thicknesses and refractive indices of the materials into consideration) satisfies $$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4.$$

An example of $\lambda_{IR}$ is 8 μm to 14 μm.

Alternatively, in the imaging apparatus with a face-to-back structure including the various preferable configurations described above, a configuration can be adopted in which a first infrared absorbing layer is formed on a side to which infrared light is incident (a side of a first surface of the base), an infrared reflecting layer is formed in a region of the coating layer that is positioned in a bottom portion of the void, and a second infrared absorbing layer is formed on a side that opposes the void (a side of a second surface of the base). The infrared reflecting layer may be formed in a portion of the coating layer that is positioned in the bottom portion of the void, formed in a part of the portion of the coating layer that is positioned in the bottom portion of the void, or formed so as to protrude outside the portion of the coating layer that is positioned in the bottom portion of the void. In addition, in this case, the first infrared absorbing layer may be formed on the first surface of the base or on an insulating film that is formed on the first surface of the base or the first infrared absorbing layer may be formed in a state where a gap (a space) exists between the first infrared absorbing layer and the first surface of the base. For example, the second infrared absorbing layer may be formed on the second surface of the base which opposes the void or on an insulating film that is formed on the second surface of the base or the second infrared absorbing layer may be formed in a state where a gap (a space) exists between the second infrared absorbing layer and the second surface of the base. Furthermore, in this case, a configuration can be adopted in which the infrared reflecting layer is formed on a top surface of the coating layer (including on the top surface of the coating layer or a part of the top surface of the coating layer) or formed inside the coating layer. Since each infrared absorbing layer not only absorbs infrared light but also partially transmits and partially reflects infrared light, adopting a structure that reduces transmission and reflection enables sensitivity to be further improved. In other words, since such a configuration causes a part of infrared light having been transmitted through the first infrared absorbing layer to be further absorbed by the second infrared absorbing layer, transmission can be reduced. In addition, due to infrared light reflected by the first infrared absorbing layer and infrared light reflected by the second infrared absorbing layer canceling out each other in opposite phases, reflection can be reduced. Furthermore, due to infrared light reflected by the second infrared absorbing layer and infrared light reflected by the infrared reflecting layer canceling out each other in opposite phases, reflection can be reduced. Moreover, in this case, a configuration can be adopted in which when a wavelength of infrared light to be absorbed by the first infrared absorbing layer and the second infrared absorbing layer is denoted by $\lambda_{IR}$, an optical distance between the first infrared absorbing layer and the second infrared absorbing layer is denoted by $L_1$, and an optical distance between the second infrared absorbing layer and the infrared reflecting layer is denoted by $L_2$, $L_1$ and $L_2$ satisfy $$0.75 \times \lambda_{IR}/4 \leq L_1 \leq 1.25 \times \lambda_{IR}/4 \text{ and}$$

$$0.75 \times \lambda_{IR}/4 \leq L_2 \leq 1.25 \times \lambda_{IR}/4.$$

An example of $\lambda_{IR}$ is 8 μm to 14 μm.

Values of the optical distances $L_0$, $L_1$, and $L_2$ between the infrared absorbing layers and the infrared reflecting layer may be varied depending on a position of the temperature detecting element in the temperature detecting element array region. In other words, the values of the optical distances $L_0$, $L_1$, and $L_2$ may be set such that the more distant the position of the temperature detecting element is from a center portion of the temperature detecting element array region, the smaller the values. It should be noted that the temperature detecting element array region may be divided into a plurality of regions and values of the optical distances $L_0$, $L_1$, and $L_2$ may be set for each region. Similar settings can be applied in the following description.

Alternatively, in the imaging apparatus according to the first aspect of the present disclosure including the preferable modes described above and the like, a configuration can be adopted in which a partition wall or the like is formed independent of the first substrate between a portion of the first substrate that is positioned between a temperature detecting element and another temperature detecting element and the coating layer, and a bottom portion of the partition wall or the like is joined to the coating layer. For convenience's sake, an imaging apparatus configured as described above will be referred to as an "imaging apparatus with a face-to-face structure". The partition wall or the like is constituted by a material that differs from the first substrate. The sensor portion is provided on a side of the second surface of the first substrate. In the imaging apparatus with a face-to-face structure, the base may be constituted by the first substrate or a mode may be adopted in which the base differs from the first substrate such as a mode in which the base is made of a sealing member or a protective member (a protective substrate) to be described later.

In addition, in the imaging apparatus with a face-to-face structure, a configuration can be adopted in which an exposed surface of the coating layer that is exposed to the void is constituted by at least one type of material layer selected from a group consisting of an insulating material layer, a metal material layer, an alloy material layer, and a carbon material layer, and the partition wall or the like is constituted by at least one type of material layer selected from a group consisting of an insulating material layer, a metal material layer, an alloy material layer, and a carbon material layer.

Alternatively, in the imaging apparatus with a face-to-face structure, a configuration can be adopted in which an exposed surface of the coating layer that is exposed to the void is constituted by at least one type of material layer selected from a group consisting of an insulating material layer, a metal material layer, an alloy material layer, and a carbon material layer. In addition, in the imaging apparatus with a face-to-face structure that is configured as described above, a configuration can be adopted in which the partition wall or the like is constituted by at least one type of material layer selected from a group consisting of an insulating material layer, a metal material layer, an alloy material layer, and a carbon material layer.

It should be noted that specific examples and combinations of the insulating material layer, the metal material layer, the alloy material layer, or the carbon material layer that constitutes the exposed surface of the coating layer that is exposed to the void or the insulating material layer, the metal material layer, the alloy material layer, or the carbon material layer that constitutes the partition wall or the like can be similar to the specific examples and combinations described earlier as the material that constitutes the exposed surface of the coating layer and the material that constitutes the side wall of the partition wall or the like in the imaging apparatus with a face-to-back structure.

In the imaging apparatus with a face-to-face structure including the various preferable configurations described above, a configuration can be adopted in which an infrared absorbing layer is formed on a side to which infrared light is incident (a side of a first surface of the base), and an infrared reflecting layer is formed in a region of the coating layer that is positioned in a bottom portion of the void. The infrared reflecting layer may be formed in a portion of the coating layer that is positioned in the bottom portion of the void, formed in a part of the portion of the coating layer that is positioned in the bottom portion of the void, or formed so as to protrude outside the portion of the coating layer that is positioned in the bottom portion of the void. In addition, in this case, the infrared absorbing layer may be formed on the first surface of the base or on an insulating film that is formed on the first surface of the base or the infrared absorbing layer may be formed in a state where a gap (a space) exists between the infrared absorbing layer and the first surface of the base. Alternatively, the infrared absorbing layer may be provided on a side of the second surface of the base or, in some cases, provided on the sealing member or the protective member to be described next. Furthermore, in this case, a configuration can be adopted in which the infrared reflecting layer is formed on a top surface of the coating layer (including on the top surface of the coating layer or a part of the top surface of the coating layer) or formed inside the coating layer. Moreover, in this case, a configuration can be adopted in which when a wavelength of infrared light to be absorbed by the infrared absorbing layer is denoted by $\lambda_{IR}$, an optical distance $L_0$ between the infrared absorbing layer and the infrared reflecting layer satisfies $$0.75 \times \lambda_{IR}/2 \le L_0 \le 1.25 \times \lambda_{IR}/2$$

or $$0.75 \times \lambda_{IR}/4 \le L_0 \le 1.25 \times \lambda_{IR}/4.$$

Alternatively, in the imaging apparatus with a face-to-face structure including the various preferable configurations described above, a configuration can be adopted in which a first infrared absorbing layer is formed on a side to which infrared light is incident (a side of a first surface of the base), an infrared reflecting layer is formed in a region of the coating layer that is positioned in a bottom portion of the void, and a second infrared absorbing layer is formed on a side that opposes the void (a side of a second surface of the base). The infrared reflecting layer may be formed in a portion of the coating layer that is positioned in the bottom portion of the void, formed in a part of the portion of the coating layer that is positioned in the bottom portion of the void, or formed so as to protrude outside the portion of the coating layer that is positioned in the bottom portion of the void. In addition, in this case, the first infrared absorbing layer may be formed on the first surface of the base or on an insulating film formed on the first surface of the base or, in other cases, provided on the sealing member or the protective member to be described next. For example, the second infrared absorbing layer may be formed on the second surface of the base which opposes the void or on an insulating film that is formed on the second surface of the base or the second infrared absorbing layer may be formed in a state where a gap (a space) exists between the second infrared absorbing layer and the second surface of the base. Furthermore, in this case, a configuration can be adopted in which the infrared reflecting layer is formed on a top surface of the coating layer (including on the top surface of the coating layer or a part of the top surface of the coating layer) or formed inside the coating layer. Since each infrared absorbing layer not only absorbs infrared light but also partially transmits and partially reflects infrared light, adopting a structure that reduces transmission and reflection enables sensitivity to be further improved. In other words, since such a configuration causes a part of infrared light having been transmitted through the first infrared absorbing layer to be further absorbed by the second infrared absorbing layer, transmission can be reduced. In addition, due to infrared light reflected by the first infrared absorbing layer and infrared light reflected by the second infrared absorbing layer canceling out each other in opposite phases, reflection can be reduced. Furthermore, due to infrared light reflected by the second infrared absorbing layer and infrared light reflected by the infrared reflecting layer canceling out each other in opposite phases, reflection can be reduced. Moreover, in this case, a configuration can be adopted in which when a wavelength of infrared light to be absorbed by the first infrared absorbing layer and the second infrared absorbing layer is denoted by $\lambda_{IR}$, an optical distance between the first infrared absorbing layer and the second infrared absorbing layer is denoted by $L_1$, and an optical distance between the second infrared absorbing layer and the infrared reflecting layer is denoted by $L_2$, $L_1$ and $L_2$ satisfy $$0.75 \times \lambda_{IR}/4 \le L_1 \le 1.25 \times \lambda_{IR}/4 \text{ and}$$

$$0.75 \times \lambda_{IR}/4 \le L_2 \le 1.25 \times \lambda_{IR}/4.$$

An example of $\lambda_{IR}$ is 8 μm to 14 μm.

Furthermore, in the imaging apparatus with a face-to-face structure including the various preferable configurations described above, a configuration can be adopted in which a sealing member or a protective member (hereinafter, these members will be collectively referred to as a "protective member or the like") is arranged on a side of the first substrate to which infrared light is incident (a side of a first surface of the first substrate). In addition, in this case, the protective member or the like may be arranged on the surface of the first substrate (on the first surface of the first substrate) or arranged above the surface of the first substrate (above the first surface of the first substrate). Furthermore, in the imaging apparatus with a face-to-back structure including the various preferable configurations described above, a configuration can be adopted in which the protective member or the like is arranged above the surface of the first substrate (the first surface of the first substrate) to which infrared light is incident.

Alternatively, in the imaging apparatus according to the first aspect of the present disclosure or the like, a configuration can be adopted in which the imaging apparatus includes a sensor portion unit configured to detect a temperature based on infrared light; the sensor portion unit is made up of two sensor portions vertically arranged along an incidence of infrared light; and in the sensor portion unit, wavelengths of infrared light detected by the respective sensor portions may be the same or may differ from each other or amounts of infrared absorption of the respective sensor portions may differ from each other.

Moreover, in the imaging apparatus according to the first aspect of the present disclosure including the various preferable modes and configurations described above and the like, a mode can be adopted in which a thermally conductive layer is formed in the coating layer. The thermally conductive layer may have high thermal conductivity or, conversely, the thermally conductive layer may have low thermal conductivity. Examples of a material that constitutes the thermally conductive layer having high thermal conductivity include a metal material and a carbon-based material such as a carbon film or a carbon nanotube and examples of a material that constitutes the thermally conductive layer having low thermal conductivity include organic materials. Although not limited thereto, preferably, the thermally conductive layer is formed over an entire surface of the temperature detecting element array region. In addition, although not limited thereto, the thermally conductive layer is desirably arranged inside the coating layer and below the infrared reflecting layer. In some cases, the thermally conductive layer may double as an infrared reflecting layer.

Furthermore, in the imaging apparatus according to the first aspect of the present disclosure including the various preferable modes and configurations described above and the like, a mode can be adopted in which a temperature control layer is formed in the coating layer and the imaging apparatus further includes temperature detecting means and, accordingly, a temperature or a temperature distribution of the temperature detecting element can be controlled with high accuracy. In this case, a configuration can be adopted in which the temperature control layer functions as a heater (a resistor or a resistance member) and, for example, a configuration can be adopted in which the temperature control layer doubles as wiring. Specifically, examples of the temperature detecting means can include a silicon diode, a transistor, and a polysilicon thin film which detect temperature by measuring a change in an electric resistance value that is dependent on temperature, examples of a material constituting the temperature control layer that doubles as wiring include a metal-based material film such as tungsten film, a polysilicon film, and a titanium film, and examples of a material constituting the temperature control layer include a laminated film and a carbon film using a Peltier effect. In some cases, the temperature control layer may be provided in the second substrate. Furthermore, in these cases, a configuration can be adopted in which, based on a result of temperature detection by the temperature detecting means, a drive circuit controls the temperature control layer (specifically, for example, the drive circuit controls a current to be passed through the temperature control layer and, in turn, controls an amount of heat generation by the temperature control layer). In addition, in these configurations, a first structure includes a temperature detecting element array region including temperature detecting elements and a peripheral region that encloses the temperature detecting element array region and a configuration can be adopted in which the temperature control layer is formed in the temperature detecting element array region or a configuration can be adopted in which the temperature control layer is formed in a region of the coating layer in which an orthogonally projected image of the temperature detecting element array region exists, or the drive circuit includes an analog-digital converter circuit (ADC) and a configuration can be adopted in which the analog-digital converter circuit is not arranged in a region of the second substrate (a drive substrate) in which an orthogonally projected image of the temperature detecting element array region exists. Since the analog-digital converter circuit generates a large amount of heat, adopting such a configuration enables further homogenization of temperature to be achieved. It should be noted that such an arrangement of the temperature control layer can also be applied to a structure in which a known light-receiving element (a light-receiving element that receives visible light) is formed instead of a temperature detecting element. In addition, in some cases, the temperature control layer may double as an infrared reflecting layer.

Moreover, in the imaging apparatus according to the first aspect of the present disclosure including the various preferable modes and configurations described above and the like, a mode can be adopted in which the imaging apparatus includes a plurality of temperature detecting elements, and the void is shared between 2×k-number of adjacent temperature detecting elements (where k is an integer equal to or larger than 1).

Moreover, in the imaging apparatus according to the first aspect of the present disclosure including the various preferable modes and configurations described above, a mode can be adopted in which the imaging apparatus includes a temperature detecting element unit configured to detect a temperature based on infrared light, the temperature detecting element unit is made up of a plurality of juxtaposed temperature detecting elements, and wavelengths of infrared light to be detected by the respective temperature detecting elements differ from each other in the temperature detecting element unit. For convenience's sake, the imaging apparatus according to the present disclosure in such a mode will be referred to as an "imaging apparatus according to a second aspect of the present disclosure". In the imaging apparatus according to the second aspect of the present disclosure, since the temperature detecting element unit is made up of a plurality of juxtaposed temperature detecting elements and wavelengths of infrared light to be detected by the respective temperature detecting elements differ from each other in the temperature detecting element unit, wavelength spectral characteristics or sensitivity to infrared light can be changed for each temperature detecting element.

Alternatively, in the imaging apparatus according to the present disclosure including the various preferable modes and configurations described above, a mode can be adopted in which the imaging apparatus includes a temperature detecting element unit configured to detect a temperature based on infrared light, the temperature detecting element unit is made up of a plurality of juxtaposed temperature detecting elements, and amounts of infrared absorption of the respective temperature detecting elements differ from each other in the temperature detecting element unit. For convenience's sake, the imaging apparatus according to the present disclosure in such a mode will be referred to as an "imaging apparatus according to a third aspect of the present disclosure". In the imaging apparatus according to the third aspect of the present disclosure, since the temperature detecting element unit is made up of a plurality of juxtaposed temperature detecting elements and amounts of infrared absorption of the respective temperature detecting elements differ from each other in the temperature detecting element unit, wavelength spectral characteristics or sensitivity to infrared light can be changed for each temperature detecting element.

Alternatively, in the imaging apparatus according to the present disclosure including the various preferable modes and configurations described above, a mode can be adopted in which the imaging apparatus includes:

$M_0 \times N_0$ (where $M_0 \geq 2$, $N_0 \geq 2$) number of temperature detecting elements which are arranged in a first direction and a second direction that differs from the first direction and which are configured to detect a temperature based on infrared light;

a plurality of drive lines which are arranged along the first direction;

$N_0 \times P_0$ (where $P_0 \geq 2$) number of signal lines which are arranged along the second direction;

a first drive circuit to which the plurality of drive lines are connected; and a second drive circuit to which the $N_0 \times P_0$ number of signal lines are connected, wherein each temperature detecting element includes a first terminal portion and a second terminal portion, the first terminal portion of each temperature detecting element is connected to a drive line, and an (n, p)-th signal line (where n=1, 2, . . . , $N_0$, p=1, 2, . . . , $P_0$) is connected to the second terminal portion of a $\{(q-1)P_0+p\}$-th temperature detecting element (where, q=1, 2, 3, . . . ) in a temperature detecting element group constituted by $N_0$-number of an n-th temperature detecting element arranged along the second direction. For convenience's sake, the imaging apparatus according to the present disclosure in such a mode will be referred to as an "imaging apparatus according to a fourth aspect of the present disclosure". In the imaging apparatus according to the fourth aspect of the present disclosure, since the (n, p)-th signal line is connected to the second terminal portion of the $\{(q-1)P_0+p\}$-th temperature detecting element in a temperature detecting element group constituted by $N_0$-number of the n-th temperature detecting element arranged along the second direction, time considered necessary for integrating signals output from the temperature detecting elements can be sufficiently secured and an increase in sensitivity and a reduction in noise in the imaging apparatus can be achieved.

In the imaging apparatus according to the second aspect of the present disclosure, a mode can be adopted in which each temperature detecting element includes an infrared absorbing layer on an infrared incidence side and an infrared reflecting layer on an opposite side to the infrared incidence side and, in the temperature detecting element unit, optical distances $L_0$ between the infrared absorbing layer and the infrared reflecting layer among the respective temperature detecting elements differ from each other, and when a wavelength of infrared light to be absorbed by the infrared absorbing layer that constitutes each temperature detecting element is denoted by $\lambda_{IR}$, the optical distance $L_0$ in the temperature detecting element satisfies $0.75 \times \lambda_{IR}/2 \leq L_0 \leq 1.25 \times \lambda_{IR}/2$ or $0.75 \times \lambda_{IR}/4 \leq L_0 \leq 1.25 \times \lambda_{IR}/4.$ In addition, in the imaging apparatus according to the second aspect of the present disclosure including the preferable mode described above, a mode can be adopted in which each temperature detecting element has an infrared absorbing layer on an infrared incidence side and has an infrared reflecting layer on an opposite side to the infrared incidence side and, in the temperature detecting element unit, a material, a configuration, or a structure that constitutes the infrared absorbing layer, a material, a configuration, or a structure that constitutes the infrared reflecting layer, or a material, a configuration, or a structure that constitutes the infrared absorbing layer and a material, a configuration, or a structure that constitutes the infrared reflecting layer differs among the respective temperature detecting elements. In other words, (case A) a mode in which a material, a configuration, or a structure that constitutes the infrared absorbing layer differs but a material, a configuration, or a structure that constitutes the infrared reflecting layer is the same among the respective temperature detecting elements, (case B) a mode in which a material, a configuration, or a structure that constitutes the infrared reflecting layer differs but a material, a configuration, or a structure that constitutes the infrared absorbing layer is the same among the respective temperature detecting elements, or (case C) a mode in which a material, a configuration, or a structure that constitutes the infrared absorbing layer differs and a material, a configuration, or a structure that constitutes the infrared reflecting layer differs among the respective temperature detecting elements can be adopted.

In the imaging apparatus according to the third aspect of the present disclosure, a mode can be adopted in which each temperature detecting element has an infrared absorbing layer on an infrared incidence side and has an infrared reflecting layer on an opposite side to the infrared incidence side and, in the temperature detecting element unit, a material that constitutes the infrared absorbing layer, a material that constitutes the infrared reflecting layer, or a material that constitutes the infrared absorbing layer and a material that constitutes the infrared reflecting layer differs among the respective temperature detecting elements. In addition, in the imaging apparatus according to the third aspect of the present disclosure including the preferable mode described above, a mode can be adopted in which each temperature detecting element has an infrared absorbing layer on an infrared incidence side and has an infrared reflecting layer on an opposite side to the infrared incidence side and, in the temperature detecting element unit, an area, a thickness, or an area and a thickness of the infrared absorbing layer, the infrared reflecting layer, or the infrared absorbing layer and the infrared reflecting layer differ among the respective temperature detecting elements. In other words, (case a) a mode in which the area of the infrared absorbing layer differs but the area of the infrared reflecting layer is the same among the respective temperature detecting elements, (case b) a mode in which the area of the infrared reflecting layer differs but the area of the infrared absorbing layer is the same among the respective temperature detecting elements, (case c) a mode in which the area of the infrared absorbing layer differs and the area of the infrared reflecting layer differs among the respective temperature detecting elements, (case d) a mode in which the thickness of the infrared absorbing layer differs but the thickness of the infrared reflecting layer is the same among the respective temperature detecting elements, (case e) a mode in which the thickness of the infrared reflecting layer differs but the thickness of the infrared absorbing layer is the same among the respective temperature detecting elements, (case f) a mode in which the thickness of the infrared absorbing layer differs and the thickness of the infrared reflecting layer differs among the respective temperature detecting elements, (case g) a mode in which the area and the thickness of the infrared absorbing layer differ but the area and the thickness of the infrared reflecting layer are the same among the respective temperature detecting elements, (case h) a mode in which the area and the thickness of the infrared reflecting layer differ but the area and the thickness of the infrared absorbing layer are the same among the respective temperature detecting elements, or (case i) a mode in which the area and the thickness of the infrared absorbing layer differ and the area and the thickness of the infrared reflecting layer differ among the respective temperature detecting elements can be adopted.

In the imaging apparatuses according to the second and third aspects of the present disclosure, the number of temperature detecting elements that constitute a temperature detecting element unit need only be two or larger.

In the imaging apparatus according to the fourth aspect, a mode can be adopted in which the number of the plurality of drive lines is $M_0/P_0$, and an m-th drive line (where m=1, 2, . . . , $M_0/P_0$) is shared in a temperature detecting element group constituted by $M_0$-number of a $\{(m-1)P_0+p'\}$-th temperature detecting element (where p'=1, 2, . . . , all values of $P_0$) arranged along the first direction.

In addition, in the imaging apparatus according to the fourth aspect including the preferable mode described above, a configuration can be adopted in which, in the second drive circuit, each signal line is connected to an analog front end and an analog-digital converter circuit, and the analog front end has a differential integrator circuit configured to function as an amplifier (a pre-amplifier). Alternatively, in the imaging apparatus according to the fourth aspect including the preferable mode described above, a configuration can be adopted in which, in the second drive circuit, each signal line is connected to an analog front end and an analog-digital converter circuit and, in this case, a configuration can be further adopted in which the analog front end has a differential integrator circuit. The analog front end including a differential integrator circuit and the analog-digital converter circuit can have known circuit configurations.

Furthermore, in the imaging apparatus according to the fourth aspect of the present disclosure including the various preferable modes and configurations described above, a mode can be adopted in which the temperature detecting element is arranged above a void provided in a temperature detecting element substrate, a first connecting portion provided in the temperature detecting element substrate and a first terminal portion of the temperature detecting element are connected via a first stud portion (a supporting leg or an elongated beam, a similar description will apply below), and a second connecting portion provided in the temperature detecting element substrate and a second terminal portion of the temperature detecting element are connected via a second stud portion. In addition, in this case, a mode can be adopted in which $P_0=2$, respective second terminal portions of two temperature detecting elements adjacent to each other in the second direction are connected to a second connecting portion provided in the temperature detecting element substrate via a single second stud portion, and respective first terminal portions of a total of four temperature detecting elements including two temperature detecting elements adjacent to each other in the first direction and two temperature detecting elements adjacent to each other in the second direction are connected to a first connecting portion provided in the temperature detecting element substrate via a single first stud portion.

Alternatively, in the imaging apparatus according to the first aspect of the present disclosure and the like, a mode can be adopted in which the imaging apparatus includes:

$S_0 \times T_0$ (where $S_0 \geq 2$, $T_0 \geq 2$) number of temperature detecting elements which are arranged in a first direction and a second direction that differs from the first direction and which are configured to detect a temperature based on infrared light;

$S_0 \times U_0$ (where $U_0 \geq 2$) number of drive lines which are arranged along the first direction;

a plurality of signal lines which are arranged along the second direction;

a first drive circuit to which the $S_0 \times U_0$ number of drive lines are connected; and a second drive circuit to which the plurality of signal lines are connected, wherein each temperature detecting element includes a first terminal portion and a second terminal portion, the second terminal portion of each temperature detecting element is connected to a signal line, and an (s, u)-th drive line (where s=1, 2, . . . , $S_0$, u=1, 2, . . . , $U_0$) is connected to the first terminal portion of a $\{(t-1)U_0+u\}$-th temperature detecting element (where, t=1, 2, 3, . . . ) in a temperature detecting element group constituted by $S_0$-number of an s-th temperature detecting element arranged along the first direction.

For convenience's sake, the imaging apparatus according to the present disclosure in such a mode will be referred to as an "imaging apparatus according to a fifth aspect of the present disclosure". In the imaging apparatus according to the fifth aspect of the present disclosure, since the (s, u)-th drive line is connected to the first terminal portion of the $\{(t-1)U_0+u\}$-th temperature detecting element in a temperature detecting element group constituted by $S_0$-number of the s-th temperature detecting element arranged along the first direction, reduction in power consumption when driving the temperature detecting elements can be achieved.

Alternatively, from the perspectives of simplifying a configuration of an entire imaging apparatus, combined use with an infrared light passage window, and reducing a thickness of the entire imaging apparatus, in the imaging apparatus according to the present disclosure, an aspect can be adopted in which the imaging apparatus is constituted by a first structure and a second structure,
the first structure includes
a first substrate,
a plurality of temperature detecting elements which are provided on the first substrate, which are arranged in a first direction and a second direction that differs from the first direction, and which are configured to detect a temperature based on infrared light,
a plurality of drive lines which are arranged along the first direction and to which a plurality of temperature detecting elements are respectively connected, and
a plurality of signal lines which are arranged along the second direction and to which a plurality of temperature detecting elements are respectively connected, the second structure includes
a second substrate and
a drive circuit provided on the second substrate,
the first structure further includes a temperature detecting element array region including a plurality of temperature detecting elements and a peripheral region that encloses the temperature detecting element array region,
the second structure is attached to a side of the first substrate to which infrared light is incident, and
the drive lines and the signal lines are electrically connected to the drive circuit in the peripheral region. For convenience's sake, the imaging apparatus according to such an aspect will be referred to as an "imaging apparatus according to a sixth aspect of the present disclosure".

In the imaging apparatus according to present disclosure including the imaging apparatuses according to the first to sixth aspects of the present disclosure including the various preferable modes and configurations and the imaging apparatus according to the 1-A-th aspect of the present disclosure described above (hereinafter, these imaging apparatuses will be collectively referred to as an "imaging apparatus according to the present disclosure and the like"), a mode can be adopted in which, in the drive circuit or the second drive circuit, each signal line is connected to an analog front end and an analog-digital converter circuit. In addition, in this case, a mode can be adopted in which the analog front end has a differential integrator circuit and switching means configured to control a continuity state of the differential integrator circuit and the signal line is provided between the differential integrator circuit and the signal line and, further, in this case, a mode can be adopted in which the switching means is configured to set the signal line to a fixed potential when creating a non-continuity state between the differential integrator circuit and the signal line. The analog front end including a differential integrator circuit, the analog-digital converter circuit, and the switching means can have known circuit configurations.

In the imaging apparatus according to the present disclosure and the like including the various preferable modes and configurations described above, a mode can be adopted in which the sensor portion constituting a temperature detecting element is made of: various diodes such as a p-n junction diode including a SOI diode and a Schottky diode, a transistor, or a combination of a diode and an active element; a resistance bolometer element including a vanadium oxide film, an amorphous silicon film, a polysilicon film, a silicon carbide film, or a titanium film; a thermoelectric conversion element using a metal such as platinum, gold, or nickel, a thermistor, or the like; a thermopile element using a Seebeck effect; a pyroelectric element in which a surface charge of a dielectric body changes; a ferroelectric element; a diode using a tunnel effect; or an element to which superconductivity is applied, and these elements have known configurations and structures. More specifically, a mode can be adopted in which the sensor portion is made of a p-n junction diode, a bolometer element, a thermopile element, a metal film resistive element, a metal oxide resistive element, a ceramic resistive element, or a thermistor element. For example, a single sensor portion can be constituted by a plurality of diodes connected in series. For example, the sensor portion can be formed based on so-called MEMS technology. In addition, in the imaging apparatus according to the present disclosure and the like including the various preferable modes and configurations described above, a mode can be adopted in which the imaging apparatus further includes a light-shielding portion.

In the imaging apparatuses according to the second to fifth aspects of the present disclosure, the temperature detecting element may be provided on an infrared incidence side of the first substrate or the temperature detecting element substrate or may be provided on an opposite side to the infrared incidence side of the first substrate or the temperature detecting element substrate.

In the imaging apparatus according to the present disclosure and the like, examples of the number of the plurality of temperature detecting elements or the temperature detecting element units which are arranged in a first direction and a second direction that differs from the first direction (specifically, for example, in a two-dimensional matrix pattern) and which are configured to detect a temperature based on infrared light include 640×480 (VGA), 320×240 (QVGA), 160×120 (QQVGA), 612×512, 1980×1080 (and an integral multiple thereof), and 2048×1080 (and an integral multiple thereof). While the first direction and the second direction are preferably orthogonal to each other, the directions are not limited thereto and an arrangement may be adopted in which pixels are removed in a checker board pattern in a pixel arrangement having the number of pixels described above and the pixel arrangement is rotated obliquely by 45 degrees.

In the imaging apparatus according to the present disclosure and the like, as described earlier, the first substrate can be constituted by a silicon semiconductor substrate, a SOI substrate, or the like, the temperature detecting element substrate can also be constituted by a silicon semiconductor substrate, a SOI substrate, or the like, and the second substrate can be constituted by a silicon semiconductor substrate or the like. The drive lines and the signal lines may be formed of known conductive materials based on known methods. The drive circuit included in the second structure can also be constituted by a known drive circuit. Alternatively, the drive circuit can be constituted by a known read-only integrated circuit (ROIC).

The coating layer that coats the drive circuit in the second structure can be constituted by, for example, a silicon oxide-based material, a silicon nitride-based material, a silicon oxynitride-based material, or various organic materials. The coating layer may be configured in a single layer or the coating layer may have a laminated structure made up of a plurality of layers.

Examples of a method of electrically connecting the drive lines and the signal lines to the drive circuit include a method using a bump containing a solder, indium, gold (Au), or the like, a method based on a chip-on-chip system, a method using a through-chip via (TCV) or a through-silicon via (TSV), and a metal-metal junction including Cu—Cu.

A junction between the first substrate and the coating layer or, specifically, a junction between a bottom portion of a partition wall or the like and the coating layer can be performed based on, for example, a method such as forming a silicon-oxygen covalent bond by dehydration condensation.

Examples of a material that constitutes the infrared absorbing layer include chrome (Cr) and an alloy thereof, aluminum (Al) and an alloy thereof, and a laminated structure including a layer made of these materials and, for example, a $SiO_2$ film or a SiN film. Heat that is generated as a result of absorption of infrared light by the infrared absorbing layer is desirably reliably transferred to the temperature detecting element (the sensor portion). In addition, the infrared absorbing layer is desirably set to a thickness that causes a sheet resistance value of a conductor material or a resistor material constituting the infrared absorbing layer to be within a range of 377 Ω±30%. Examples of a material that constitutes the infrared reflecting layer include aluminum (Al) and an alloy thereof, gold (Au) and an alloy thereof, silver (Ag) and an alloy thereof, copper (Cu) and an alloy thereof, platinum (Pt) and an alloy thereof, and a laminated structure including a layer made of these materials of which characteristics (for example, sheet resistivity or a sheet resistance value) differ from those of the infrared absorbing layer. The infrared reflecting layer may double as a metal material layer or an alloy material layer that constitutes an exposed surface of the coating layer.

A space in which the temperature detecting element is arranged is preferably depressurized or vacuumized (including low pressure that is close to a vacuum: a similar description will apply below). A void is also preferably depressurized or vacuumized. Alternatively, the entire imaging apparatus is preferably stored in a depressurized or vacuumized package or container (case).

When necessary, a structure for preventing reflection of infrared light or an infrared filter for passing only infrared light with a specific frequency may be arranged in the imaging apparatus on the infrared incidence side.

The imaging apparatus according to the first aspect of the present disclosure and the like including the various preferable modes and configurations and the imaging apparatus according to the 1-A-th aspect of the present disclosure described above to the imaging apparatus according to the sixth aspect of the present disclosure can be arbitrary combined with each other. The combination is not limited to imaging apparatuses of two aspects and can include imaging apparatuses of three or more aspects.

The imaging apparatus according to the present disclosure and the like can be applied to, for example, an infrared camera, a night-vision camera, a thermograph, a vehicle-mounted camera (human detection), an air conditioner (human detection sensor), and a microwave oven. Alternatively, examples of applications can include autofocusing means using a parallax (or a deviation of an image), focus deviation detecting means using a parallax (or a deviation of an image), vehicular collision avoiding means using a parallax (or a deviation of an image), a display apparatus or goggles that enables binocular stereoscopic viewing of a thermal image using a parallax, a head-mounted display (for example, goggles for firefighters), and the like.

First Embodiment

Figure 4:
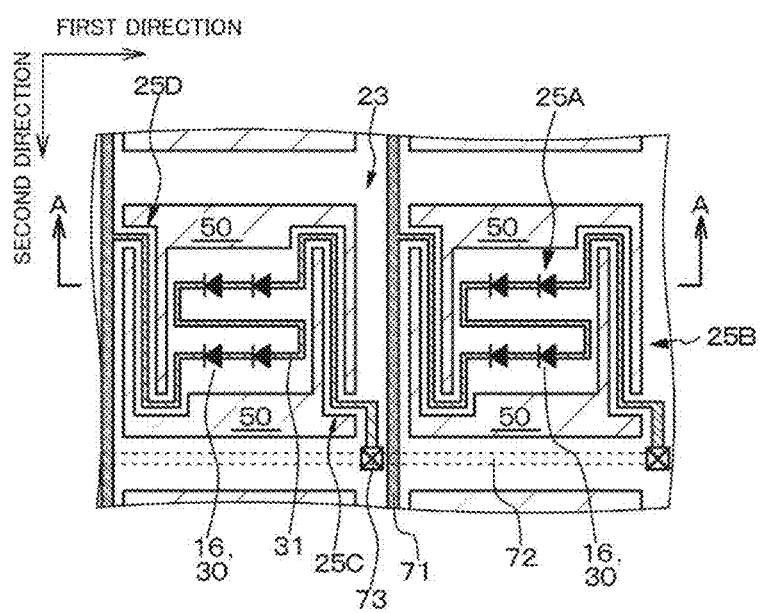
FIG. 4 is a schematic partial plan view of the imaging apparatus according to the first embodiment.
Figure 5:
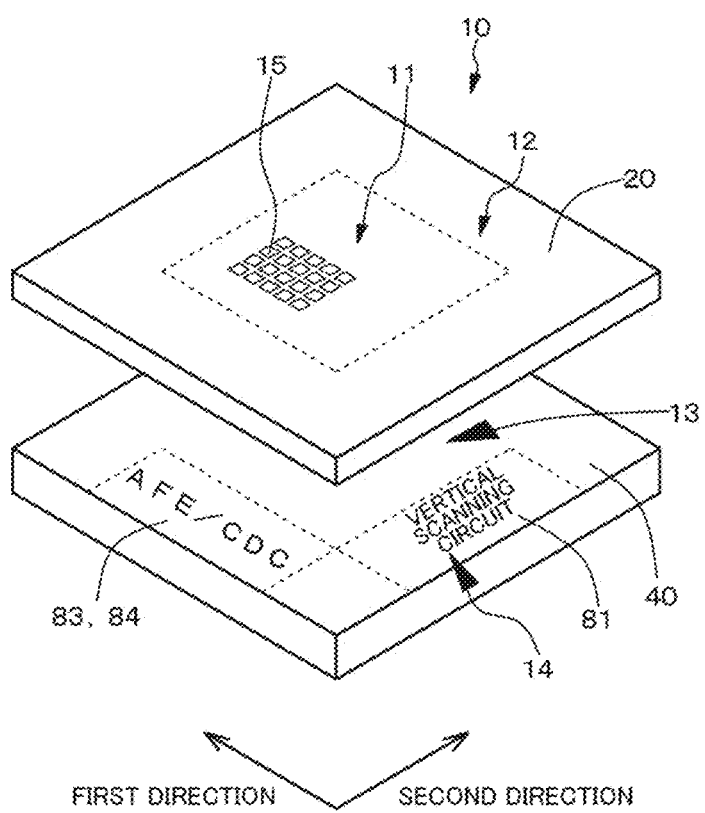
FIG. 5 is a schematic exploded perspective view of a first structure and a second structure in the imaging apparatus according to the first embodiment.
Figure 6:
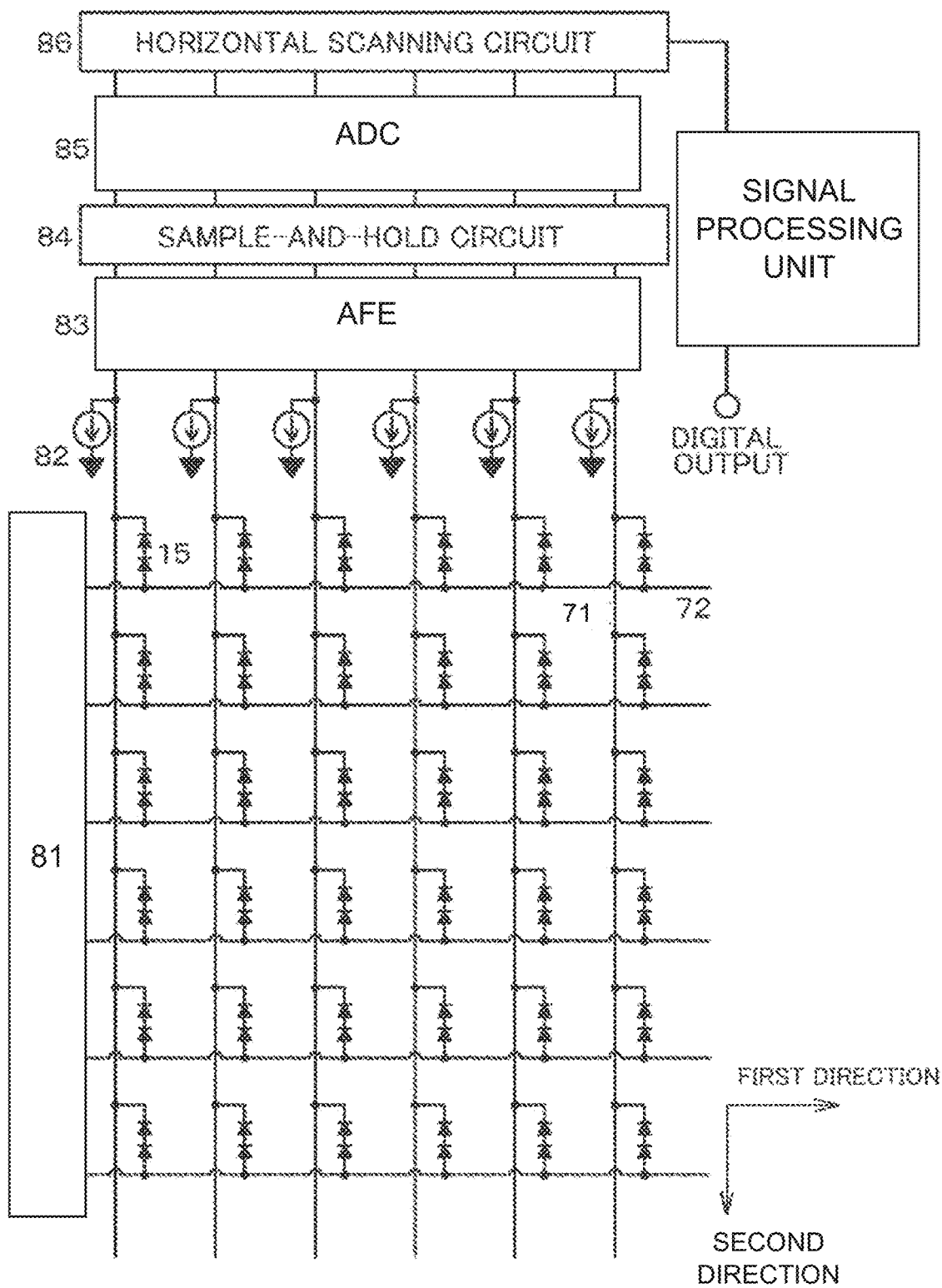
FIG. 6 is an equivalent circuit diagram of the imaging apparatus according to the first embodiment.

A first embodiment relates to the temperature detecting element according to the present disclosure and the imaging apparatus according to the present disclosure or, more specifically, the imaging apparatus according to the first aspect of the present disclosure. FIG. 1 shows a schematic partial end view of an imaging apparatus according to the first embodiment, and FIG. 4 shows a schematic partial plan view of the imaging apparatus according to the first embodiment. In addition, FIG. 5 shows a schematic exploded perspective view of a first structure and a second structure in the imaging apparatus according to the first embodiment, and FIG. 6 shows an equivalent circuit diagram of the imaging apparatus according to the first embodiment. Specifically, the imaging apparatus according to the first embodiment is an imaging apparatus with a face-to-back structure. In this case, FIG. 1 is a schematic partial end view taken along an arrow A-A in FIG. 4. In addition, in FIG. 4, illustration of an insulating film and an infrared absorbing layer have been omitted, voids, signal lines, and wirings have been hatched for clarity, drive lines are depicted by dotted lines, and p-n junction diodes are denoted by symbols.

A temperature detecting element (a thermal image sensor) according to the first embodiment is a temperature detecting element 15 including:

a light-collecting portion constituted by a first light-collecting portion 101 to which infrared light is incident and a second light-collecting portion 102 to which infrared light having been exited from the first light-collecting portion 101 is incident; and a sensor portion 16 to which infrared light having been exited from the second light-collecting portion 102 is incident, wherein at least one of the first light-collecting portion 101 and the second light-collecting portion 102 is provided on a base 100 that covers the temperature detecting element 15.

In addition, an imaging apparatus according to the first embodiment includes a temperature detecting element array region 11 which is constituted by a plurality of the temperature detecting elements 15 and which is covered by the base 100 through which infrared light passes, wherein each temperature detecting element 15 includes:
the light-collecting portion constituted by the first light-collecting portion 101 to which infrared light is incident and the second light-collecting portion 102 to which infrared light having been exited from the first light-collecting portion 101 is incident; and
the sensor portion 16 to which infrared light having been exited from the second light-collecting portion 102 is incident, and
at least one of the first light-collecting portion 101 and the second light-collecting portion 102 is provided on the base 100.

In this case, in the temperature detecting element 15 according to the first embodiment, the first light-collecting portion 101 is provided on a first surface 100A of the base 100 that is an infrared incident surface and the second light-collecting portion 102 is provided on a second surface 100B that opposes the first surface 100A of the base 100. The sensor portion 16 detects a temperature based on infrared light.

The base 100 is constituted by a protective member or a sealing member and is joined in a region (not illustrated) to a first substrate 21 to be described later. In addition, the base 100 is constituted by a material that is transparent with respect to infrared light or, in other words, a material that transmits infrared light and, specifically, for example, the base 100 is constituted by a silicon semiconductor substrate.

The first light-collecting portion 101 and the second light-collecting portion 102 are also constituted by a material that is transparent with respect to infrared light or, in other words, a material that transmits infrared light. In the first embodiment, the first light-collecting portion 101 and the second light-collecting portion 102 are integrally formed with the base 100. In other words, the first light-collecting portion 101 and the second light-collecting portion 102 are formed of a same material as the base 100 and are provided so as to extend from the base 100. Since the first light-collecting portion 101 is provided on the first surface 100A of the base 100 and the second light-collecting portion 102 is provided on the second surface 100B of the base 100, the first light-collecting portion 101 and the second light-collecting portion 102 have a mode of a plano-convex lens. A value of a radius of curvature in a curved portion of the first light-collecting portion 101 and a value of a radius of curvature in a curved portion of the second light-collecting portion 102 may be a same value or may be different values. Examples of a planar shape of the first light-collecting portion 101 and the second light-collecting portion 102 include a circle, an ellipse, a rectangle with four rounded corners, and a polygon.

Alternatively, an imaging apparatus 10 according to the first embodiment is related to the imaging apparatus according to the first aspect of the present disclosure in which the imaging apparatus 10 is constituted by
  a first structure 20 and a second structure 40,
  the first structure 20 includes
  a first substrate 21 and
  a drive line 72 and a signal line 71 connected to the temperature detecting element 15,
  the temperature detecting element 15 configured to detect a temperature based on infrared light is provided on the first substrate 21,
  the second structure 40 includes
  a second substrate 41 and
  a drive circuit which is provided on the second substrate 41 and which is coated by a coating layer (an interlayer insulating layer) 43,
  the first substrate 21 is joined to the coating layer 43, and
  a void 50 is provided between the temperature detecting element 15 and the coating layer 43. In addition, the drive line 72 and the signal line 71 are electrically connected to the drive circuit.

In the first embodiment or the second to thirteenth embodiments to be described later, the imaging apparatus includes
  a plurality of the temperature detecting elements 15 arranged in a first direction and a second direction that differs from the first direction, and
  the imaging apparatus further includes
  a plurality of the drive lines 72 which are arranged along the first direction and to which a plurality of temperature detecting elements 15 are respectively connected and
  a plurality of signal lines 71 which are arranged along the second direction and to which a plurality of temperature detecting elements 15 are respectively connected.
In the drawings, a layer in which the drive circuit is formed is schematically denoted by reference numeral 42. In this case, as shown in FIG. 5, the first structure 20 has a temperature detecting element array region 11 (shown enclosed by a dotted line) including temperature detecting elements 15 and a peripheral region 12 that encloses the temperature detecting element array region 11, and the drive lines 72 and the signal lines 71 are electrically connected to the drive circuit in the peripheral region 12. A central region in the second structure 40 is denoted by reference numeral 13 and a peripheral region in the second structure 40 is denoted by reference numeral 14. In addition, illustration of the base 100 is omitted in FIG. 5.

While the drive lines 72 and the signal lines 71 are electrically connected to the drive circuit by, for example, a through-silicon via (TSV) in the peripheral regions 12 and 14, illustration of the through-silicon via (TSV) has been omitted. For example, a region in which are provided an analog front end (AFE) 83 including a differential integrator circuit that constitutes a drive circuit, a sample-and-hold circuit 84, and an analog-digital converter circuit (ADC) 85, a constant current circuit 82, and a vertical scanning circuit 81 are arranged in the peripheral region 14 of the second structure 40. The differential integrator circuit functions as an amplifier (a pre-amplifier). In addition, for example, a horizontal scanning circuit 86 that constitutes a drive circuit, a CPU (or a DSP), a signal processing circuit, a storage apparatus (for example, a memory or a non-volatile memory), and the like are arranged in a central region 13 of the second structure 40. It should be noted that illustrations of the CPU (or a DSP), the signal processing circuit, and the storage apparatus have been omitted. The drive circuit included in the second structure 40 can be constituted by a known drive circuit.

In the imaging apparatus 10 according to the first embodiment, a partition wall 23 is formed in a portion of the first substrate 21 that is positioned between a temperature detecting element 15 and another temperature detecting element 15, and a bottom portion of the partition wall 23 is joined to the coating layer 43. In this case, the bottom portion of the partition wall 23 and the coating layer 43 are joined based on a method such as forming a silicon-oxygen covalent bond by dehydration condensation. A side wall 24 of the partition wall 23 is constituted by at least one type of material layer selected from a group consisting of an insulating material layer, a metal material layer, an alloy material layer, and a carbon material layer. Specifically, in the first embodiment, the side wall 24 of the partition wall 23 is constituted by an insulating material layer such as a $SiO_2$ layer. In addition, an interior of the partition wall 23 that is enclosed by the side wall 24 among the partition wall 23 is constituted by a part of the first substrate 21 or, specifically, a silicon layer 22. An exposed surface of the coating layer 43 that is exposed to the void 50 is constituted by at least one type of material layer selected from a group consisting of an insulating material layer, a metal material layer, an alloy material layer, and a carbon material layer. Specifically, in the first embodiment, the exposed surface of the coating layer 43 that is exposed to the void 50 is constituted by an insulating material layer such as a $SiO_2$ layer, and an interlayer insulating layer (specifically, not illustrated) made of SiN that constitutes the coating layer 43 is formed below the $SiO_2$ layer. However, the coating layer 43 is illustrated as a single layer in the drawings. Constituting the side wall 24 of the partition wall 23 by a material that reflects infrared light enables incident infrared light to be effectively reflected.

In the first embodiment, while the sensor portion 16 constituting the temperature detecting element 15 is made up of a plurality of (in the illustrated example, four) p-n junction diodes 30 being connected in series via a wiring 31, the sensor portion 16 is not limited thereto and can also be constituted by a resistance bolometer element, a thermoelectric conversion element, a thermopile element, a pyroelectric element, or a ferroelectric element having a known configuration and a known structure. The p-n junction diode has a known configuration and a known structure. As will be described later, the sensor portion 16 is formed based on so-called MEMS technology. The sensor portion 16 is provided on an infrared incidence side of the first substrate 21 (a first surface 21A of the first substrate 21).

The sensor portion 16 (specifically, the p-n junction diode 30) is formed on a diaphragm portion (an overhead portion or an overhead thin layer portion) 25A constituted by an insulating material layer made of SiO$_2$. In addition, an insulating material layer 25B made of SiO$_2$ is formed on a top surface of the partition wall 23. The diaphragm portion 25A and the insulating material layer 25B are integrally formed via a first stud portion 25C (a supporting leg or an elongated beam: a similar description will apply below) and a second stud portion 25D which correspond to extended portions of the diaphragm portion 25A and the insulating material layer 25B. The void 50 is positioned below the diaphragm portion 25A, the first stud portion 25C, and the second stud portion 25D.

An end of the sensor portion 16 (the p-n junction diode 30 positioned at an end among the plurality of p-n junction diodes 30) is connected to the signal line 71 provided on the insulating material layer 25B formed on the partition wall 23 via the wiring 31 formed on the diaphragm portion 25A and the second stud portion 25D. In addition, another end of the sensor portion 16 (the p-n junction diode 30 positioned at another end among the plurality of p-n junction diodes 30) is connected to the drive line 72 formed above the partition wall 23 via the wiring 31 formed on the diaphragm portion 25A and the first stud portion 25C and, further, via a contact hole 73. The diaphragm portion 25A, the first stud portion 25C, the second stud portion 25D, the p-n junction diode 30, the wiring 31, the signal line 71, and the drive line 72 are coated by an insulating film 26 made of SiO$_2$.

The sensor portion 16 (specifically, the p-n junction diode 30) can be formed by implanting an n-type impurity and a p-type impurity into a silicon layer through, for example, ion implantation. The number of the plurality of temperature detecting elements 15 is, for example, 640×480 (VGA). The first direction and the second direction are orthogonal to each other. All of or a part of the first substrate 21 is constituted by a SOI substrate, and the second structure 40 is constituted by the second substrate 41 that is made of a silicon semiconductor substrate. The wiring 31, the signal line 71, the drive line 72, and the contact hole 73 are formed of, for example, an aluminum alloy.

An infrared absorbing layer 61 made of an aluminum thin film is formed on a side of the sensor portion 16 (the first surface 21A of the first substrate 21) to which infrared light is incident, and an infrared reflecting layer 62 made of a copper thin film is formed in a region of the coating layer 43 that is positioned in a bottom portion of the void 50. The infrared reflecting layer may be formed in a portion of the coating layer 43 that is positioned in the bottom portion of the void 50, formed in a part of the portion of the coating layer 43 that is positioned in the bottom portion of the void 50, or formed so as to protrude outside the portion of the coating layer 43 that is positioned in the bottom portion of the void 50. In the illustrated example, the infrared reflecting layer 62 is formed in a part of the portion of the coating layer 43 that is positioned in the bottom portion of the void 50. In addition, the infrared absorbing layer 61 is formed above the sensor portion 16. Specifically, the infrared absorbing layer 61 of which a part is in contact with the insulating film 26 and of which a part is separated by a gap from the insulating film 26 (in a state where a space is provided) is formed on the insulating film 26. The infrared reflecting layer 62 is formed on the top surface of the coating layer 43. In addition, when a wavelength of infrared light to be absorbed by the infrared absorbing layer 61 is denoted by $\lambda_{IR}$, an optical distance $L_0$ between the infrared absorbing layer 61 and the infrared reflecting layer 62 (a distance that takes thicknesses and refractive indices of the materials into consideration) satisfies $$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4.$$

In the first embodiment, specifically, $$L_0 = \lambda_{IR}/4$$

is satisfied. A value of $\lambda_{IR}$ ranges from 8 μm to 14 μm and, in the first embodiment, although not limited thereto, $\lambda_{IR}=10$ μm is satisfied. The wing-shaped infrared absorbing layer 61 may be partially connected between adjacent temperature detecting elements 15.

In an operation of the imaging apparatus, a single drive line 72 is selected under control of the vertical scanning circuit 81. On the other hand, a constant current is supplied to all signal lines 71 from the constant current circuit 82. In the selected temperature detecting element 15, a temperature changes depending on incident infrared light and the temperature changes causes a change in an electric resistance value of the temperature detecting element 15 (specifically, the sensor portion 16 and the p-n junction diode 30). As a result, a change occurs in voltage that appears on each signal line 71. The voltage in each signal line 71 is input to one of input portions of the differential integrator circuit that constitutes the analog front end (AFE) 83. On the other hand, reference voltage is input to the other input portion of the differential integrator circuit. In the differential integrator circuit, amplification of an output of the temperature detecting element 15 (specifically, the sensor portion 16) is performed. After a lapse of a predetermined time, an integral value of a difference in voltage from the differential integrator circuit is sent to the sample-and-hold circuit 84, an analog value held in the sample-and-hold circuit 84 is output to the analog-digital converter circuit (ADC) 85, the integral value of the difference in voltage is converted into a digital value in the analog-digital converter circuit (ADC) 85, and the digital value is sent to the horizontal scanning circuit 86. Subsequently, an operation of the horizontal scanning circuit 86 causes the digital values to be sequentially output to a signal processing circuit for each temperature detecting element and finally output as a digital output.

Hereinafter, an outline of a manufacturing method of the imaging apparatus and the temperature detecting element according to the first embodiment and, in particular, a manufacturing method of the first structure 20 will be described with reference to FIGS. 43A, 43B, 43C, 43D, 44A, 44B, 44C, 45A, 45B, 46A, and 46B which are schematic partial end views of a SOI substrate or the like.

[Step 100]

A SOI substrate 90 is prepared in which a first silicon layer 91 is formed on a surface thereof and a SiO$_2$ layer 92 is formed under the first silicon layer 91. A portion of a silicon semiconductor substrate that constitutes the SOI substrate 90 positioned under the SiO$_2$ layer 92 will be referred to as a "second silicon layer 93" for convenience's sake. In addition, first, a portion of the second silicon layer 93 of the SOI substrate 90 in which the side wall 24 of the partition wall 23 is to be formed is etched to form a groove portion and the groove portion is filled with a material to constitute the side wall 24 (refer to FIG. 43A). Subsequently, by patterning the first silicon layer 91 on the surface of the SOI substrate 90, a region of the first silicon layer 91 in which the p-n junction diode 30 is to be formed is retained. Next, based on a known method, the p-n junction diode 30 that is the sensor portion 16 is formed on the first silicon layer 91 (refer to FIG. 43B).

[Step 110]

Subsequently, based on a known method, the wiring 31 and the signal line 71 are formed on the $SiO_2$ layer 92 and on a part of the p-n junction diode 30 (refer to FIG. 43C). Next, after forming the insulating film 26 made of $SiO_2$, the contact hole 73, and the drive line 72 on an entire surface, the insulating film 26 is patterned (refer to FIG. 43D). However, the contact hole 73 and the drive line 72 are not illustrated in FIG. 43D and subsequent drawings.

[Step 120]

Subsequently, after forming a first sacrificial layer 94 (refer to FIG. 44A), forming the infrared absorbing layer 61, and forming a second sacrificial layer 95 (refer to FIG. 44B), a supporting substrate 96 is pasted to the second sacrificial layer 95 (refer to FIG. 44C).

[Step 130]

Next, the second silicon layer 93 of the SOI substrate 90 is thinned by a CMP method (refer to FIG. 45A). $L_0$ is defined by a thickness of the second silicon layer 93. Therefore, a value of $L_0$ can be accurately defined. While a structure shown in FIG. 45B can be obtained in this manner, the second silicon layer 93 in a portion inside of the side wall 24 corresponds to the partition wall 23 and, for convenience's sake, a hatching of this portion has been differentiated from a hatching of the second silicon layer 93.

[Step 140]

The base 100 provided with the first light-collecting portion 101 and the second light-collecting portion 102 is prepared. Specifically, a resist layer 201 for forming the first light-collecting portion 101 is applied to the first surface 100A of the base 100 that is made of a silicon semiconductor substrate (refer to FIG. 47A), the base 100 is developed to form an opening 203 in the resist layer 201, and a portion of the base 100 in which the first light-collecting portion 101 is to be formed is covered by the resist layer 201 (refer to FIG. 47B). A protective layer 202 for protecting a 2A-th surface 100B is formed on the second surface 100B of the base 100. Next, by performing anisotropic etching with respect to the base 100 via the opening 203, for example, after forming a first light-collecting portion precursor 101' having an inclined angle of 45 degrees (refer to FIG. 48A), the resist layer 201 is removed (refer to FIG. 48B). In addition, by performing isotropic etching with respect to the base 100, the first surface 100 of the base 100 becomes rounded as a whole and the first light-collecting portion 101 can be formed on the first surface 100A of the base 100 (refer to FIG. 48C). In a similar manner, a resist layer for forming the second light-collecting portion 102 is formed on the second surface 100B of the base 100 by a known method, and by etching back the resist layer and the base 100, the second light-collecting portion 102 can be formed on the second surface 100B of the base 100. Alternatively, the first light-collecting portion 101 and the second light-collecting portion 102 can be formed based on a nanoimprint method.

Alternatively, the first light-collecting portion 101 and the second light-collecting portion 102 can be formed based on, for example, a vapor deposition method using a different method to be described below. Specifically, a resist layer 211A for forming the first light-collecting portion 101 is applied to the first surface 100A of the base 100 that is made of a silicon semiconductor substrate, the resist layer 211A is developed to form an opening 213A in the resist layer 211A, and portions other than a portion of the base 100 in which the first light-collecting portion 101 is to be formed is covered by the resist layer 211A (refer to FIG. 49A). The protective layer 202 for protecting a 2A-th surface 100B is formed on the second surface 100B of the base 100. Next, based on a vapor deposition method, a lens material layer 101A made of silicon or the like is deposited, and by performing smoothing processing using a CMP method or the like, a structure shown in FIG. 49B can be obtained.

Subsequently, in a similar manner, a resist layer 211B is applied to an entire surface and the resist layer 211B is developed to form an opening 213B in the resist layer 211B, and portions other than a portion of the base 100 in which the first light-collecting portion 101 is to be formed is covered by the resist layer 211B (refer to FIG. 49C). Next, based on a vapor deposition method, a lens material layer 101B made of silicon or the like is deposited, and by performing smoothing processing using a CMP method or the like, a structure shown in FIG. 49D can be obtained.

Subsequently, in a similar manner, a resist layer 211C is applied to an entire surface and the resist layer 211C is developed to form an opening in the resist layer 211C, and portions other than a portion of the base 100 in which the first light-collecting portion 101 is to be formed is covered by the resist layer 211C. Next, based on a vapor deposition method, a lens material layer 101C made of silicon or the like is deposited and smoothing processing is performed using a CMP method or the like. Furthermore, a resist layer 211D is applied to an entire surface and the resist layer 211D is developed to form an opening in the resist layer 211D, and portions other than a portion of the base 100 in which the first light-collecting portion 101 is to be formed is covered by the resist layer 211D. Next, based on a vapor deposition method, a lens material layer 101D made of silicon or the like is deposited, and by performing smoothing processing using a CMP method or the like, a structure shown in FIG. 50A can be obtained. Finally, by removing the resist layer 211D, the resist layer 211C, the resist layer 211B, and the resist layer 211A, a structure shown in FIG. 50B can be obtained. The first light-collecting portion 101 has a similar configuration to a Fresnel lens in which the lens material layers 101A, 101B, 101C, and 101D are laminated, and by making steps smaller than a wavelength of infrared light, the first light-collecting portion 101 functions as a convex lens. Based on a similar method, the second light-collecting portion 102 can be formed on the second surface 100B of the base 100.

Alternatively, the first light-collecting portion 101 and the second light-collecting portion 102 can be formed using, for example, a base 100' made of germanium and a glass material based on a different method to be described below. Specific examples of the glass material include chalcogenide glass and arsenic or selenium which fuse with germanium to generate chalcogenide glass. Specifically, a resist layer 221 for forming the first light-collecting portion 101 is applied to the first surface 100A of the base 100' that is made of a germanium substrate, the resist layer 221 is developed to form an opening 223 in the resist layer 221, and portions other than a portion of the base 100' in which the first light-collecting portion 101 is to be formed is covered by the resist layer 221 (refer to FIG. 51A). The protective layer 202 for protecting a 2A-th surface 100B is formed on the second surface 100B of the base 100'. Next, based on a vapor deposition method, a glass material layer 101E is deposited, and by performing smoothing processing using a CMP method or the like, a structure shown in FIG. 51B can be obtained. Subsequently, the resist layer 221 is removed (refer to FIG. 51C), and by performing a heat treatment at a temperature at which the base 100 does not melt but the glass material fuses with germanium constituting the base 100' and vitrifies, the first light-collecting portion 101 made of chalcogenide glass that transmits infrared light can be obtained (refer to FIG. 51D). Based on a similar method, the second light-collecting portion 102 can be formed on the second surface 100B of the base 100'.

[Step 150]

The second structure 40 provided with a drive circuit is prepared. The infrared reflecting layer 62 is to be formed on the coating layer 43 in advance. In addition, the second silicon layer 93 and the coating layer 43 are joined by a known method (refer to FIG. 46A). Furthermore, in the peripheral regions 12 and 14, the drive lines 72 and the signal lines 71 are electrically connected to the drive circuit by, for example, a through-silicon via (TSV) (not illustrated).

[Step 160]

Subsequently, the supporting substrate 96 is removed, and the second sacrificial layer 95 and the first sacrificial layer 94 are removed based on an etching method (refer to FIG. 46B). Furthermore, the second silicon layer 93 that is positioned below the p-n junction diode 30 is removed based on an etching method. In addition, the first substrate 21 and the base 100 are bonded to each other. In this manner, the imaging apparatus 10 shown in FIG. 1 can be obtained. The diaphragm portion 25A, the insulating material layer 25B, the first stud portion 25C, and the second stud portion 25D are constituted by the SiO$_2$ layer 92. It should be noted that the second silicon layer 93 that is positioned below the p-n junction diode 30 need not be entirely removed.

[Step 170]

Subsequently, the obtained imaging apparatus 10 is packaged in a vacuum atmosphere. Accordingly, a space in which the temperature detecting element 15 is arranged is depressurized or vacuumized. The void 50 is also depressurized or vacuumized.

In the temperature detecting element according to the first embodiment or the various embodiments to be described later or the temperature detecting element that constitutes the imaging apparatus according to the first embodiment or the various embodiments to be described later, since the first light-collecting portion and the second light-collecting portion are provided, a large light-collecting power and high light-collecting efficiency can be obtained and the light-collecting portions can be readily machined. In addition, since at least one of the first light-collecting portion and the second light-collecting portion is provided on the base that covers the temperature detecting element, structures of the temperature detecting element and the imaging apparatus can be simplified.

In addition, in the imaging apparatus according to the first embodiment, the first substrate is joined with a coating layer formed on the second substrate, and the silicon layer that is positioned below the temperature detecting element is enclosed by the coating layer and the side wall of the partition wall which are less readily etched than the silicon layer. Therefore, a void can be provided reliably and with high accuracy between the temperature detecting element and the coating layer. As a result, for example, the infrared absorbing layer can be caused to absorb infrared light having a desired wavelength in a reliable and highly efficient manner and detection sensitivity in the temperature detecting element can be improved. In addition, since the second structure including an arbitrary known drive circuit and a signal processing circuit can be combined, a reduction in manufacturing cost, an improvement in a degree of design freedom, and a reduction in design time of the imaging apparatus can be achieved and, at the same time, a reduction in the numbers of input/output pins and a reduction in input/output signal bands can be achieved.

While the first light-collecting portion 101 and the second light-collecting portion 102 are integrally formed with the base 100 in the temperature detecting element according to the first embodiment, the first light-collecting portion 101 and the second light-collecting portion 102 are not limited thereto and may be formed of a material that differs from the base 100. Specifically, the first light-collecting portion 101 and the second light-collecting portion 102 may be formed of plastic or, more specifically, polyethylene resin.

Figure 2:
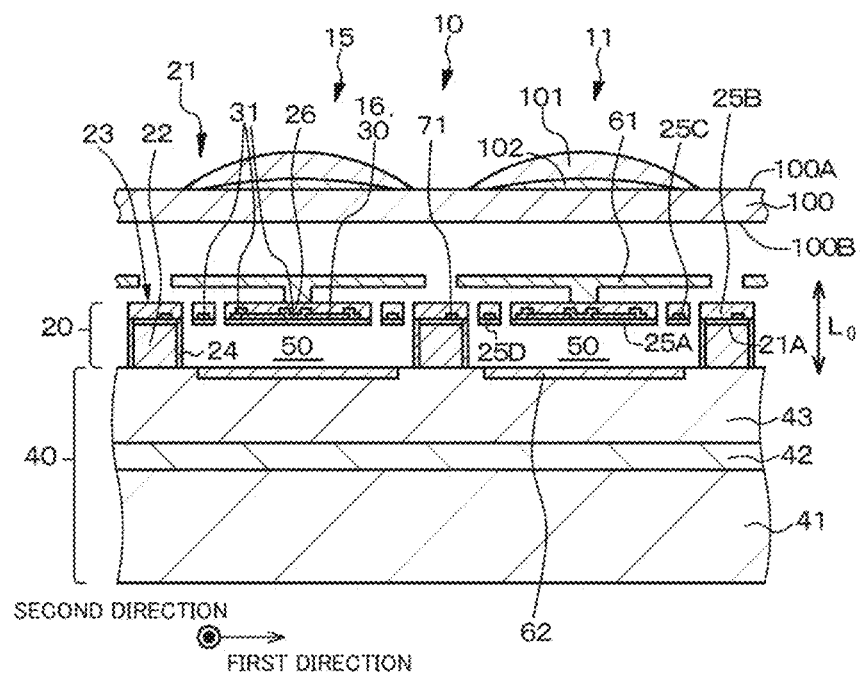
FIG. 2 is a schematic partial end view of a modification (a first modification) of the imaging apparatus according to the first embodiment.

Alternatively, while FIG. 2 shows a schematic partial end view of a modification (a first modification) of the temperature detecting element according to the first embodiment, in the first modification, the first light-collecting portion 101 and the second light-collecting portion 102 are provided on the first surface 100A of the base 100 that is an infrared incidence surface and, accordingly, a type of a convex meniscus lens is constructed. The first light-collecting portion 101 and the second light-collecting portion 102 can be constituted by, for example, monocrystalline, polycrystalline, or amorphous silicon, germanium, polyethylene resin, or chalcogenide glass. However, the material constituting the first light-collecting portion 101 and the material constituting the second light-collecting portion 102 are different materials.

The first light-collecting portion 101 and the second light-collecting portion 102 can be fabricated by a method described below. Specifically, based on a method similar to [step 140], the second light-collecting portion 102 is formed in place of the first light-collecting portion 101 on the first surface of the bases 100 and 100'. In addition, a lens material layer 101F (for example, made of germanium) for forming the first light-collecting portion 101 is formed on an entire surface (refer to FIG. 52A), a resist layer 231 is applied on an entire surface of the lens material layer 101F, the resist layer 231 is developed to form an opening 233 in the resist layer 231, and a portion of the lens material layer 101F in which the first light-collecting portion 101 is to be formed is covered by the resist layer 231 (refer to FIG. 52B). Next, after forming a first light-collecting portion precursor 101' by performing anisotropic etching with respect to the lens material layer 101F via the opening 233 (refer to FIG. 52C), the resist layer 231 is removed (refer to FIG. 53A). In addition, by performing isotropic etching with respect to the lens material layer 101F, the lens material layer 101F becomes rounded as a whole and the first light-collecting portion 101 made of the lens material layer 101F that covers the second light-collecting portion 102 can be formed on the first surface 100A of the base 100 (refer to FIG. 53B).

Alternatively, the first light-collecting portion 101 and the second light-collecting portion 102 can be fabricated by a method to be described below. Specifically, based on a method similar to [step 140], the second light-collecting portion 102 is formed in place of the first light-collecting portion 101 on the first surface of the bases 100 and 100'. On the other hand, as shown in FIG. 54A, a nanoimprint mold 240 having a shape 241 that is a reversal of a lens shape of the first light-collecting portion 101 is prepared. In addition, a molten resin 242 such as polyethylene resin is poured into the nanoimprint mold 240 and the nanoimprint mold 240 is brought into pressure contact on the second light-collecting portion 102. Furthermore, by removing a nanoimprint mold 220 after hardening the resin, the first light-collecting portion 101 is formed so as to cover the second light-collecting portion 102.

Alternatively, the first light-collecting portion 101 and the second light-collecting portion 102 can be fabricated by a method to be described below. Specifically, a structure shown in FIG. 50A is obtained based on a method similar to [step 140]. However, the second light-collecting portion 102 made of germanium is formed in place of the first light-collecting portion 101. Subsequently, a resist layer 211E and a glass material layer 101G are formed on a lens material layer 101D and a resist layer 211D by a method similar to that described with reference to FIGS. 51A and 51B (refer to FIG. 54B). In addition, by removing the resist layers 211E, 211D, 211C, 211B, and 211A and melting the glass material layer 101G, the first light-collecting portion 101 that covers the second light-collecting portion 102 can be obtained.

FIGS. 3A and 3B show schematic partial end views of a modification of the imaging apparatus according to the first embodiment shown in FIGS. 1 and 2. It should be noted that illustrations of the base 100, the first light-collecting portion 101, and the second light-collecting portion 102 are omitted in FIGS. 3A and 3B as well as FIGS. 15A, 15B, 16, 17A, 17B, 18A, 18B, 21A, 21B, 25, 34, 35A, and 35B to be described later.

In a second modification of the imaging apparatus according to the first embodiment shown in FIG. 3A, the infrared absorbing layer 61 is formed on the insulating film 26. In a third modification of the imaging apparatus according to the first embodiment shown in FIG. 3B, the infrared reflecting layer 62 is formed inside the coating layer 43. In FIG. 3B, while the infrared absorbing layer 61 is given the structure shown in FIG. 3A, alternatively, the infrared absorbing layer 61 can be structured as shown in FIG. 1. In addition, the infrared absorbing layer 61 may be formed inside the insulating film 26 and the infrared reflecting layer 62 may be formed on the top surface of the coating layer 43.

Second Embodiment

Figure 9:
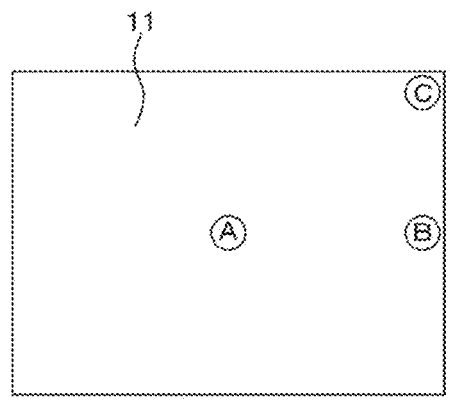
FIG. 9 is a diagram schematically showing an arrangement in a temperature detecting element array region of an imaging apparatus of the temperature detecting element according to the second embodiment shown in FIGS. 8A, 8B, and 8C.

A second embodiment is a modification of the first embodiment. FIGS. 7A, 7B, and 7C show schematic partial end views of a temperature detecting element according to the second embodiment, FIGS. 8A, 8B, and 8C schematically show an arrangement of a first light-collecting portion and a second light-collecting portion in the temperature detecting element according to the second embodiment, and FIG. 9 schematically shows an arrangement of the temperature detecting element according to the second embodiment shown in FIGS. 8A, 8B, and 8C in a temperature detecting element array region of an imaging apparatus. Furthermore, FIGS. 10A, 10B, and 10C are schematic partial end views of a modification of the temperature detecting element according to the second embodiment. In FIGS. 7A, 7B, and 7C, a region of the temperature detecting element is depicted by a dashed-dotted line, the first light-collecting portion is depicted by a solid line, and the second light-collecting portion is depicted by a dotted line.

In the temperature detecting element 15 according to the second embodiment, a mode can be adopted in which an orthogonally projected image of a center of the first light-collecting portion 101 to a sensor portion 16 (denoted by a white arrow in FIGS. 7A, 7B, 7C, 10A, 10B, and 10C), an orthogonally projected image of a center of the second light-collecting portion 102 to the sensor portion 16 (denoted by a black arrow in FIGS. 7A, 7B, 7C, 10A, 10B, and 10C), and a center of the sensor portion 16 (denoted by a "x" sign in FIGS. 7A, 7B, 7C, 10A, 10B, and 10C) are at different positions. In other words, in the temperature detecting element that is positioned in a central part A (refer to FIG. 9) of a temperature detecting element array region 11, the orthogonally projected image of the center of the first light-collecting portion 101 to the sensor portion 16, the orthogonally projected image of the center of the second light-collecting portion 102 to the sensor portion 16, and the center of the sensor portion 16 coincide with each other (refer to FIGS. 7A, 8A, and 10A). On the other hand, in the temperature detecting element that is positioned in a central part B at a right end (refer to FIG. 9) of the temperature detecting element array region 11, the orthogonally projected image of the center of the first light-collecting portion 101 to the sensor portion 16, the orthogonally projected image of the center of the second light-collecting portion 102 to the sensor portion 16, and the center of the sensor portion 16 are shifted rightward in the drawings (refer to FIGS. 7B, 8B, and 10B). Furthermore, in the temperature detecting element that is positioned in an upper part C at the right end (refer to FIG. 9) of the temperature detecting element array region 11, the orthogonally projected image of the center of the first light-collecting portion 101 to the sensor portion 16, the orthogonally projected image of the center of the second light-collecting portion 102 to the sensor portion 16, and the center of the sensor portion 16 are shifted diagonally toward upper-right in the drawings (refer to FIGS. 7C, 8C, and 10C). The greater the separation of the temperature detecting element from the center of the sensor portion 16, the greater an amount of shift. The orthogonally projected image of the center of the first light-collecting portion 101, the orthogonally projected image of the center of the second light-collecting portion 102, and the center of the sensor portion 16 are preferably positioned on a single straight line. In FIGS. 7A, 7B, 7C, 10A, 10B, and 10C, light that passes through the center of the first light-collecting portion 101, the center of the second light-collecting portion 102, and the center of the sensor portion 16 is depicted by a dashed-dotted line.

In addition, in each temperature detecting element 15, when $DT_1$ denotes a distance between an orthogonally projected image of the center of the first light-collecting portion 101 to the sensor portion 16 and the center of the sensor portion 16 and $DT_2$ denotes a distance between an orthogonally projected image of the center of the second light-collecting portion 102 to the sensor portion 16 and the center of the sensor portion 16, values of $DT_1$ and $DT_2$ differ depending on a position occupied by the temperature detecting element 15 in the temperature detecting element array region 11. In other words, the greater the separation of the temperature detecting element 15 from a center of the temperature detecting element array region 11, the longer a distance between a first axis $AX_1$ that passes through the center of the first light-collecting portion 101 to a third axis $AX_3$ that passes through the center of the sensor portion 16 and the longer a distance between a second axis $AX_2$ that passes through the center of the second light-collecting portion 102 to the third axis $AX_3$ that passes through the center of the sensor portion 16. Specifically, a mode can be adopted in which the more distant a position of the temperature detecting element 15 is from a center portion of the temperature detecting element array region 11, the larger the values of $DT_1$ and $DT_2$.

In the temperature detecting element and the imaging apparatus according to the second embodiment, by enabling infrared light to be reliably incident to the sensor portion regardless of an arranged position of the temperature detecting element in the temperature detecting element array region, an occurrence of a problem in that sensitivity of the temperature detecting element declines or becomes uneven can be prevented.

Third Embodiment

Figure 12:
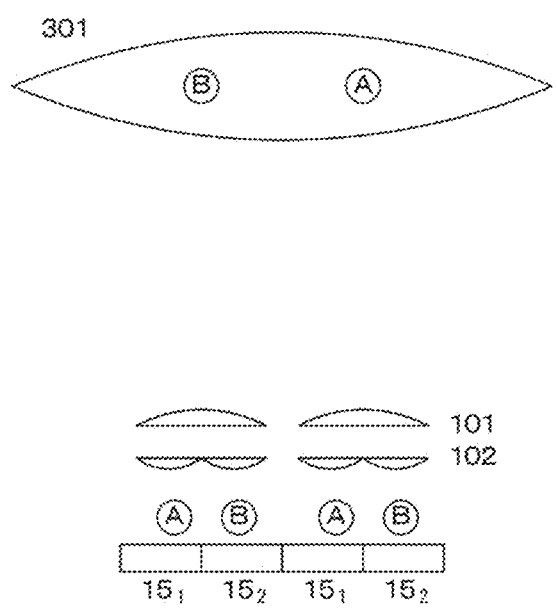
FIG. 12 is a diagram schematically showing an arrangement of an imaging lens, a first light-collecting portion, a second light-collecting portion, and a sensor portion in the temperature detecting element according to the third embodiment.

A third embodiment represents modifications of the first and second embodiments. FIGS. 11A and 11B schematically show an arrangement of a first light-collecting portion and a second light-collecting portion in a temperature detecting element according to the third embodiment and a modification thereof, and FIG. 12 schematically shows an arrangement of an imaging lens (an imaging optical system), the first light-collecting portion, the second light-collecting portion, and a sensor portion in the temperature detecting element according to the third embodiment. In FIGS. 11A and 11B, a region of a temperature detecting element block is depicted by a dashed-dotted line, the first light-collecting portion is depicted by a solid line, and the second light-collecting portion is depicted by a dotted line.

As shown in FIG. 11A, in the third embodiment, one first light-collecting portion 101 is provided so as to straddle a plurality of (specifically, two) temperature detecting elements $15_1$ and $15_2$. A group of a plurality of temperature detecting elements which a single first light-collecting portion 101 is provided to straddle will be referred to as a temperature detecting element block. A temperature detecting element block shown in FIG. 11A is constituted by two temperature detecting elements $15_1$ and $15_2$, and a temperature detecting element block shown in FIG. 11B to be described later is constituted by four temperature detecting elements $15_1$, $15_2$, $15_3$, and $15_4$. In addition, an imaging lens (an imaging optical system) 301 is provided on an infrared light incidence side of the base 100, and one first light-collecting portion 101 forms a real image in a first region (for example, a right-half region which is denoted by "A" in FIG. 12) of a pupil of the imaging lens (an exit pupil of the imaging optical system) in the second light-collecting portion 102 of one of the two temperature detecting elements (for convenience' sake, referred to as a "first temperature detecting element") $15_1$, and forms a real image in a second region (for example, a left-half region which is denoted by "B" in FIG. 12) of the pupil of the imaging lens in the second light-collecting portion 102 of the other of the two temperature detecting elements (for convenience' sake, referred to as a "first temperature detecting element") $15_2$. Furthermore, in this case, a parallax (or a deviation) exists in images obtained by the two temperature detecting elements $15_1$ and $15_2$. Moreover, two monocular parallax images can be obtained.

Alternatively, as shown in FIG. 11B, in a modification of the third embodiment, one first light-collecting portion 101 is provided so as to straddle a plurality of (specifically, four) temperature detecting elements $15_1$, $15_2$, $15_3$, and $15_5$. In addition, one first light-collecting portion 101 forms a real image in a first region (for example, a region of a first quadrant) of a pupil of the imaging lens (an exit pupil of the imaging optical system) in the second light-collecting portion 102 of a first temperature detecting element $15_1$ among the four temperature detecting elements, forms a real image in a second region (for example, a region of a second quadrant) of the pupil of the imaging lens in the second light-collecting portion 102 of a second temperature detecting element $15_2$ among the four temperature detecting elements, forms a real image in a third region (for example, a region of a third quadrant) of the pupil of the imaging lens in the second light-collecting portion 102 of a third temperature detecting element $15_3$ among the four temperature detecting elements, and forms a real image in a fourth region (for example, a region of a fourth quadrant) of the pupil of the imaging lens in the second light-collecting portion 102 of a fourth temperature detecting element $15_4$ among the four temperature detecting elements. Furthermore, in this case, a parallax (or a deviation) exists in images obtained by the four temperature detecting elements $15_1$, $15_2$, $15_3$, and $15_4$. Moreover, four monocular parallax images can be obtained.

The configurations described above can be applied to autofocusing means using a parallax (or a deviation of an image), focus deviation detecting means using a parallax (or a deviation of an image), vehicular collision avoiding means using a parallax (or a deviation of an image), a display apparatus or goggles that enables binocular stereoscopic viewing of a thermal image (an image obtained by an imaging apparatus according to the third embodiment) using a parallax, a head-mounted display (for example, goggles for firefighters), and the like.

Fourth Embodiment

Figure 13:
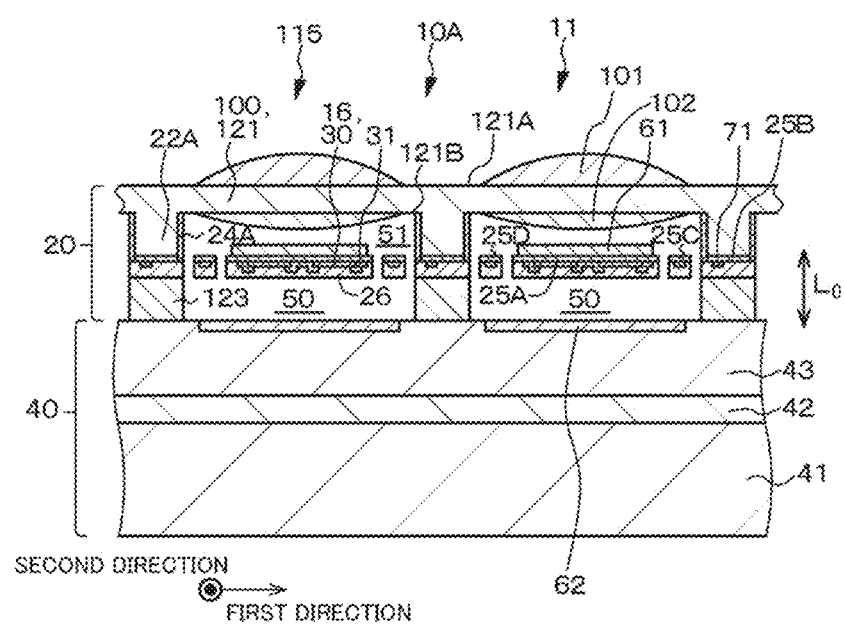
FIG. 13 is a schematic partial end view of an imaging apparatus according to a fourth embodiment.

A fourth embodiment is a modification of the first to fourth embodiments and relates to an imaging apparatus with a face-to-face structure. FIG. 13 shows a schematic partial end view of an imaging apparatus according to the fourth embodiment.

In an imaging apparatus 10A according to the fourth embodiment, a partition wall 123 is formed independent of a first substrate 121 between a portion of the first substrate 121 that is positioned between a temperature detecting element 115 and another temperature detecting element 115 and a coating layer 43, and a bottom portion of the partition wall 123 is joined to the coating layer 43. An exposed surface of the coating layer 43 that is exposed to a void 50 is constituted by at least one type of material layer selected from a group consisting of an insulating material layer, a metal material layer, an alloy material layer, and a carbon material layer. Specifically, in the imaging apparatus 10A according to the fourth embodiment, an exposed surface of the coating layer 43 that is exposed to the void 50 is made of $SiO_2$. In addition, the partition wall 123 is constituted by at least one type of material layer selected from a group consisting of an insulating material layer, a metal material layer, an alloy material layer, and a carbon material layer. Specifically, the partition wall 123 is made of $SiO_2$. A reference numeral 22A denotes a convex portion that extends from a silicon layer to be described later, and a reference numeral 24A denotes a side wall of the convex portion 22A.

In the imaging apparatus according to the fourth embodiment having a face-to-face structure, a base 100 may be constituted by a first substrate 21 as illustrated or a mode may be adopted in which the base 100 differs from the first substrate 21 such as a mode in which the base 100 is made of a sealing member or a protective member (a protective substrate) and, in this case, the first substrate 21 and the base 100 may be bonded to each other. A first light-collecting portion 101 is provided on a first surface 121A of the first substrate 121 that corresponds to a first surface of the base 100 and a second light-collecting portion 102 is provided on a second surface 121B of the first substrate 121 that corresponds to a second surface of the base 100. Even in the temperature detecting element according to the fourth embodiment, while the first light-collecting portion 101 and the second light-collecting portion 102 are integrally formed with the base 100 (the first substrate 121), the first light-collecting portion 101 and the second light-collecting portion 102 are not limited thereto and may be formed of a material that differs from the base 100 (the first substrate 121). Specifically, the first light-collecting portion 101 and the second light-collecting portion 102 may be formed of plastic or, more specifically, polyethylene.

An infrared absorbing layer 61 made of an aluminum thin film is formed on a side of the sensor portion 16 to which infrared light is incident (in other words, the infrared absorbing layer 61 is provided on an infrared incidence side of a diaphragm portion 25A), and an infrared reflecting layer 62 made of a copper thin film is formed in a region of the coating layer 43 that is positioned in a bottom portion of the void 50. The infrared reflecting layer 62 is formed on a top surface of the coating layer 43 or formed inside the coating layer 43. It should be noted that the infrared reflecting layer 62 may be formed in a portion of the coating layer 43 that is positioned in the bottom portion of the void 50, formed in a part of the portion of the coating layer 43 that is positioned in the bottom portion of the void 50, or formed so as to protrude outside the portion of the coating layer 43 that is positioned in the bottom portion of the void 50. Specifically, the infrared reflecting layer 62 has a similar configuration and a similar structure to those of the first embodiment. In the illustrated example, the infrared reflecting layer 62 is formed in a part of the portion of the coating layer 43 that is positioned in the bottom portion of the void 50. Even in the fourth embodiment, when a wavelength of infrared light to be absorbed by the infrared absorbing layer 61 is denoted by $\lambda_{IR}$, an optical distance $L_0$ between the infrared absorbing layer 61 and the infrared reflecting layer 62 satisfies $$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4.$$

In some cases, the infrared absorbing layer 61 may be formed on a side of the sensor portion 16 that opposes the void 50.

Hereinafter, an outline of a manufacturing method of the imaging apparatus and the temperature detecting element according to the fourth embodiment and, in particular, a manufacturing method of the first structure 20 will be described with reference to FIGS. 55A, 55B, 55C, 56A, 56B, 56C, and 56D which are schematic partial end views of a SOI substrate or the like.

[Step 400]

First, a SOI substrate 90 is prepared in a similar manner to the first embodiment. Next, after forming a concave portion in the SOI substrate 90 from a side of a first silicon layer, the concave portion is filled with, for example, an insulating material to form a side wall 24A of the convex portion 22A (refer to FIG. 55A). Subsequently, by patterning the first silicon layer 91 on the surface of the SOI substrate 90, a region of the first silicon layer 91 in which the p-n junction diode 30 is to be formed is retained. Next, based on a known method, the p-n junction diode 30 to constitute the sensor portion 16 is formed on the first silicon layer 91 (refer to FIG. 55B).

[Step 410]

Subsequently, in a similar manner to [step 110] in the first embodiment, based on a known method, a wiring 31 and a signal line 71 are formed on the $SiO_2$ layer 92 and on a part of the p-n junction diode 30. Next, after forming an insulating film 26 made of $SiO_2$, a contact hole 73, and a drive line 72 on an entire surface, the insulating film 26 is patterned (refer to FIG. 55C). However, the contact hole 73 and the drive line 72 are not illustrated in FIG. 55C and subsequent drawings.

[Step 420]

Subsequently, a sacrificial layer 97 made of an insulating material is formed on an entire surface (refer to FIG. 56A), a portion of the sacrificial layer 97 in which a partition wall 123 is to be formed is etched to form a groove portion, and the groove portion is filled with a material to constitute the partition wall 123 to obtain the partition wall 123 (refer to FIG. 56B). $L_0$ is defined by a thickness of the sacrificial layer 97. Therefore, a value of $L_0$ can be accurately defined. Furthermore, an etching mask layer (not illustrated) is formed on the sacrificial layer 97 in portion where the partition wall 123 is to be formed.

[Step 430]

Next, the sacrificial layer 97 is removed based on an etching method (refer to FIG. 56C) and, further, by changing an etchant and removing a part of a second silicon layer 93 based on an etching method (refer to FIG. 56D), a cavity 51 is provided between the diaphragm portion 25A and the second silicon layer. Subsequently, the etching mask layer having been formed on the partition wall 123 is removed. It should be noted that a sectional shape of the cavity 51 is not limited to the illustrated shape.

In this step, the cavity 51 can be provided between the diaphragm portion 25A and the second silicon layer and, at the same time, the second light-collecting portion 102 can be formed on a second surface of the first substrate 121. Specifically, while an etchant (an etching gas or an etching liquid) penetrates into the second silicon layer 93 from a vicinity of the partition wall 123 when removing a part of the second silicon layer 93 based on an etching method, by appropriately setting etching conditions, a larger amount of a portion of the second silicon layer 93 in the vicinity of the partition wall 123 can be etched as compared to a portion of the second silicon layer 93 that is distant from the partition wall 123. As a result, the second light-collecting portion 102 can be provided on a side of the second surface 121B of the first substrate 121 (which is the second silicon layer 93 and which corresponds to the base 100).

[Step 440]

The second structure 40 provided with a drive circuit is prepared. The infrared reflecting layer 62 is to be formed on the coating layer 43 in advance. In addition, the partition wall 123 and the coating layer 43 are bonded to each other in a vacuum atmosphere using a known method. Next, in the peripheral regions 12 and 14, the drive lines 72 and the signal lines 71 are electrically connected to the drive circuit by, for example, a through-silicon via (TSV) (not illustrated). In addition, the first light-collecting portion 101 is provided on the first surface 121A of the first substrate 121. In this manner, the imaging apparatus 10A shown in FIG. 13 can be obtained. Subsequently, the obtained imaging apparatus 10 is packaged.

Figure 14:
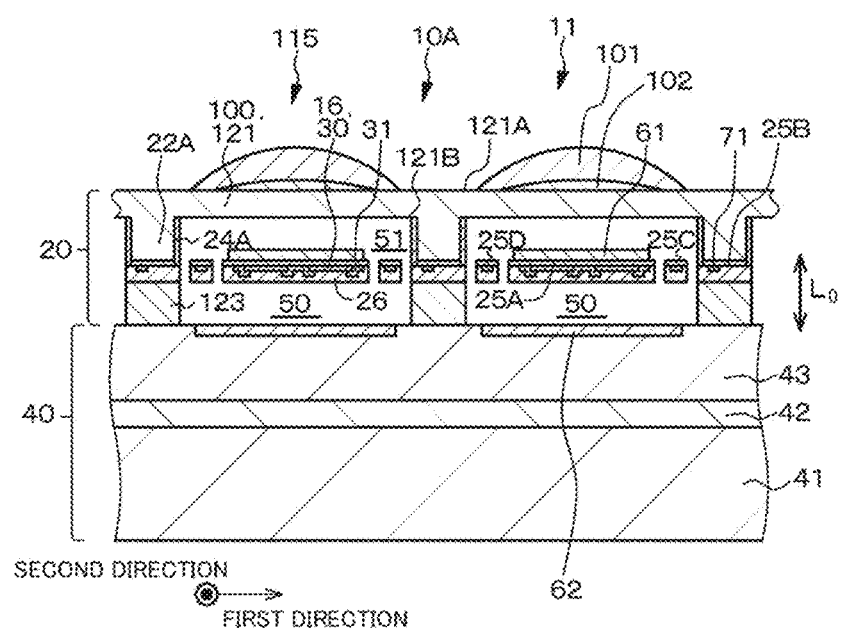
FIG. 14 is a schematic partial end view of a modification (a first modification) of the imaging apparatus according to the fourth embodiment.

While FIG. 14 shows a schematic partial end view of a modification (a first modification) of the temperature detecting element according to the fourth embodiment, in the first modification of the fourth embodiment, the first light-collecting portion 101 and the second light-collecting portion 102 are provided on the first surface 100A of the base 100 that is an infrared incidence surface in a similar manner to the first modification of the first embodiment and, accordingly, a type of a convex meniscus lens is constructed.

As shown in the schematic partial end view in FIG. 15A of a modification (a second modification) of the imaging apparatus according to the fourth embodiment, the infrared absorbing layer 61 may be provided on the second surface 121B of the first substrate 121. Alternatively, as shown in the schematic partial end view in FIG. 15B of a modification (a third modification) of the imaging apparatus according to the fourth embodiment, the infrared absorbing layer 61 may be provided inside the first substrate 121. In this case, the first light-collecting portion 101 and the second light-collecting portion 102 may be provided on the first surface 100A of the base 100 that is an infrared incidence surface or, alternatively, the base 100 may be constituted by a sealing member or a protective member (a protective substrate) separately from the first substrate 121 and the base 100 and the first substrate 121 may be bonded to each other.

Figure 16:
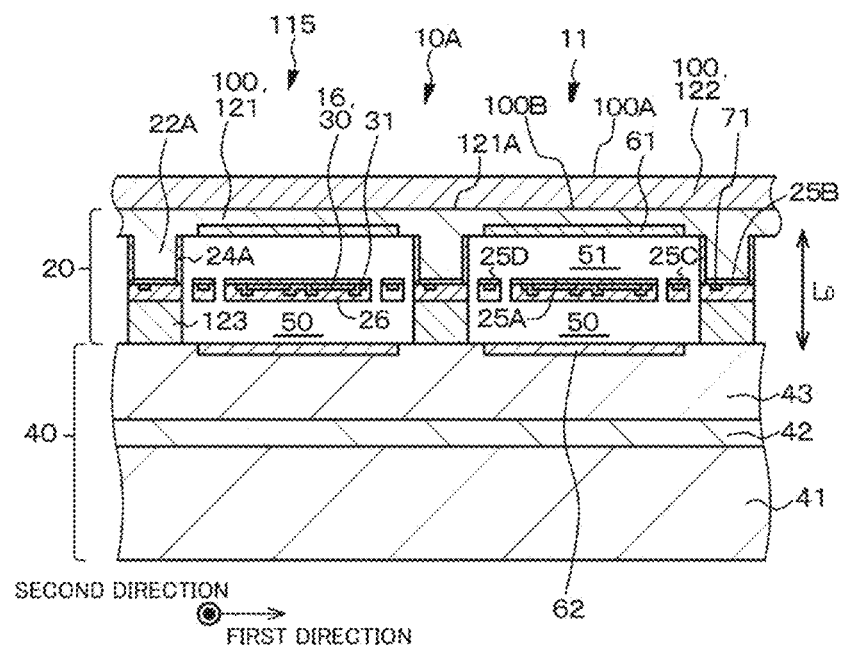
FIG. 16 is a schematic partial end view of yet another modification (a fourth modification) of the imaging apparatus according to the fourth embodiment.

In addition, as shown in the schematic partial end view in FIG. 16 of the modification (the third modification) of the imaging apparatus according to the fourth embodiment, a protective member (a protective substrate) 122 (which corresponds to the base 100) made of a silicon semiconductor substrate may be attached to a surface of the first substrate 121 to which infrared light is incident (the first surface 121A of the first substrate 121). The first light-collecting portion and the second light-collecting portion (not illustrated) may be provided on an infrared incidence surface of the protective member 122 (the base 100). The protective member 122 may be constituted by a silicon semiconductor substrate provided with a drive circuit in a peripheral region thereof, the protective member 122 and the first substrate 121 may be bonded to each other and, in the peripheral region 12, a drive circuit provided in the peripheral region of the protective member 122 and the drive line 72 and the signal line 71 may be electrically connected by, for example, a through-silicon via (TSV). In this case, the second structure 40 need not always be provided with a drive circuit.

Fifth Embodiment

A fifth embodiment represents modifications of the first to fourth embodiments. In the fifth embodiment, as shown in the schematic partial end views in FIG. 17A (a modification of the first embodiment) and FIG. 17B (a modification of the fourth embodiment), a thermally conductive layer (a heat-homogenizing layer) 63 made of a metal material, a carbon-based material such as a carbon film or a carbon nanotube, or an organic material is formed in the coating layer 43. Specifically, the thermally conductive layer 63 is arranged inside the coating layer 43 and below the infrared reflecting layer 62. Forming the thermally conductive layer 63 enables further homogenization of temperature and further homogenization of a temperature distribution to be achieved. In some cases, the thermally conductive layer (the heat-homogenizing layer) 63 can be constituted by a vacuum layer. In addition, a configuration of the thermally conductive layer (the heat-homogenizing layer) 63 may be changed depending on a region of the temperature detecting element array region 11.

Since a configuration and a structure of the imaging apparatus according to the fifth embodiment can be made similar to the configurations and the structures of the imaging apparatuses according to the first to fourth embodiments with the exception of the points described above, a detailed description will be omitted. The thermally conductive layer (the heat-homogenizing layer) can also be applied to imaging apparatuses other than the imaging apparatuses according to the first to fourth embodiments (for example, imaging apparatuses that perform imaging based on visible light).

Sixth Embodiment

A sixth embodiment represents modifications of the first to fifth embodiments. In the sixth embodiment, as shown in schematic partial end views in FIG. 18A (a modification of the first embodiment) and FIG. 18B (a modification of the fourth embodiment), a temperature control layer 64 made of tungsten (W) is formed in the coating layer 43 (specifically, inside the coating layer 43) and temperature detecting means (not illustrated) made of a silicon diode is provided on the coating layer 43. The temperature control layer 64 functions as a heater (a resistor or a resistance member). A configuration can be adopted in which the temperature control layer doubles as wiring. In addition, the drive circuit controls the temperature control layer 64 based on a temperature detection result of the temperature detecting means. Specifically, for example, an amount of heat generation of the temperature control layer 64 is controlled by controlling a current supplied to the temperature control layer 64. It should be noted that illustration of a wiring that connects the temperature control layer 64 and a control circuit to each other in order to control the temperature control layer 64 has been omitted.

Specifically, the drive circuit (specifically, a CPU or a DSP) having received a temperature detection result of the temperature detecting means obtains a temperature distribution of the coating layer 43 based on the received temperature detection result. In addition, by calculating an amount of heat considered necessary and individually controlling a value of a current to be supplied to the temperature control layer 64, the drive circuit performs homogenization of a temperature and homogenization of a temperature distribution (suppression of an occurrence of an in-plane temperature variation) of the coating layer 43 and, further, homogenization of a temperature and homogenization of a temperature distribution of the first substrates 21 and 121, and homogenization of a temperature and homogenization of a temperature distribution of the temperature detecting element 15 (specifically, the sensor portion 16). Therefore, for example, even when a current amount of an analog logic block changes and an amount of heat generation in the analog logic block changes, temperature control can be readily performed. When a range of temperature control by the temperature control layer 64 is exceeded, by performing control of a current amount in the analog logic block and control of an operation clock in the analog logic block, homogenization of a temperature and homogenization of a temperature distribution can be performed. It should be noted that homogenization of a temperature and homogenization of a temperature distribution can also be performed without providing the temperature control layer 64 by having the drive circuit perform control of a current amount in the analog logic block and control of an operation clock in the analog logic block. By setting a temperature to be controlled by the temperature control layer 64 higher than, for example, room temperature, the temperature control layer 64 can perform a type of on/off operation and power consumption by the temperature control layer 64 can be reduced. In addition, combining the temperature control layer 64 with the thermally conductive layer 63 described in the fifth embodiment enables further homogenization of temperature and further homogenization of a temperature distribution to be achieved. In this case, the thermally conductive layer 63 is preferably arranged above the temperature control layer 64. In some cases, the temperature control layer 64 may double as the infrared reflecting layer 62.

Figure 19:
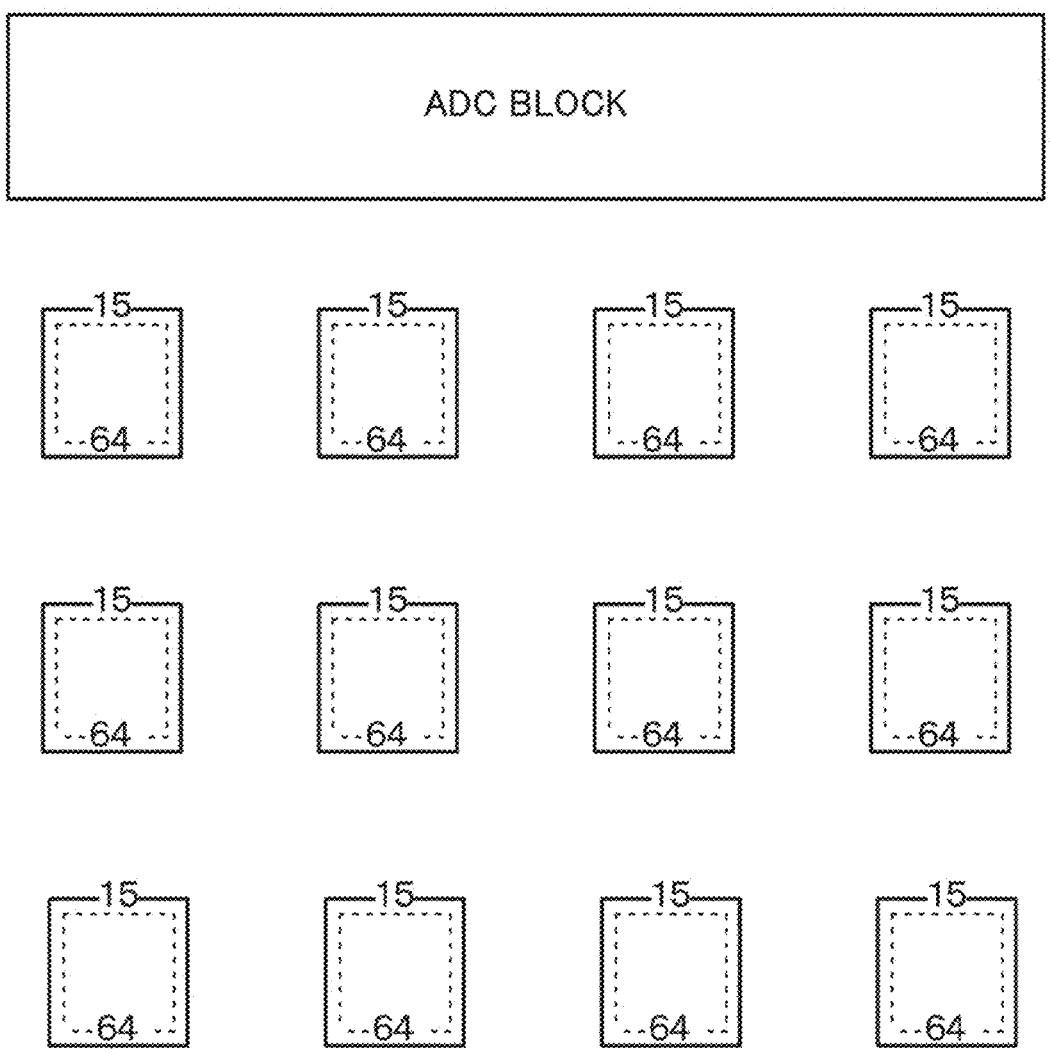
FIG. 19 is a diagram schematically showing an arranged state of a temperature detecting element and a temperature control layer in the imaging apparatus according to the sixth embodiment.
Figure 20:
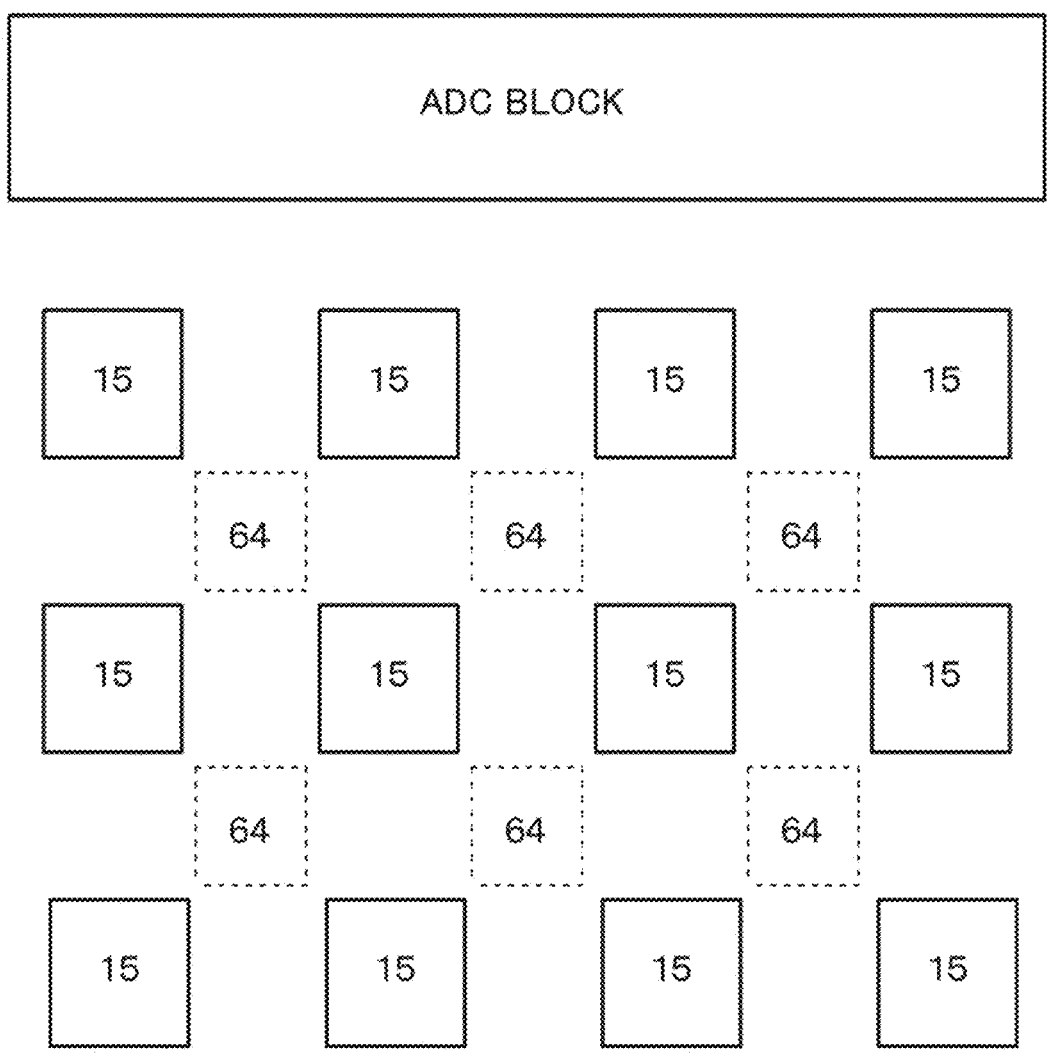
FIG. 20 is a diagram schematically showing an arranged state of a temperature detecting element and a temperature control layer in another modification of the imaging apparatus according to the sixth embodiment.

While an arranged state of the temperature detecting element 15 and the temperature control layer 64 is schematically exemplified in FIGS. 19 and 20, an orthogonally projected image of the temperature detecting element 15 and an orthogonally projected image of the temperature control layer 64 may overlap with each other (refer to FIG. 19) or an arrangement can be adopted in which the orthogonally projected image of the temperature control layer 64 is positioned between an orthogonally projected image of one temperature detecting element 15 and an orthogonally projected image of another temperature detecting element 15 (refer to FIG. 20). An area, an arranged position, and an arranged density of the temperature control layer 64 need only be an area, an arranged position, and an arranged density that enable homogenization of temperature and homogenization of a temperature distribution to be achieved. Since the temperature control layer 64 is positioned below the temperature detecting element 15, the temperature control layer 64 has been depicted by a dotted line in FIGS. 19 and 20.

In this case, a configuration is preferably adopted in which the first structure 20 includes a temperature detecting element array region 11 including a plurality of temperature detecting elements 15 and a peripheral region 12 that encloses the temperature detecting element array region 11, and the temperature control layer 64 is formed in the temperature detecting element array region 11. Alternatively, the temperature control layer 64 is preferably formed in a region of the coating layer 43 in which an orthogonally projected image of the temperature detecting element array region 11 exists. Alternatively, a configuration is preferably adopted in which the drive circuit includes an analog-digital converter circuit (ADC) and the analog-digital converter circuit is not arranged in a region of the second substrate 41 (a drive substrate) in which an orthogonally projected image of the temperature detecting element array region 11 exists.

Since a configuration and a structure of the imaging apparatus according to the sixth embodiment can be made similar to the configurations and the structures of the imaging apparatuses according to the first to fifth embodiments with the exception of the points described above, a detailed description will be omitted. The temperature control layer can also be applied to imaging apparatuses other than the imaging apparatuses according to the first to fifth embodiments (for example, imaging apparatuses that perform imaging based on visible light).

Seventh Embodiment

A seventh embodiment relates to imaging apparatuses according to the second and third aspects of the present disclosure.

Figure 23:
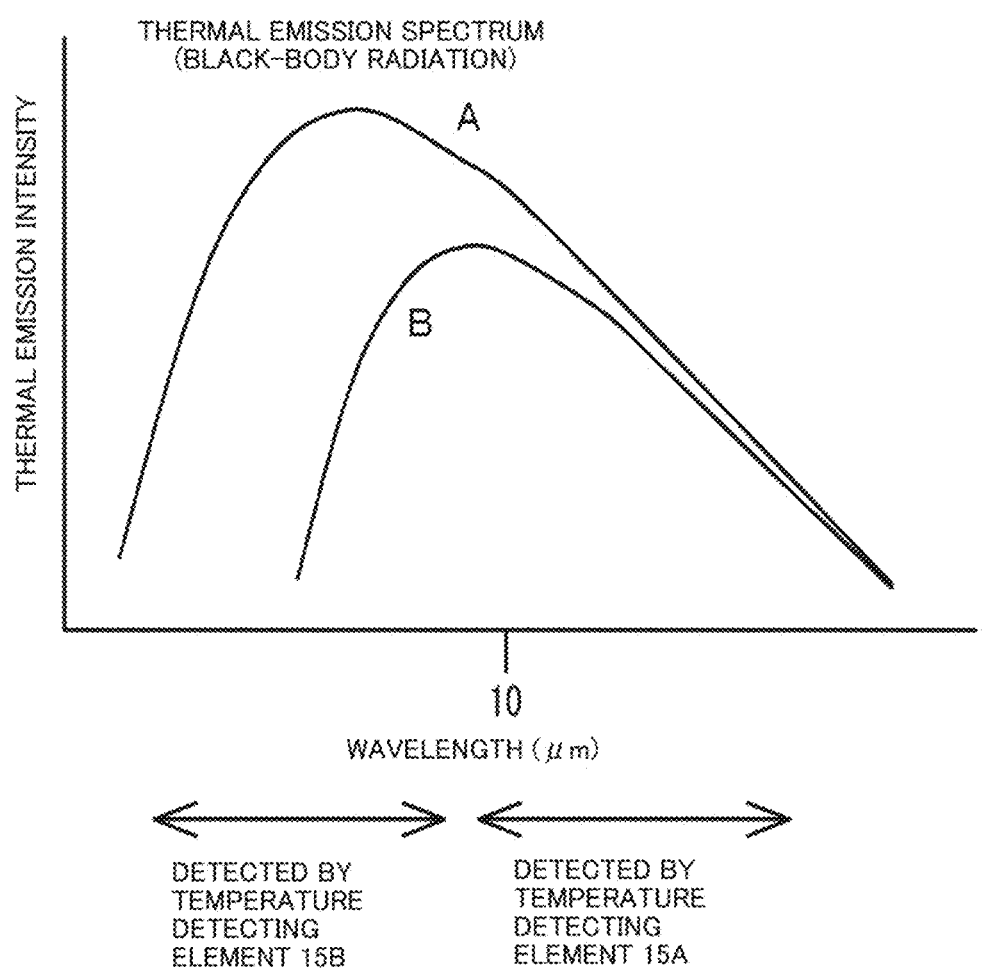
FIG. 23 is a graph schematically showing a relationship between an emission spectrum and an infrared wavelength from an object.

An emission spectrum from an object at a temperature near room temperature has a peak near a wavelength of 10 μm (refer to an emission spectrum "B" in FIG. 23). An emission spectrum "A" in FIG. 23 represents an emission spectrum from an object at a higher temperature than room temperature. In addition, for example, by combining a temperature detecting element 15A having a sensitivity wavelength that is shorter than the peak wavelength and a temperature detecting element 15B having a sensitivity wavelength that is longer than the peak wavelength with each other in a same pixel, a temperature of an object can be measured with high accuracy based on a ratio of intensity of signals from the two temperature detecting elements 15A and 15B.

In the imaging apparatus according to the seventh embodiment, the imaging apparatus includes
a temperature detecting element unit configured to detect a temperature based on infrared light,
the temperature detecting element unit is made up of a plurality of juxtaposed temperature detecting elements 15A and 15B, and
wavelengths of infrared light to be detected by the respective temperature detecting elements 15A and 15B differ from each other in the temperature detecting element unit. In the seventh embodiment, a plurality of the temperature detecting element units are arranged in a first direction and a second direction that differs from the first direction (specifically, in a two-dimensional matrix pattern).

In addition, in the imaging apparatus according to the seventh embodiment, the respective temperature detecting elements 15A and 15B include infrared absorbing layers 61, 61A, and 61B on an infrared incidence side and infrared reflecting layers 62, 62A, and 62B on an opposite side to the infrared incidence side and,
in the temperature detecting element unit, optical distances $L_0$ and $L_0'$ between the infrared absorbing layers 61, 61A, and 61B and the infrared reflecting layers 62, 62A, and 62B among the respective temperature detecting elements 15A and 15B differ from each other, and
when wavelengths of infrared light to be absorbed by the infrared absorbing layers 61, 61A, and 61B that constitute the temperature detecting elements 15A and 15B in the respective temperature detecting elements 15A and 15B are denoted by $\lambda_{IR-A}$ and $\lambda_{IR-B}$, the optical distance $L_0$ satisfies $$0.75 \times \lambda_{IR-A}/2 \leq L_0 \leq 1.25 \times \lambda_{IR-A}/2$$

or $$0.75 \times \lambda_{IR-A}/4 \leq L_0 \leq 1.25 \times \lambda_{IR-A}/4 \text{ and}$$

the optical distance $L_0'$ satisfies $$0.75 \times \lambda_{IR-B}/2 \leq L_0' \leq 1.25 \times \lambda_{IR-B}/2$$

or $$0.75 \times \lambda_{IR-B}/4 \leq L_0' \leq 1.25 \times \lambda_{IR-B}/4.$$

In addition, the respective temperature detecting elements 15A and 15B have infrared absorbing layers 61, 61A, and 61B on an infrared incidence side and have infrared reflecting layers 62, 62A, and 62B on an opposite side to the infrared incidence side and,
in the temperature detecting element unit, a material, a configuration, or a structure that constitutes the infrared absorbing layers 61, 61A, and 61B, a material, a configuration, or a structure that constitutes the infrared reflecting layers 62, 62A, and 62B, or a material, a configuration, or a structure that constitutes the infrared absorbing layers 61, 61A, and 61B and a material, a configuration, or a structure that constitutes the infrared reflecting layers 62, 62A, and 62B differs among the respective temperature detecting elements 15A and 15B. In other words, specifically, the description provided in (case A), (case B), and (case C) presented earlier will apply.

Alternatively, the imaging apparatus according to the seventh embodiment includes a temperature detecting element unit configured to detect a temperature based on infrared light, the temperature detecting element unit is made up of a plurality of juxtaposed temperature detecting elements 15A and 15B, and amounts of infrared absorption by the respective temperature detecting elements 15A and 15B differ from each other in the temperature detecting element unit. Even in the seventh embodiment, a plurality of the temperature detecting element units are arranged in a first direction and a second direction that differs from the first direction (specifically, in a two-dimensional matrix pattern).

In addition, in the imaging apparatus according to the seventh embodiment, the respective temperature detecting elements 15A and 15B have infrared absorbing layers 61, 61A, and 61B on an infrared incidence side and have infrared reflecting layers 62, 62A, and 62B on an opposite side to the infrared incidence side and, in the temperature detecting element unit, a material that constitutes the infrared absorbing layers 61, 61A, and 61B, a material that constitutes the infrared reflecting layers 62, 62A, and 62B, or a material that constitutes the infrared absorbing layers 61, 61A, and 61B and a material that constitutes the infrared reflecting layers 62, 62A, and 62B differs among the respective temperature detecting elements 15. Furthermore, in the imaging apparatus according to the seventh embodiment, the respective temperature detecting elements 15A and 15B have infrared absorbing layers 61, 61A, and 61B on an infrared incidence side and have infrared reflecting layers 62, 62A, and 62B on an opposite side to the infrared incidence side and, in the temperature detecting element unit, an area, a thickness, or an area and a thickness of the infrared absorbing layers 61, 61A, and 61B, the infrared reflecting layers 62, 62A, and 62B, or the infrared absorbing layers 61, 61A, and 61B and the infrared reflecting layers 62, 62A, and 62B differs among the respective temperature detecting elements 15. In other words, specifically, the description provided in (case a), (case b), (case c), (case d), (case e), (case f), (case g), (case h), and (case i) presented earlier will apply.

More specifically, as shown in the schematic partial end view in FIG. 21A, structures of infrared absorbing layers 61A and 61B in the temperature detecting element 15A and the temperature detecting element 15B differ from each other. Accordingly, values of $L_0$ and $L_0'$ in the temperature detecting elements 15A and 15B can be changed and, in turn, wavelengths of infrared light to be detected by the respective temperature detecting elements 15A and 15B can be differentiated and amounts of infrared absorption by the respective temperature detecting elements 15A and 15B can be differentiated.

Alternatively, as shown in the schematic partial end view in FIG. 21B, while the infrared absorbing layers 61A and 61B in the temperature detecting element 15A and the temperature detecting element 15B share a same structure, positions where the infrared absorbing layers 61A and 61B are formed differ from each other. Accordingly, values of $L_0$ and $L_0'$ in the temperature detecting elements 15A and 15B can be changed and, in turn, wavelengths of infrared light to be detected by the respective temperature detecting elements 15A and 15B can be differentiated.

FIG. 22A exemplifies an arrangement of two types of temperature detecting elements, namely, the temperature detecting element 15A and the temperature detecting element 15B when a temperature detecting element unit is constituted by the temperature detecting element 15A and the temperature detecting element 15B. A temperature detecting element unit constituted by four temperature detecting elements 15A and 15B that constitute a single pixel is shown enclosed by a dotted line. It should be noted that a temperature detecting element unit can also be constituted by two temperature detecting elements 15A and 15B. In addition, FIG. 22B exemplifies an arrangement of three types of temperature detecting elements, namely, the temperature detecting element 15A, the temperature detecting element 15B, and the temperature detecting element 15C when a temperature detecting element unit is constituted by the temperature detecting element 15A, the temperature detecting element 15B, and the temperature detecting element 15C. A temperature detecting element corresponding to an infrared wavelength that requires high spatial resolution may be designated the temperature detecting element 15A.

In the imaging apparatus according to the seventh embodiment, since the temperature detecting element unit is made up of a plurality of juxtaposed temperature detecting elements and wavelengths of infrared light to be detected by the respective temperature detecting elements differ from each other in the temperature detecting element unit or amounts of infrared absorption by the respective temperature detecting elements differ from each other in the temperature detecting element unit, wavelength spectral characteristics or sensitivity to infrared light can be changed for each temperature detecting element. In addition, by combining temperature detecting elements having different sensitivity wavelengths in a same pixel, a temperature of an object can be measured with high accuracy based on a ratio of intensity of signals from the plurality of temperature detecting elements. Alternatively, by constructing a temperature detecting element unit that combines a high-sensitivity temperature detecting element and a low-sensitivity temperature detecting element with each other, a dynamic range as a temperature detecting element unit can be changed. In other words, the low-sensitivity temperature detecting element may be operated when infrared intensity is high and the high-sensitivity temperature detecting element may be operated when infrared intensity is low. Alternatively, a switch may be made from the high-sensitivity temperature detecting element to the low-sensitivity temperature detecting element when a subject (or an environment) changes from a state where infrared intensity is low to a state where infrared intensity is high and a switch may be made from the low-sensitivity temperature detecting element to the high-sensitivity temperature detecting element when a subject (or an environment) changes from a state where infrared intensity is high to a state where infrared intensity is low.

While the configuration and the structure of the temperature detecting element described in the first embodiment have been adopted as the configuration and the structure of the temperature detecting elements 15A and 15B shown in FIGS. 21A and 21B, the configuration and the structure of the imaging apparatus according to the seventh embodiment are not limited thereto and may be similar to the configurations and the structures of the imaging apparatuses described in the first to sixth embodiments. Alternatively, as long as a temperature detecting element unit is made up of a plurality of juxtaposed temperature detecting elements and wavelengths of infrared light to be detected by the respective temperature detecting elements differ from each other in the temperature detecting element unit or amounts of infrared absorption by the respective temperature detecting elements differ from each other in the temperature detecting element unit, the configuration and the structure of the imaging apparatus according to the seventh embodiment are not limited to the configurations and the structures of the imaging apparatuses described in the first to sixth embodiments and can also be applied to imaging apparatuses with other configurations and structures.

Eighth Embodiment

An eighth embodiment relates to an imaging apparatus according to the fourth aspect of the present disclosure.

As described earlier, when a differential integrator circuit is arranged on a signal line to which is connected a plurality of temperature detecting elements arranged along a second direction, there may be cases where time considered necessary for integrating signals output from the temperature detecting elements by the differential integrator circuit is insufficient.

Figure 24:
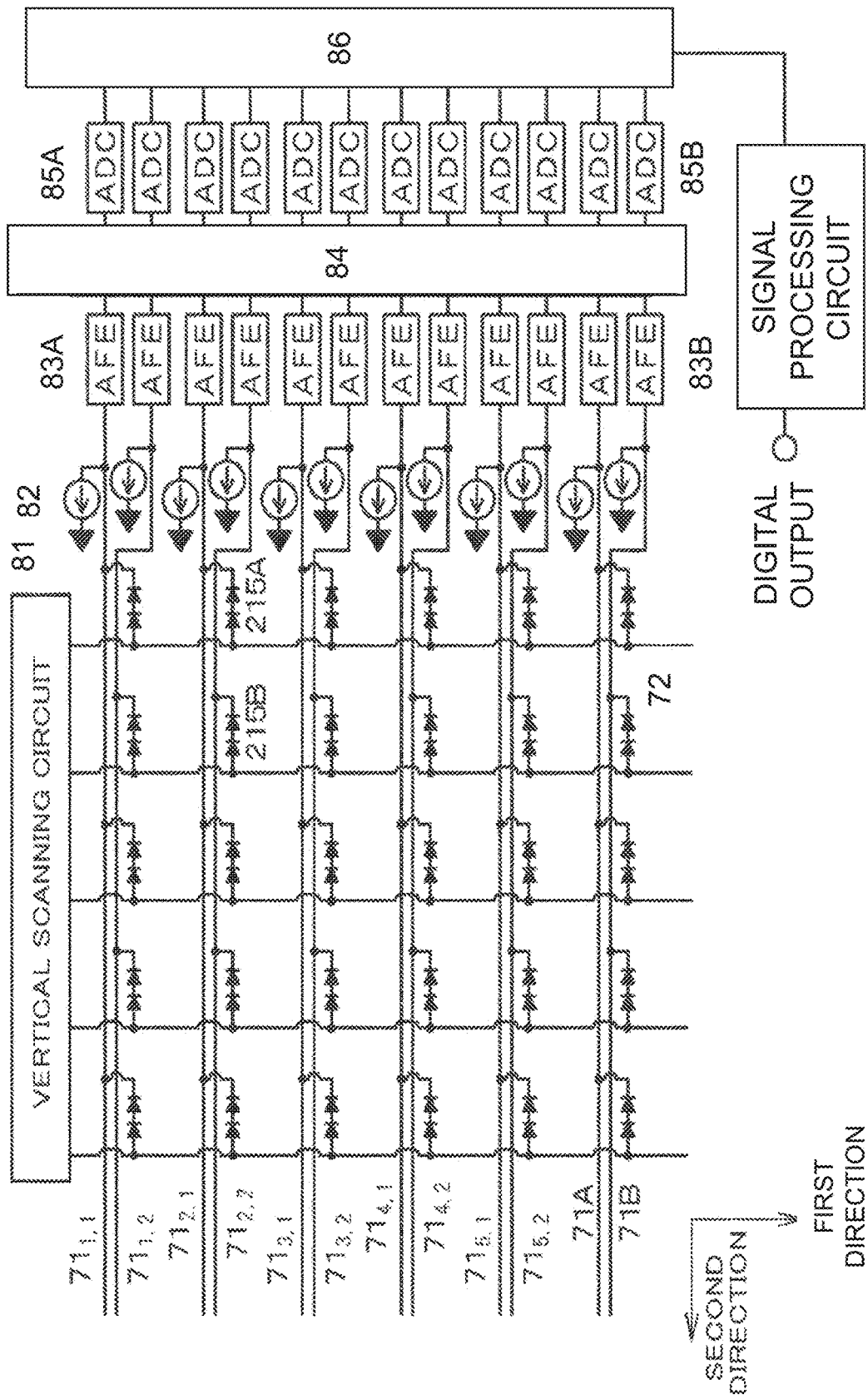
FIG. 24 is an equivalent circuit diagram of an imaging apparatus according to an eighth embodiment.

In order to solve such problems, as shown in the equivalent circuit diagram in FIG. 24, the imaging apparatus according to the eighth embodiment includes: $M_0 \times N_0$ (where $M_0 \geq 2$, $N_0 \geq 2$) number of temperature detecting elements 15 which are arranged in a first direction and a second direction that differs from the first direction (specifically, in a two-dimensional matrix pattern) and which are configured to detect a temperature based on infrared light;
a plurality of drive lines 72 arranged along the first direction;
$N_0 \times P_0$ (where $P_0 \geq 2$) number of signal lines 71 which are arranged along the second direction;
a first drive circuit (specifically, a vertical scanning circuit 81) to which the plurality of drive lines 72 are connected; and
a second drive circuit (specifically, a horizontal scanning circuit 86 or the like) to which the $N_0 \times P_0$ number of signal lines 71 are connected. In addition, each temperature detecting element 15 includes a first terminal portion (specifically, a p-n junction diode 30 that is positioned at one end among a plurality of p-n junction diodes 30) and a second terminal portion (specifically, a p-n junction diode 30 that is positioned at another end among the plurality of p-n junction diodes 30),
the first terminal portion of each temperature detecting element 15 is connected to a drive line 72, and
an (n, p)-th signal line 71 (where n=1, 2, . . . , $N_0$, p=1, 2, . . . , $P_0$) is connected to the second terminal portion of a $\{(q-1)P_0+p\}$-th temperature detecting element 15 (where, q=1, 2, 3, . . . ) in a temperature detecting element group constituted by $N_0$-number of an n-th temperature detecting element 15 arranged along the second direction.

More specifically, $P_0=2$ is adopted in the eighth embodiment. Therefore, the value of p is either 1 or 2. In other words, the number of signal lines is expressed as $2N_0$. Reference numeral 215A denotes a temperature detecting element connected to an odd-numbered signal line 71A ($71_{1,1}$, $71_{2,1}$, $71_{3,1}$, . . . ), and reference numeral 215B denotes a temperature detecting element connected to an even-numbered signal line 71B ($71_{1,2}$, $71_{2,2}$, $71_{3,2}$, . . . ).

When p=1, an (n, 1)-th signal line is connected to the second terminal portion of a $\{(q-1)P_0+1\}$-th temperature detecting element (where, q=1, 2, 3, . . . ) in a temperature detecting element group constituted by $N_0$-number of an n-th temperature detecting element arranged along the second direction or, in other words, the odd-numbered temperature detecting element 215A. In addition, when p=2, an (n, 2)-th signal line is connected to the second terminal portion of a $\{(q-1)P_0+2\}$-th temperature detecting element (where, q=1, 2, 3, . . . ) in a temperature detecting element group constituted by $N_0$-number of an n-th temperature detecting element arranged along the second direction or, in other words, the even-numbered temperature detecting element 215B.

In this case, in the imaging apparatus according to the eighth embodiment, the respective signal lines 71A and 71B are connected to analog front ends (AFEs) 83a and 83b, a sample-and-hold circuit 84, and analog-digital converter circuits (ADCs) 85a and 85b that constitute the second drive circuit, and the analog front ends 83a and 83b have a differential integrator circuit. The analog front ends 83a and 83b including a differential integrator circuit and the analog-digital converter circuits 85a and 85b can have known circuit configurations.

In this manner, a group of temperature detecting elements 215A and 215B arranged along the second direction is divided into two groups (the odd-numbered temperature detecting elements 215A that are arranged along the second direction and the even-numbered temperature detecting elements 215B that are arranged along the second direction), and the temperature detecting elements 215A and 215B of the respective groups are connected to the signal lines 71A and 71B. In other words, the temperature detecting elements 215A and 215B that are arranged along the second direction are connected to two signal lines 71A and 71B. Therefore, compared to a case where temperature detecting elements arranged along the second direction are connected to a single signal line, since differential integrator circuits are arranged in parallel, the time that is considered necessary to integrate signals output from the temperature detecting elements by the differential integrator circuit can be doubled and, consequently, an imaging apparatus with high sensitivity and reduced noise can be provided. The configuration and the structure of the imaging apparatus according to the eighth embodiment described above can be applied to the imaging apparatuses described in the first to seventh embodiments. In some cases, the configuration and the structure of the imaging apparatus according to the eighth embodiment described above can also be applied to imaging apparatuses having configurations and structures other than those of the imaging apparatuses described in the first to seventh embodiments (for example, imaging apparatuses that perform imaging based on visible light).

The configuration and the structure of the temperature detecting elements 215A and 215B or the imaging apparatus can be similar to the configurations and the structures of the temperature detecting element 15 or the imaging apparatuses described in the first to sixth embodiments. Alternatively, the configuration and the structure of the temperature detecting elements 215A and 215B can be similar to the configuration and the structure of the temperature detecting elements 15A and 15B described in the seventh embodiment. Therefore, a description of the temperature detecting elements 215A and 215B or the imaging apparatus will be omitted.

Figure 25:
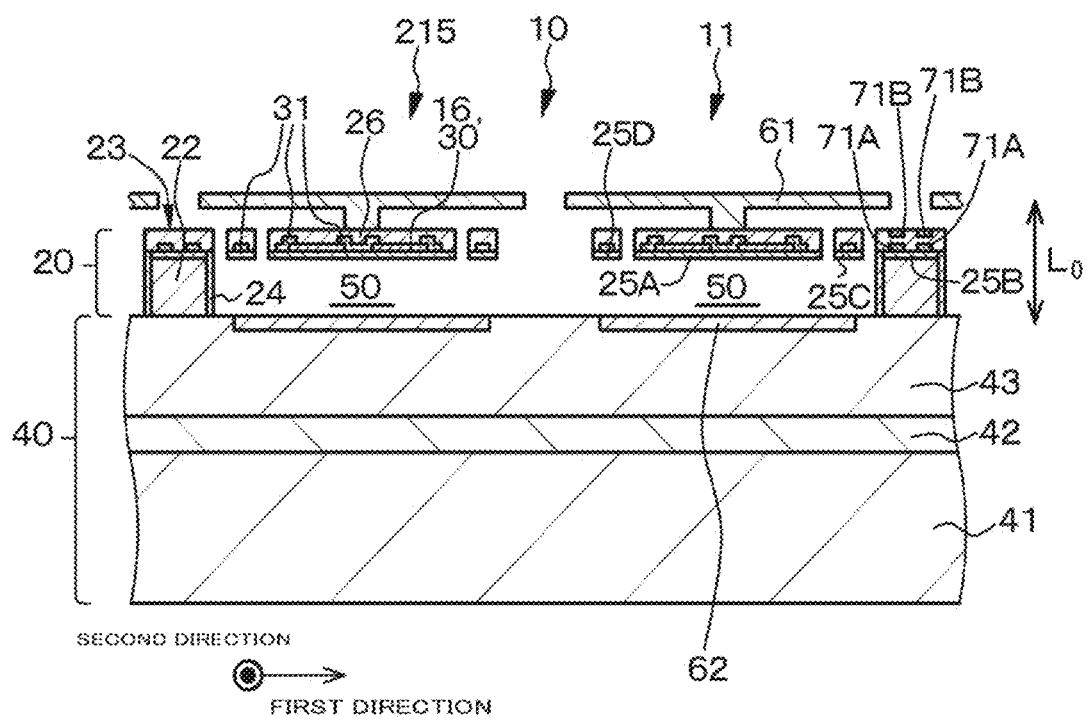
FIG. 25 is a schematic partial end view of a modification of the imaging apparatus according to the eighth embodiment.
Figure 26:
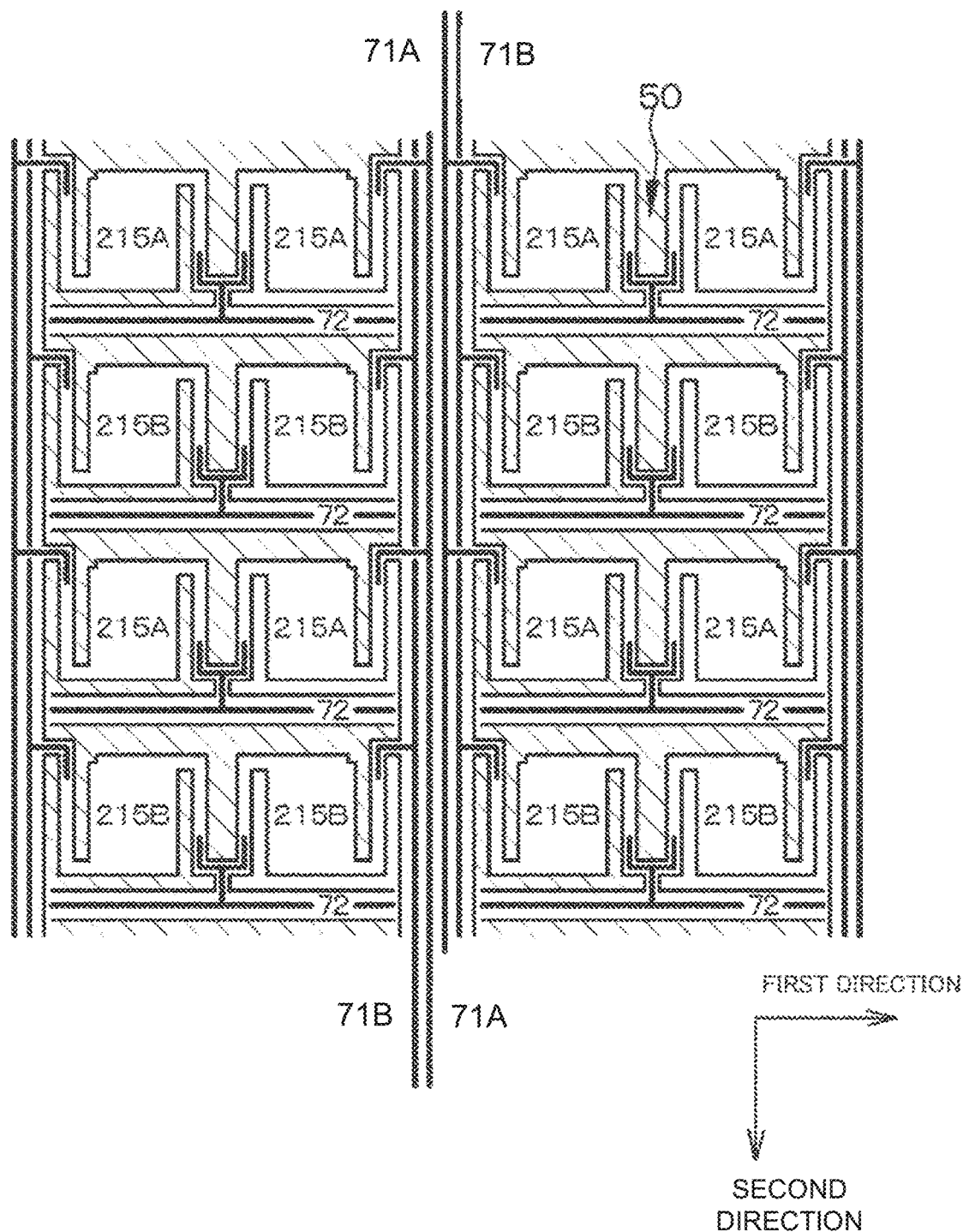
FIG. 26 is a diagram schematically showing an arranged state of components of a modification of the imaging apparatus according to the eighth embodiment shown in FIG. 25.

As shown in the schematic partial end view in FIG. 25 and the schematic view of an arranged state of components of the imaging apparatus in FIG. 26, a structure can be adopted in which the void 50 is shared between 2×k-number of adjacent temperature detecting elements 215 (where k is an integer equal to or larger than 1 and, in the illustrated example, k=1). In order to clarify the void 50, hatching is applied to the void 50 in FIG. 26. In addition, the signal lines 71A and 71B and the drive line 72 are depicted by bold lines and a portion of the wiring 31 is also depicted by a bold line. Similar descriptions will apply to FIG. 28 to be described later. In order to enhance detection sensitivity of the temperature detecting element 215, dissipation of heat via a first stud portion 25C and a second stud portion 25D must be suppressed as much as possible. In the example shown in FIG. 25, since a part of the first stud portion 25C is shared by two temperature detecting elements that are adjacent along the first direction, dissipation of heat via the first stud portion 25C can be suppressed. The structure of the void 50 shown in FIGS. 25 and 26 can be applied to the imaging apparatuses described in the first to seventh embodiments.

Hereinafter, a modification of the imaging apparatus according to the eighth embodiment will be described.

Figure 27:
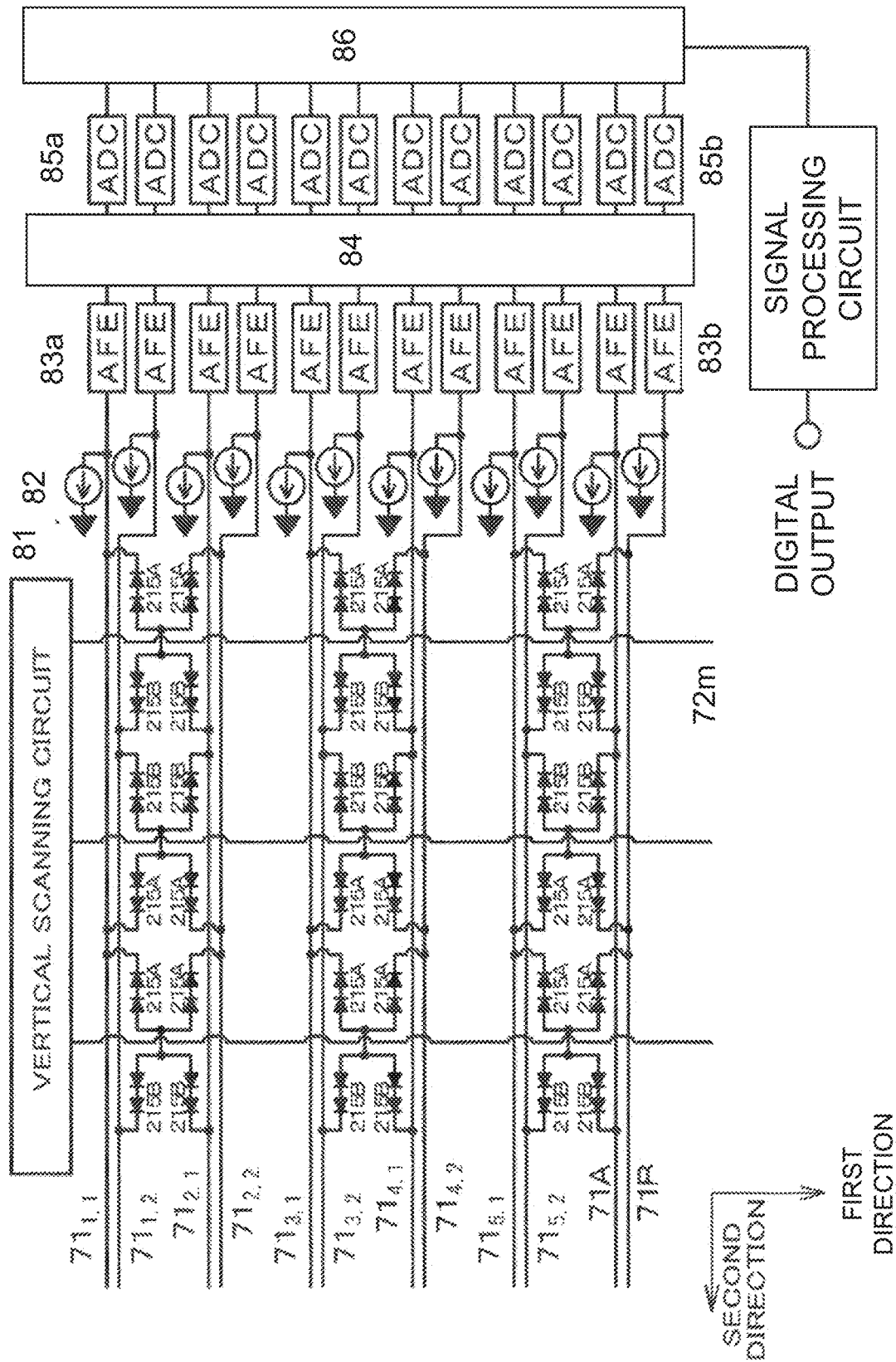
FIG. 27 is an equivalent circuit diagram of another modification of the imaging apparatus according to the eighth embodiment.
Figure 28:
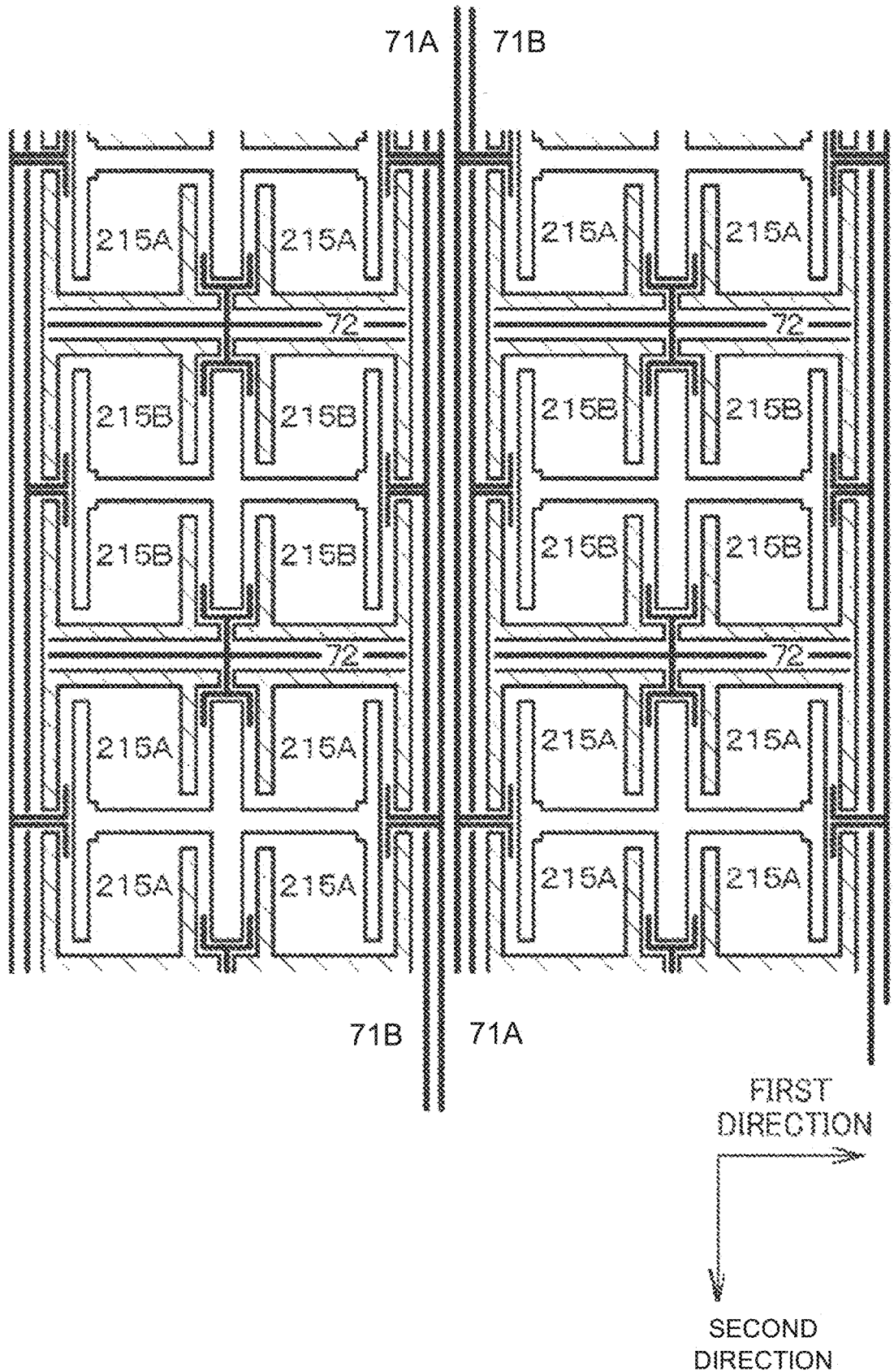
FIG. 28 is a diagram schematically showing an arranged state of components of another modification of the imaging apparatus according to the eighth embodiment shown in FIG. 27.

As shown in the equivalent circuit diagram in FIG. 27 and the schematic view of an arranged state of the components in FIG. 28, in the modification of the imaging apparatus according to the eighth embodiment, the number of the plurality of drive lines 72 is $M_0/P_0$, and an m-th drive line 72 (where m=1, 2, . . . , $M_0/P_0$) is shared in a temperature detecting element group constituted by $M_0$-number of a $\{(m-1)P_0+p'\}$-th temperature detecting element 215 (where p'=1, 2, . . . , all values of $P_0$) arranged along the first direction.

More specifically, $P_0=2$ is adopted in the eighth embodiment as described earlier. Therefore, the value of p' is either 1 or 2. Specifically, an m-th drive line $72_m$ is shared in a temperature detecting element group constituted by $M_0$-number of a $\{(m-1)P_0+p'\}$-th temperature detecting element (specifically, all of $M_0$-number of a $\{(m-1)P_0+1\}$-th temperature detecting element and $M_0$-number of a $\{(m-1)P_0+2\}$-th temperature detecting element) arranged along the first direction.

In addition, in the modification of the imaging apparatus according to the eighth embodiment shown in FIG. 27, the temperature detecting elements 215A and 215B are arranged above the void 50 provided in a temperature detecting element substrate (the first substrate 21), a first connecting portion (specifically, a part of the drive line 72) provided in the temperature detecting element substrate (the first substrate 21) and a first terminal portion (specifically, a p-n junction diode 30 that is positioned at one end among a plurality of p-n junction diodes 30) of the temperature detecting elements 215A and 215B are connected via a first stud portion 25C (specifically, the first stud portion 25C of which a part is shared), and a second connecting portion (specifically, a part of the signal lines 71A and 71B) provided in the temperature detecting element substrate (the first substrate 21) and a second terminal portion (specifically, a p-n junction diode 30 that is positioned at another end among the plurality of p-n junction diodes 30) of the temperature detecting elements 215A and 215B are connected via a second stud portion 25D (specifically, the second stud portion 25D of which a part is shared).

Alternatively, $P_0=2$, respective second terminal portions of the two temperature detecting elements 215A and 215B adjacent to each other in the second direction are connected to a second connecting portion (a part of the signal lines 71A and 71B) provided in the temperature detecting element substrate (the first substrate 21) via a single second stud portion 25D (specifically, the second stud portion 25D of which a part is shared), and respective first terminal portions of a total of four temperature detecting elements 215A and 215B including two temperature detecting elements 215A or 215B adjacent to each other in the first direction and two temperature detecting elements 215A and 215B adjacent to each other in the second direction are connected to a first connecting portion (a part of the drive line 72) provided in the temperature detecting element substrate (the first substrate 21) via a single first stud portion 25C (specifically, the first stud portion 25C of which a part is shared).

In order to enhance detection sensitivity of the temperature detecting element 215, dissipation of heat via a first stud portion 25C and a second stud portion 25D must be suppressed as much as possible. In the example shown in FIG. 27, since a part of the first stud portion 25C is shared by four temperature detecting elements that are adjacent along the first direction and the second direction and a part of the second stud portion 25D is shared by two temperature detecting elements that are adjacent along the second direction, dissipation of heat via the first stud portion 25C and the second stud portion 25D can be suppressed. It should be noted that the structure of the void 50 shown in FIG. 27 can be applied to the imaging apparatuses described in the first to seventh embodiments.

Ninth Embodiment

Figure 29:
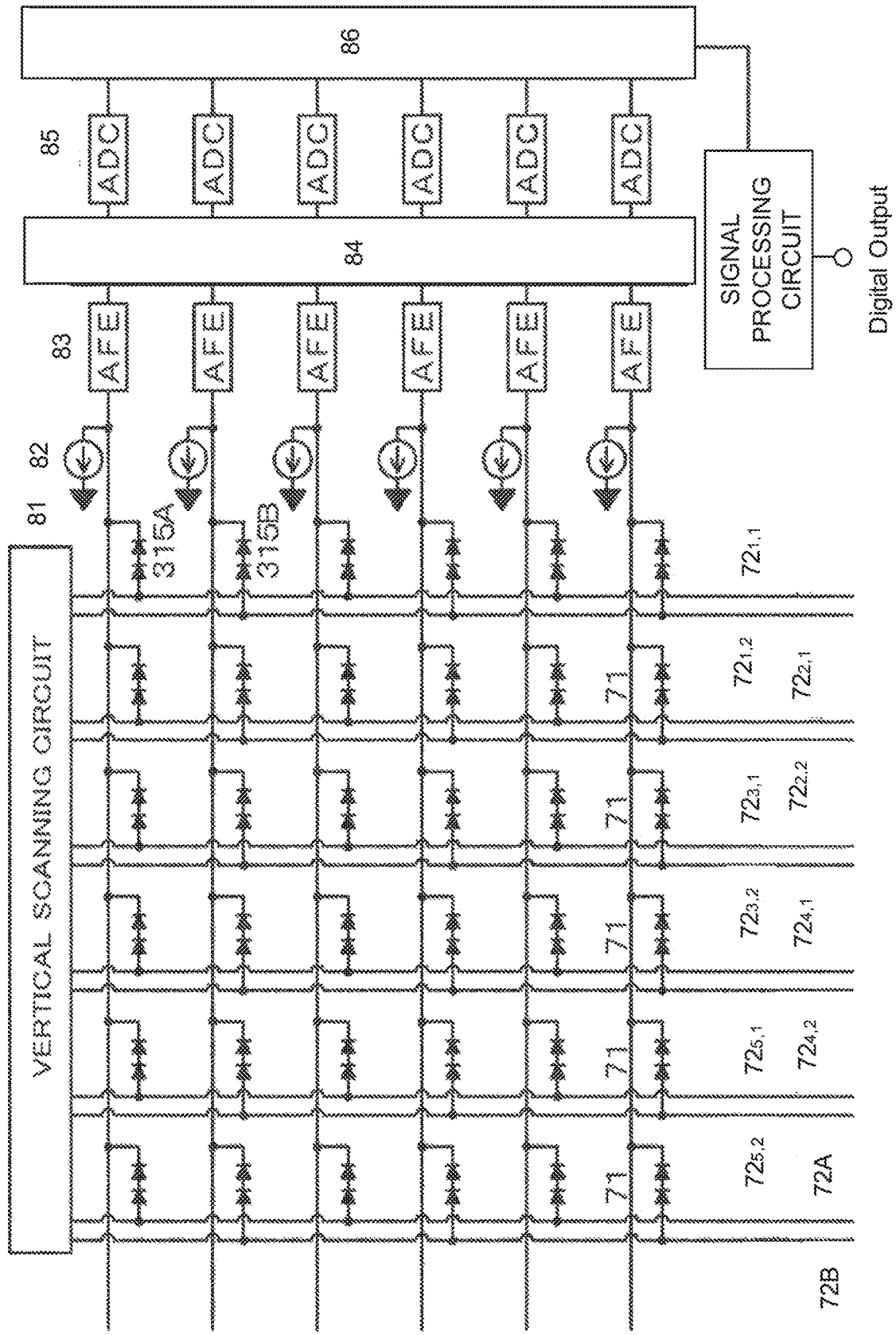
FIG. 29 is an equivalent circuit diagram of an imaging apparatus according to a ninth embodiment.

A ninth embodiment relates to an imaging apparatus according to the fifth aspect of the present disclosure. As shown in the equivalent circuit diagram in FIG. 29, the imaging apparatus according to the ninth embodiment includes:

$S_0 \times T_0$ (where $S_0 \geq 2$, $T_0 \geq 2$) number of temperature detecting elements 315A and 315B which are arranged in a first direction and a second direction that differs from the first direction (specifically, in a two-dimensional matrix pattern) and which are configured to detect a temperature based on infrared light;

$S_0 \times U_0$ (where $U_0 \geq 2$) number of drive lines 72 arranged along the first direction; a plurality of signal lines 71 which are arranged along the second direction;

a first drive circuit (specifically, a vertical scanning circuit 81) to which the $S_0 \times U_0$ number of drive lines 72 are connected; and a second drive circuit (specifically, a horizontal scanning circuit 86 or the like) to which the plurality of signal lines 71 are connected. In addition, the respective temperature detecting elements 315A and 315B include a first terminal portion (specifically, a p-n junction diode 30 that is positioned at one end among a plurality of p-n junction diodes 30) and a second terminal portion (specifically, a p-n junction diode 30 that is positioned at another end among the plurality of p-n junction diodes 30), the second terminal portion of the respective temperature detecting elements 315A and 315B is connected to a signal line 71, and an (s, u)-th drive line 72 (where s=1, 2, . . . , $S_0$, u=1, 2, . . . , $U_0$) is connected to the first terminal portion of $\{(t-1)U_0+u\}$-th temperature detecting elements 315A and 315B (where, t=1, 2, 3, . . . ) in a temperature detecting element group constituted by $S_0$-number of s-th temperature detecting elements 315A and 315B that are arranged along the first direction.

More specifically, $U_0=2$ is adopted in the ninth embodiment. Therefore, the value of u is either 1 or 2. In other words, the number of drive lines is expressed as $2S_0$. Reference numeral 315A denotes a temperature detecting element connected to an odd-numbered drive line 72A ($72_{1,1}$, $72_{2,1}$, $72_{3,1}$, . . . ), and reference numeral 315B denotes a temperature detecting element connected to an even-numbered drive line 72B ($72_{1,2}$, $72_{2,2}$, $72_{3,3}$, . . . ).

When u=1, an (s, 1)-th drive line is connected to the first terminal portion of a $\{(t-1)U_0+1\}$-th temperature detecting element (where, t=1, 2, 3, . . . ) in a temperature detecting element group constituted by $S_0$-number of an s-th temperature detecting element arranged along the first direction or, in other words, the odd-numbered temperature detecting element 315A. In addition, when u=2, an (s, 2)-th signal line is connected to the second terminal portion of a $\{(t-1)P_0+2\}$-th temperature detecting element (where, t=1, 2, 3, . . . ) in a temperature detecting element group constituted by $S_0$-number of an s-th temperature detecting element arranged along the first direction or, in other words, the even-numbered temperature detecting element 315B.

In this manner, a group of temperature detecting elements 315A and 315B arranged along the first direction is divided into two groups (the odd-numbered temperature detecting elements 315A that are arranged along the first direction and the even-numbered temperature detecting elements 315B that are arranged along the first direction), and the temperature detecting elements 315A and 315B of the respective groups are connected to the drive lines 72A and 72B. In other words, the temperature detecting elements 315A and 315B that are arranged along the first direction are connected to two drive lines 72A and 72B. Therefore, since a reduction in current density of a current that flows through the drive lines can be achieved, a reduction in power consumption when driving the temperature detecting elements can be achieved and, for example, suppression of a voltage drop in the drive lines can be achieved. The configuration and the structure of the imaging apparatus according to the ninth embodiment described above can be applied to the imaging apparatuses described in the first to eighth embodiments. In some cases, the configuration and the structure of the imaging apparatus according to the ninth embodiment described above can also be applied to imaging apparatuses having configurations and structures other than those of the imaging apparatuses described in the first to eighth embodiments (for example, imaging apparatuses that perform imaging based on visible light).

Tenth Embodiment

A tenth embodiment relates to an imaging apparatus according to the sixth aspect of the present disclosure. The imaging apparatus according to the ninth embodiment is constituted by
a first structure 20 and a second structure 40,
the first structure 20 includes
a first substrate 21,
a plurality of temperature detecting elements 15 which are provided on the first substrate 21, which are arranged in a first direction and a second direction that differs from the first direction (specifically, in a two-dimensional matrix pattern), and which are configured to detect a temperature based on infrared light,
a plurality of drive lines 72 which are arranged along the first direction and to which
a plurality of temperature detecting elements 15 are respectively connected, and
a plurality of signal lines 71 which are arranged along the second direction and to which a plurality of temperature detecting elements 15 are respectively connected.

In addition, the second structure 40 includes
a second substrate 41 and
a drive circuit provided on the second substrate 41,
the first structure 20 includes a temperature detecting element array region 11 including a plurality of temperature detecting elements 15 and a peripheral region 12 that encloses the temperature detecting element array region 11,
the second structure 40 is attached to a side of the first substrate 21 to which infrared light is incident, and
the drive lines 72 and the signal lines 71 are electrically connected to the drive circuit in the peripheral region 12.

Specifically, for example, in the imaging apparatuses described in the first to tenth embodiments, a configuration may be adopted in which a drive circuit is not provided in a central region 13 of the second structure 40 and infrared light is incident from the central region 13 of the second structure 40, an infrared absorbing layer 61 is arranged at an arrangement position of an infrared reflecting layer 62, and the infrared reflecting layer 62 is arranged at an arrangement position of the infrared absorbing layer 61. In addition, a positional relationship between the void 50 and the cavity 51 may be reversed. The drive circuit may be covered by the coating layer 43.

Eleventh Embodiment

Figure 30:
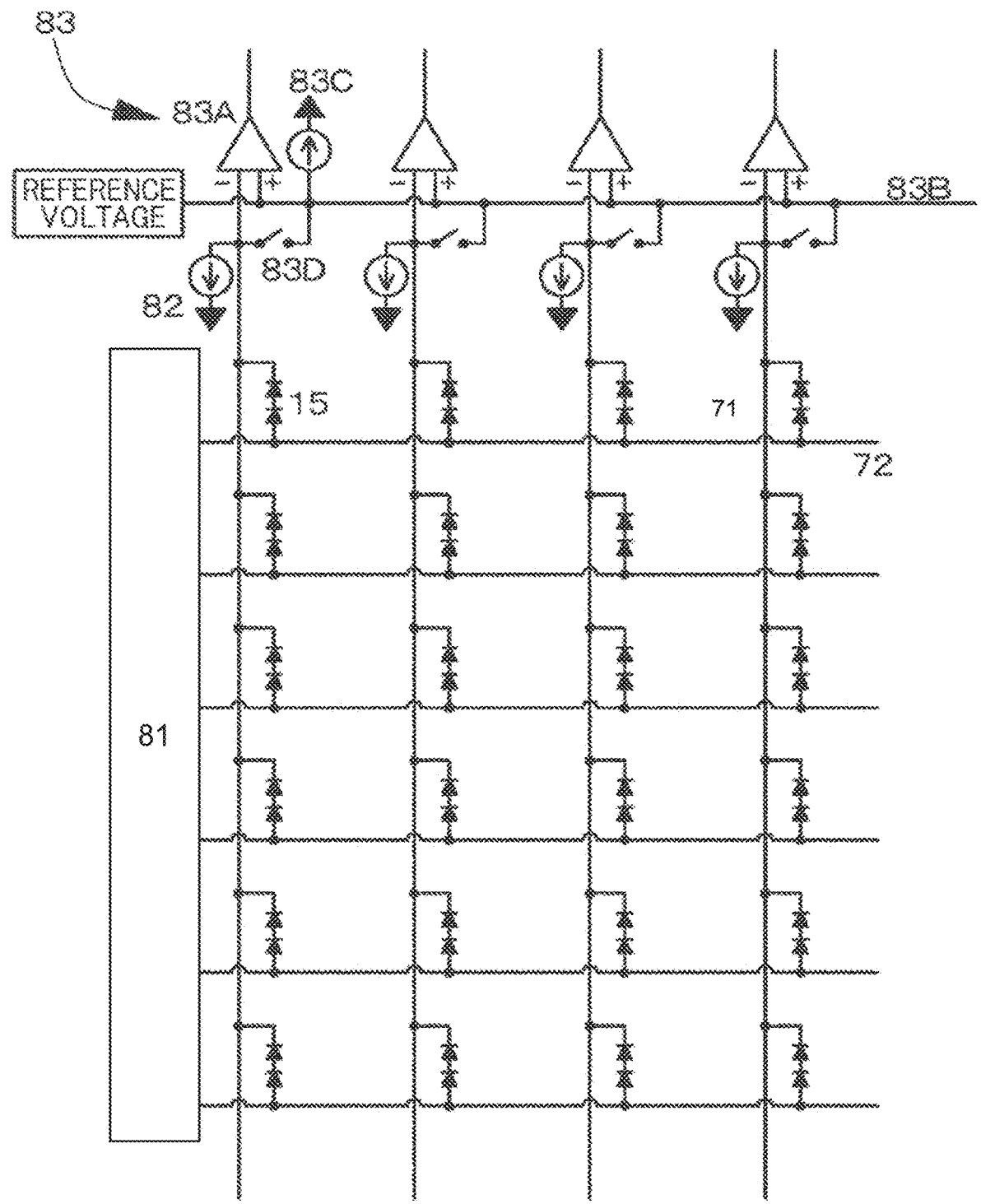
FIG. 30 is an equivalent circuit diagram of an imaging apparatus according to an eleventh embodiment.

An eleventh embodiment relates to a noise reduction method in the imaging apparatus according to the present disclosure. The imaging apparatus according to the eleventh embodiment is the imaging apparatus described in the first to tenth embodiments. Specifically, as shown in the equivalent circuit diagram in FIG. 30, the imaging apparatus according to the eleventh embodiment includes
a temperature detecting element 15 configured to detect a temperature based on infrared light,
a drive line 72 to which the temperature detecting element 15 is connected, and
a signal line 71 to which the temperature detecting element 15 is connected,
the imaging apparatus further includes
a first drive circuit to which the drive line 72 is connected,
a second drive circuit to which the signal line 71 is connected, and a storage apparatus (for example, a non-volatile memory (not illustrated)), and
in the second drive circuit, the signal line 71 is connected to a differential integrator circuit 83A and an analog-digital converter circuit 85.

In this case, in the imaging apparatuses according to the first to eleventh embodiments, the voltage in each signal line 71 is input to one of input portions of the differential integrator circuit 83A that constitutes the analog front end (AFE) 83. In addition, reference voltage is input to the other input portion of the differential integrator circuit 83A via a wiring 83B. The wiring 83B is also connected to a constant current circuit 83C. Furthermore, switching means 83D for short-circuiting each signal line 71 and the wiring 83 is arranged between each signal line 71 and the wiring 83B. Due to a configuration in which the constant current circuit 83C is arranged for each signal line, error attributable to a voltage drop caused by wiring resistance can be reduced. In other words, arranging the constant current circuit 83C for each signal line enables a current distribution of the wiring 83B and a current distribution of the drive line 72 to be made approximately equal to each other. By making the current distributions equal to each other and, at the same time, making wiring resistance values per unit length of the wiring 83B and the drive line 72 approximately equal to each other, a voltage drop based on a product of wiring resistance and current can be made approximately equal for each row. Although a voltage drop of the wiring 83B causes a drop in voltage of a positive-side terminal of the differential integrator circuit 83A and a voltage drop of the drive line 72 causes a drop in voltage of a negative-side terminal of the differential integrator circuit 83A, since equivalent voltage drops of the positive-side terminal and the negative-side terminal are canceled out by differential integration, an error that is manifested at an output terminal of the differential integrator circuit 83A is reduced.

In a noise reduction method according to the eleventh embodiment, first, the temperature detecting element 15 is placed in a non-operating state and the differential integrator circuit 83A is reset. In other words, without selecting the temperature detecting element 15 from the vertical scanning circuit 81, the switching means 83D is set to a "closed" state, and the two input portions of the differential integrator circuit 83A are short-circuited to reset the differential integrator circuit 83A.

Next, after placing the temperature detecting element 15 in a non-operating state, a constant current is passed through the signal line 71 for a same time $TM_0$ as a time $TM_0$ during which the temperature detecting element 15 is in an operating state, voltage of the signal line 71 is integrated by the differential integrator circuit 83A, an obtained integral value is converted into a digital value at the analog-digital converter circuit 85, and an obtained digital value is stored as an offset value in the storage apparatus.

Specifically, after placing the switching means 83D in an "open" state and keeping the temperature detecting element 15 in a non-operating state, a constant current is passed through the signal line 71 for a same time $TM_0$ as a time $TM_0$ during which the temperature detecting element 15 is in an operating state and, at the same time, reference voltage is input to the other input portion of the differential integrator circuit 83A via the wiring 83B. Voltage (as a general rule, an invariable voltage value) of the signal line 71 is integrated by the differential integrator circuit 83A. In addition, after the time $TM_0$ lapses, the obtained integral value is converted into a digital value at the analog-digital converter circuit 85, and the obtained digital value is stored as an offset value in the storage apparatus. In this manner, since reference voltage is input to the other input portion of the differential integrator circuit 83A and an output of the non-operating temperature detecting element 15 is input to the one input portion of the differential integrator circuit 83A, on the final analysis, the integral value obtained by the differential integrator circuit 83A is a value attributable to variations in characteristics in the differential integrator circuit 83A (specifically, a variation in offsets in an operational amplifier that constitutes the differential integrator circuit).

Next, the temperature detecting element 15 is actually operated. In this case, the temperature detecting element 15 is placed in an operating state only for a time $TM_0$, voltage of the signal line 71 is integrated by the differential integrator circuit 83A, the obtained integral value is converted into a digital value at the analog-digital converter circuit 85 to obtain a digital signal value, and an offset value is subtracted from the digital signal value.

In this manner, since noise attributable to the differential integrator circuit 83A can be reduced or a variation in characteristics in the differential integrator circuit 83A can be suppressed, so-called vertical stripe pattern noise can be reduced. The processing described above may be performed before reading a single imaging frame (a single screen).

Twelfth Embodiment

Figure 31:
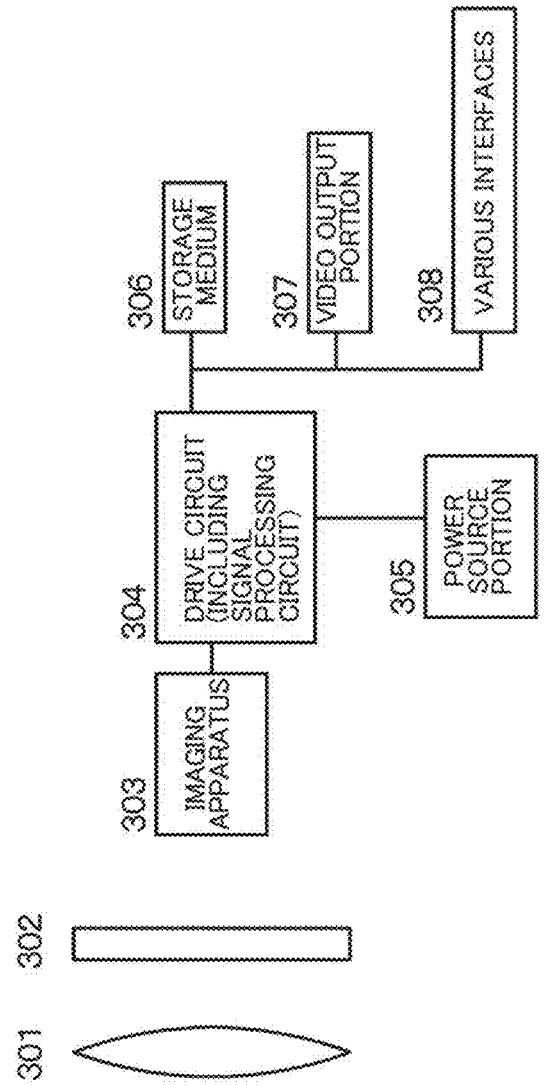
FIG. 31 is a conceptual diagram of an infrared camera including an imaging apparatus according to the present disclosure.

In a twelfth embodiment, an example in which the imaging apparatuses described in the first to eleventh embodiments are applied to an infrared camera will be described. As shown in the conceptual diagram in FIG. 31, the infrared camera is constituted by an imaging lens (an imaging optical system) 301, a shutter 302, the imaging apparatus 303 described in the first to eleventh embodiment, a drive circuit 304, a power source portion 305, a storage medium 306, a video output portion 307, and various interfaces 308. The drive circuit 304 includes, in addition to the various circuits described earlier, a signal processing circuit which, for example, corrects variations among pixels, corrects defective pixels, and removes various types of noise. Since known components can be adopted as components of the infrared camera configured as described above with the exception of the imaging apparatus 303, a detailed description will be omitted.

Thirteenth Embodiment

In a thirteenth embodiment, an application of an example in which the imaging apparatus described in the third embodiment (refer to the twelfth embodiment) is applied to an infrared camera will be described.

Figure 37:
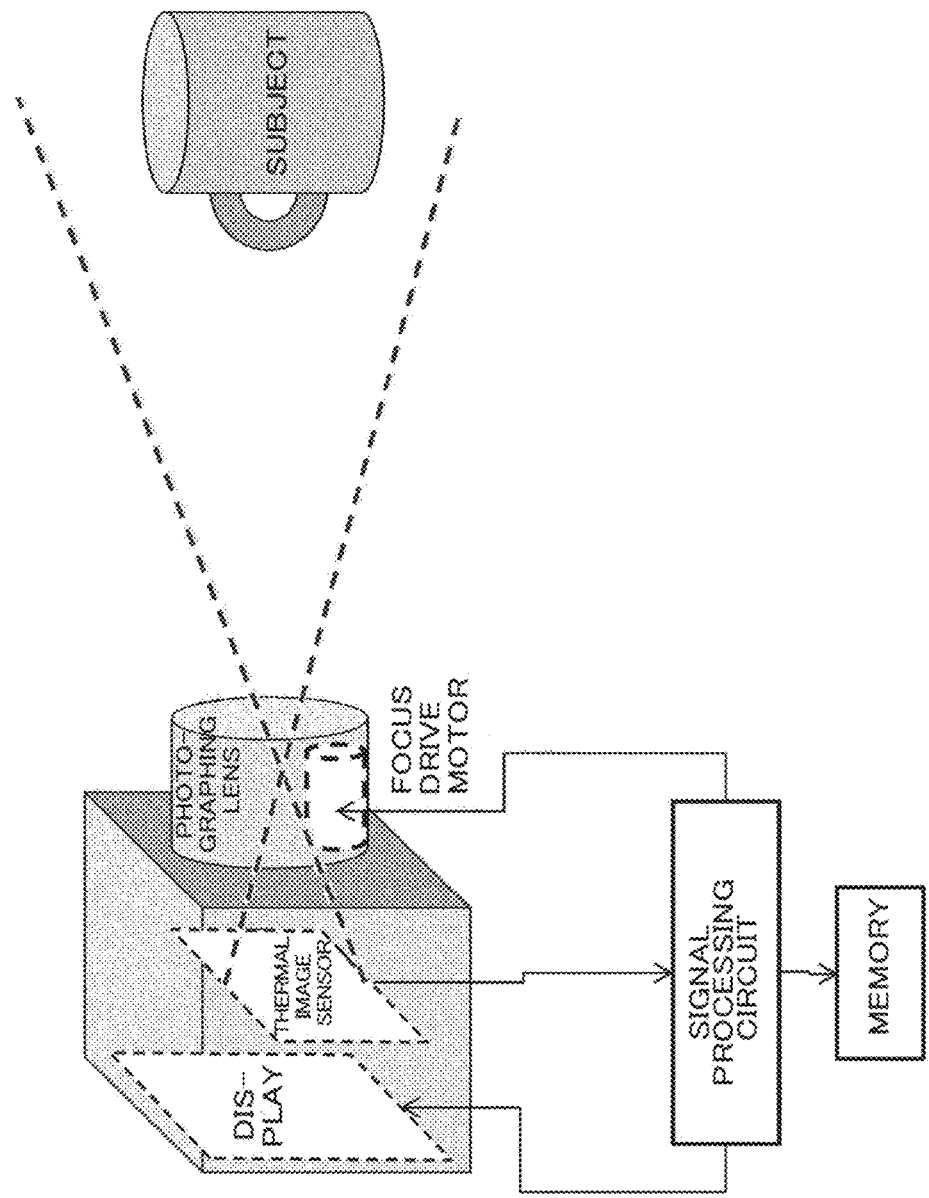
FIG. 37 is a conceptual diagram of an infrared camera or the like that incorporates an imaging apparatus according to a thirteenth embodiment.
Figure 38:
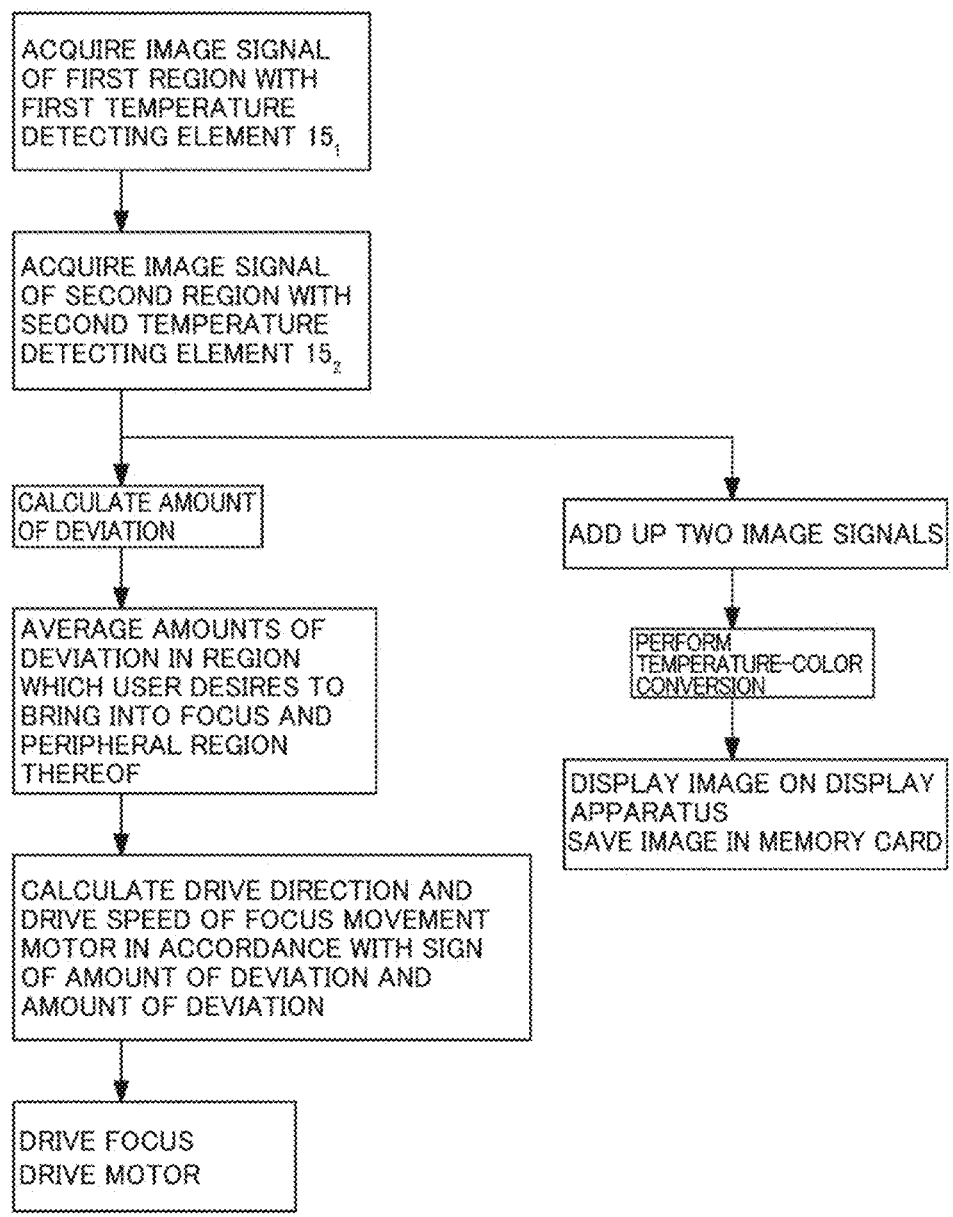
FIG. 38 is a flow chart for explaining operations of the imaging apparatus according to the thirteenth embodiment.

FIG. 37 shows a conceptual diagram of an infrared camera or the like that incorporates the imaging apparatus according to the thirteenth embodiment, and FIG. 38 shows a flow chart for explaining operations of the imaging apparatus according to the thirteenth embodiment. It should be noted that a thermal image sensor shown in FIG. 37 corresponds to the imaging apparatus described in the third embodiment.

In the thirteenth embodiment, an autofocusing function is realized by the infrared camera. Specifically, each of the two temperature detecting elements in the imaging apparatus described with reference to FIG. 11A in the third embodiment or, in other words, each of the first temperature detecting element $15_1$ and the second temperature detecting element $15_2$ obtains image signals (for convenience's sake, referred to as a "first image signal" and a "second image signal") in a first region (for example, a right-half region) and a second region (for example, a left-half region) of a pupil of the imaging lens (an exit pupil of the imaging optical system). In addition, an amount of deviation of an image is obtained from the first image signal and the second image signal based on a known method (for example, a method disclosed in FIGS. 17 and 21 of JP 2012-177676A). Furthermore, amounts of deviation in a region which a user desires to bring into focus and a peripheral region thereof are averaged by a known method, and an evaluation is performed as to whether the region is in focus, whether the focus is a so-called front focus (a state where the subject is not in focus and a front side of the subject is in focus), or whether the focus is a so-called rear focus (a state where the subject is not in focus and a rear side of the subject is in focus). In addition, in accordance with a sign of an amount of deviation (an index of whether the focus is a front focus or a rear focus) and the amount of deviation, a drive direction, a drive speed, and a drive amount of a focus movement motor are determined based on a known method and a focus drive motor is driven. The operations described above enable the infrared camera to perform focusing. When an absolute value of the amount of deviation is large, the focus drive motor may be driven at high speed. In addition, the first image signal and the second image signal may be added up, temperature information based on an obtained image signal may be converted into color information using a known method (temperature-color conversion), an image may be displayed on, for example, a display apparatus included in the infrared camera or an external display apparatus connected to the infrared camera and, when necessary, the temperature information and the color information may be stored in a memory card or the like that is included in the infrared camera.

Figure 39:
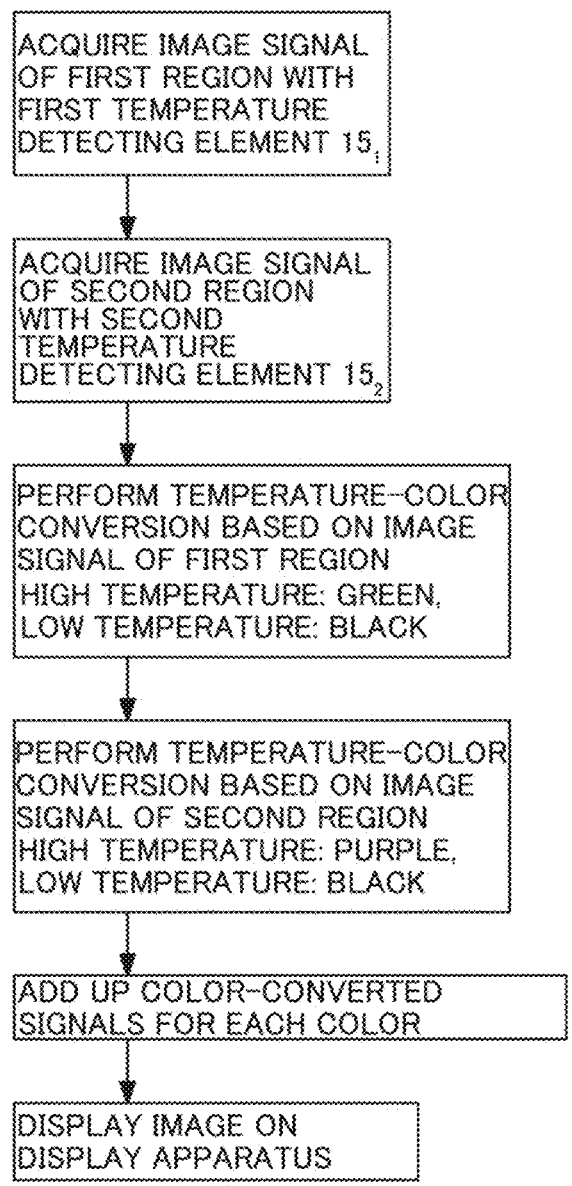
FIG. 39 is a flow chart for explaining operations of a first modification of the imaging apparatus according to the thirteenth embodiment.
Figure 40A:
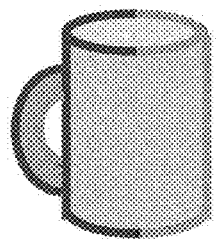
FIGS. 40A, 40B, and 40C are, respectively, schematic diagrams of an image obtained by operations of the first modification of the imaging apparatus according to the thirteenth embodiment.
Figure 40B:
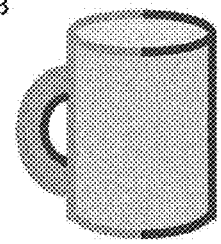
Figure 40C:
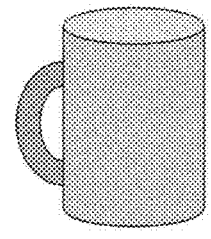

Alternatively, FIG. 39 shows a flow chart for explaining an operation of a first modification of the imaging apparatus according to the thirteenth embodiment, and FIGS. 40A, 40B, and 40C show schematic diagrams of images obtained by an operation of the first modification of the imaging apparatus according to the thirteenth embodiment. The first modification enables manual focusing of the infrared camera to be readily performed. In other words, an image obtained by the infrared camera is colored to enable the user to readily determine whether or not the infrared camera is in focus. Specifically, a first image is obtained based on first image signals obtained from all first temperature detecting elements $15_1$ that constitute the imaging apparatus. In addition, a second image is obtained based on second image signals obtained from all second temperature detecting elements $15_2$ that constitute the imaging apparatus. Next, the first image and the second image are converted into monochrome images of different colors. For example, the first image is converted into an image in which a high-temperature region is displayed in green and a low-temperature region is displayed in black. On the other hand, the second image is converted into an image in which a high-temperature region is displayed in purple and a low-temperature region is displayed in black. Furthermore, the images are composited (added up). The color displaying a high-temperature region in the first image and the color displaying a high-temperature region in the second image preferably have a complementary relationship. In a region in focus, a region of the composited image appears as a black-and-white image (refer to FIG. 40C). On the other hand, in a region out of focus, a region of the composited image does not appear as a black-and-white image and is colored. The color of the colored image differs depending on whether the focus is a front focus or a rear focus (refer to FIGS. 40A and 40B). Therefore, the user can readily perform focusing.

Figure 41:
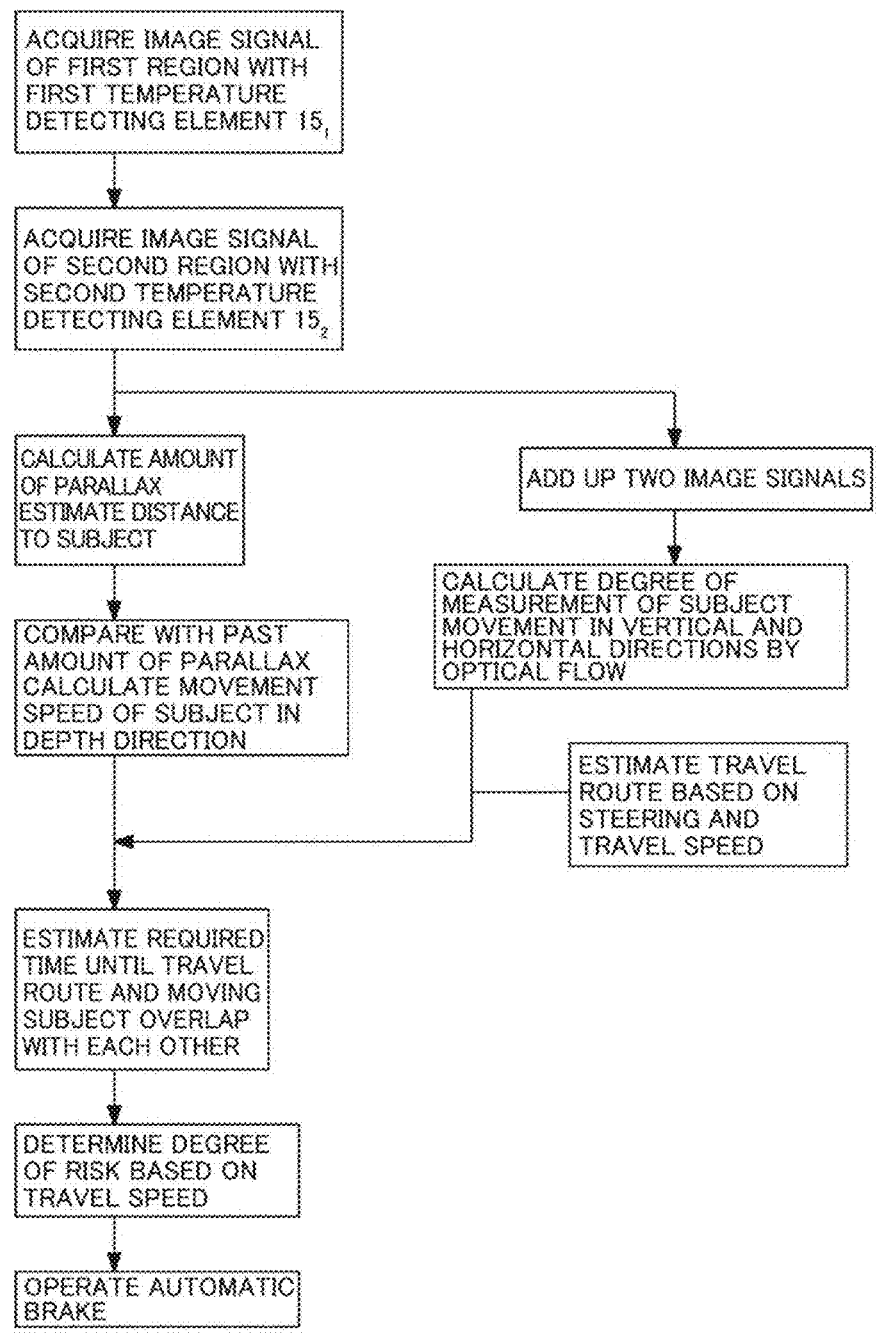
FIG. 41 is a flow chart for explaining operations of a second modification of the imaging apparatus according to the thirteenth embodiment.

Alternatively, FIG. 41 is a flow chart for explaining operations of a second modification of the imaging apparatus according to the thirteenth embodiment. In the second modification, collision avoidance of a vehicle is performed. Specifically, in a similar manner to that described above, a first image signal and a second image signal are respectively obtained by the first temperature detecting element $15_1$ and the second temperature detecting element $15_2$. In addition, based on a known method, an amount of parallax is calculated from the first image signal and the second image signal, and a distance to a subject is estimated from the amount of parallax. Furthermore, a comparison with a previous amount of parallax (in other words, a last-obtained amount of parallax) is performed or, in other words, a rate of temporal variation of the amount of parallax is obtained and a movement speed of the subject in a depth direction is calculated. On the other hand, the first image signal and the second image signal are added up and movement speeds of the subject in a vertical direction and a horizontal direction are calculated based on, for example, an optical flow. Moreover, a travel route of a vehicle is estimated based on steering and a travel speed of the vehicle. In addition, based on the above, a required time until the travel route of the vehicle and the subject overlap with each other is estimated, a degree of risk based on the travel speed is determined, and when the degree of risk is equal to or higher than a predetermined value, an automatic brake is operated to stop the vehicle or reduce the travel speed of the vehicle. As described above, detection of a subject and collision avoidance can be performed in an effective manner in situations where visibility is poor such as during night-time or when a fog, a mist, or the like has occurred.

Figure 42:
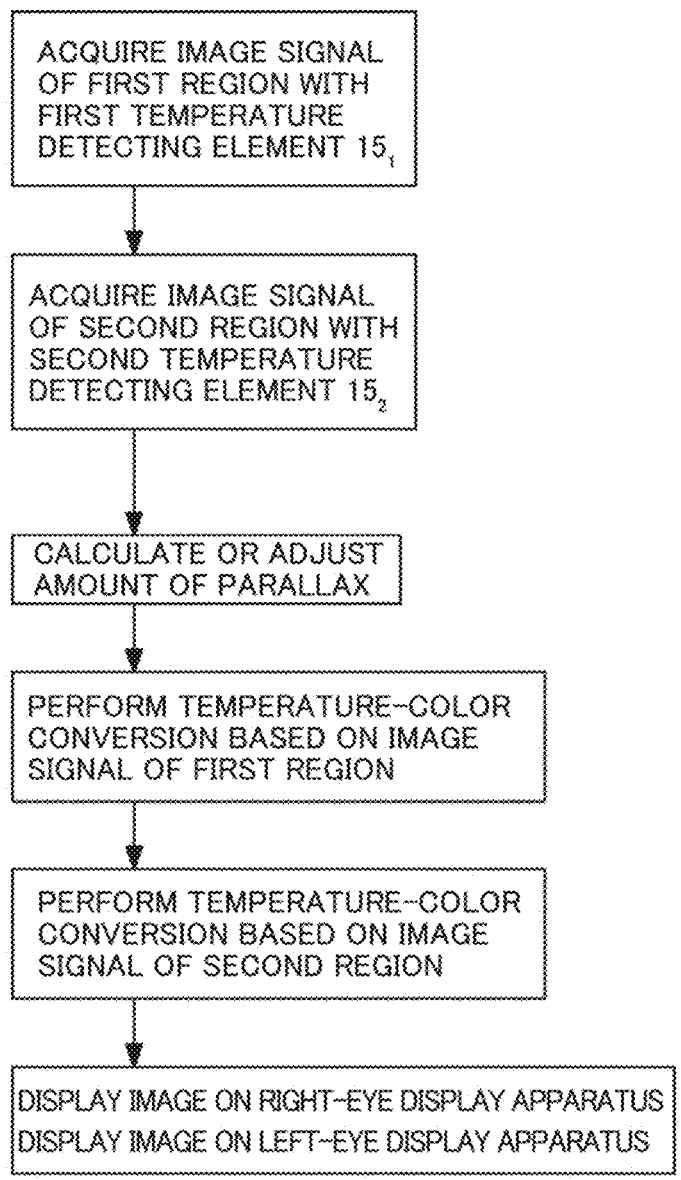
FIG. 42 is a flow chart for explaining operations of a third modification of the imaging apparatus according to the thirteenth embodiment.

Alternatively, FIG. 42 is a flow chart for explaining operations of a third modification of the imaging apparatus according to the thirteenth embodiment. In the third modification, display is performed on a right-eye display apparatus and a left-eye display apparatus which are built into a so-called head-mounted display (HMD) or goggles (hereinafter, referred to as an "HMD or the like"). The imaging apparatus may be attached to the HMD or the like or may be attached to a portion other than the HMD or the like. The head-mounted display may be a semi-transmissive type which allows the outside to be observed or a non-transmissive type which does not allow the outside to be observed. An image obtained by an infrared camera including the imaging apparatus is displayed on the right-eye display apparatus and the left-eye display apparatus. The image displayed on the right-eye display apparatus is incident to the right eye either directly or via appropriate deflecting means. The image displayed on the left-eye display apparatus is incident to the left eye either directly or via appropriate deflecting means. Specifically, in a similar manner to that described above, a first image having been subject to temperature-color conversion is obtained based on first image signals obtained from all first temperature detecting elements $15_1$ that constitute the imaging apparatus. In addition, a second image having been subject to temperature-color conversion is obtained based on second image signals obtained from all second temperature detecting elements $15_2$ that constitute the imaging apparatus. Since a parallax exists between the first image and the second image, when the user views the first image via the right-eye display apparatus and views the second image via the left-eye display apparatus, the image is perceived as a stereoscopic image having depth. The stereoscopic image may be monochromatic or may be colored. Detection of a subject and observation of the subject can be performed in an effective manner in situations where visibility is poor such as during night-time or when a fog, a mist, smoke, or the like has occurred.

While the temperature detecting element and the imaging apparatus according to the present disclosure have heretofore been described based on preferable embodiments, the temperature detecting element and the imaging apparatus according to the present disclosure are not limited to these embodiments. Configurations and structures of the imaging apparatuses and the temperature detecting elements described in the embodiments are exemplary and can be changed as deemed appropriate, and materials that constitute the imaging apparatuses and the temperature detecting elements as well as manufacturing methods of the imaging apparatuses and the temperature detecting elements are also exemplary and can be changed as deemed appropriate. In some cases, formation of an infrared reflecting layer may be omitted and a top surface of a coating layer itself may be configured to function as an infrared reflecting layer.

Values of the optical distances $L_0$, $L_1$, and $L_2$ between the infrared absorbing layers and the infrared reflecting layer may be varied depending on a position of the temperature detecting element 15 in the temperature detecting element array region 11. In other words, the values of the optical distances $L_0$, $L_1$, and $L_2$ may be set such that the more distant the position of the temperature detecting element 15 is from a center portion of the temperature detecting element array region 11, the smaller the values. It should be noted that the temperature detecting element array region 11 may be divided into a plurality of regions and values of the optical distances $L_0$, $L_1$, and $L_2$ may be set for each region.

Figure 33:
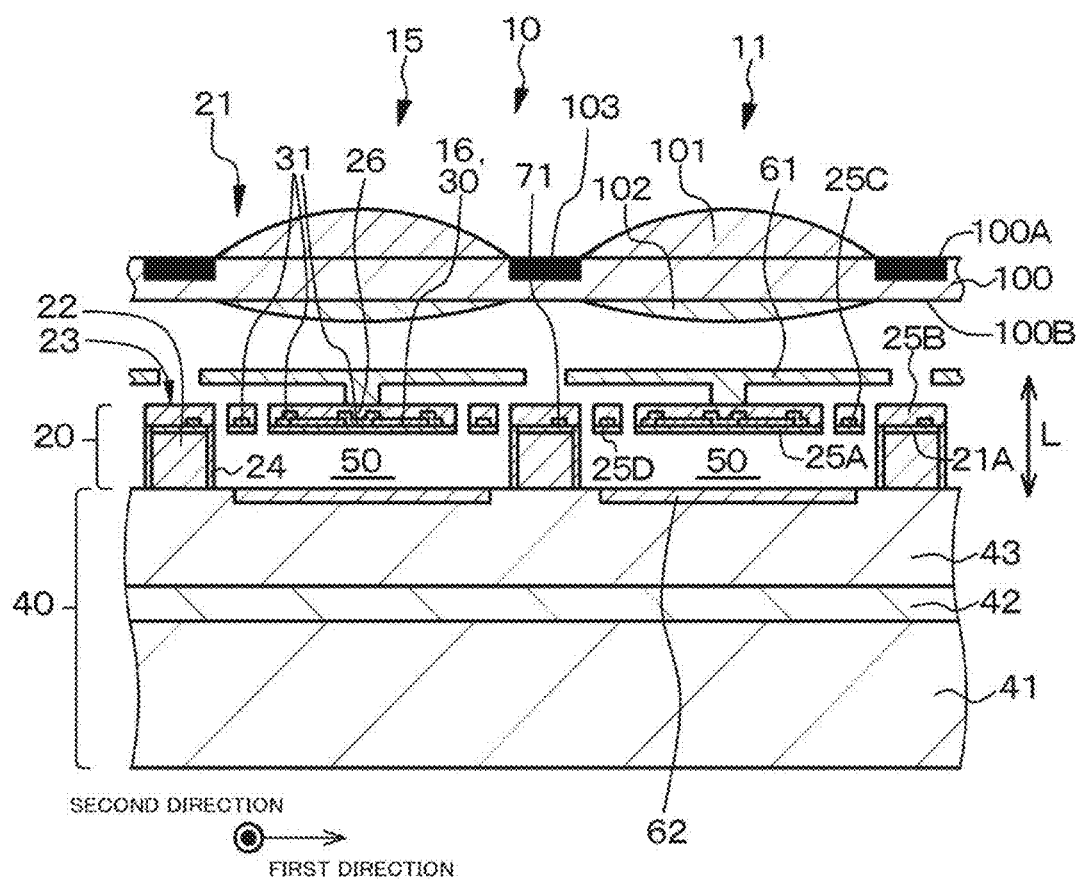
FIG. 33 is a schematic partial end view of yet another modification of the imaging apparatus according to the first embodiment.

Alternatively, for example, instead of the base 100 that is made of a silicon semiconductor substrate, a base (a protective member) made of a material that transmits infrared light such as $CaF_2$, $BaF_2$, $Al_2O_3$, or ZnSe can be adopted. In addition, as shown in FIG. 33, a light-shielding portion 103 may be provided on an infrared incidence side of the imaging apparatus to suppress incidence of infrared light to an adjacent temperature detecting element. For example, the light-shielding portion 103 can be formed by forming a groove portion on the base 100 and filling the groove portion with a metal material or an alloy material. It is needless to say that the light-shielding portion 103 can also be applied to other embodiments as deemed appropriate.

An imaging apparatus using a method referred to as light-field photography is known. The imaging apparatus is constituted by an imaging lens, a microlens array, a light-receiving element, and an image processing portion, and an imaging signal obtained from the light-receiving element includes information on a travel direction of light in addition to intensity of the light on a light-receiving surface of the light-receiving element. In addition, based on such an imaging signal, an observation image from an arbitrary viewpoint or direction is reconstructed by the image processing portion. The temperature detecting element according to the present disclosure can be applied to the light-receiving element in such an imaging apparatus.

In addition, an imaging apparatus can be adopted which includes a combination of the temperature detecting element according to the present disclosure and a polarizing element (for example, a wire grid polarizer (WGP)).

Figure 34:
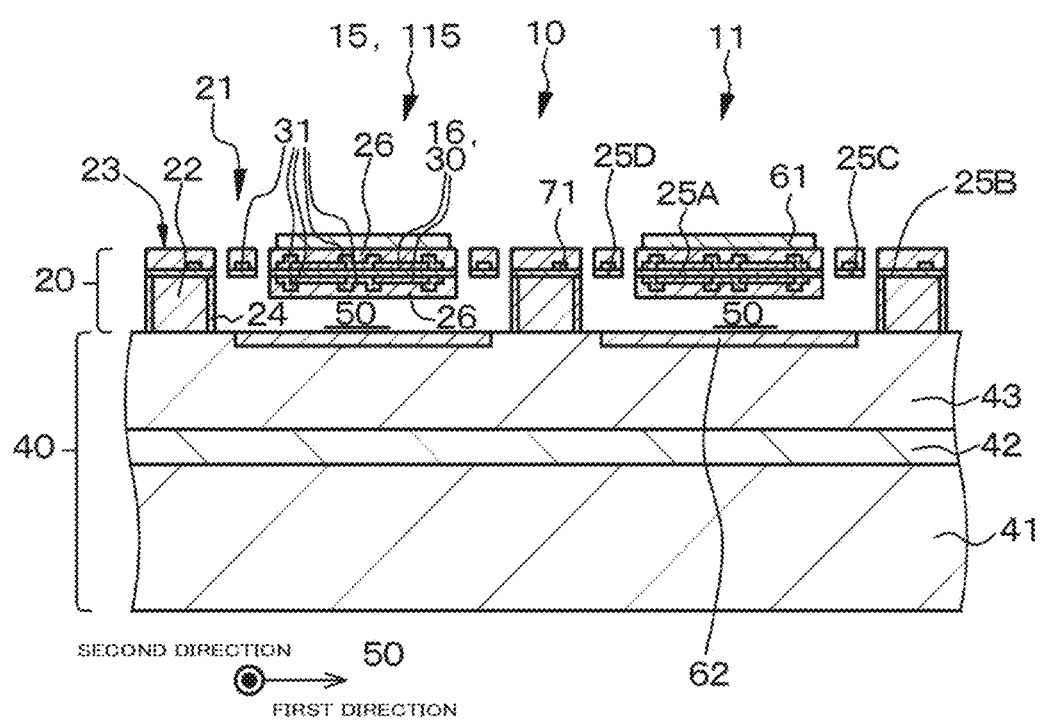
FIG. 34 is a schematic partial end view of an imaging apparatus created by vertically combining temperature detecting elements constituting the imaging apparatuses according to the first and fourth embodiments.

In addition, a sensor portion in the temperature detecting element having been described in the respective embodiments can be constituted by two sensor portions that are vertically arranged along an incidence of infrared light. While FIG. 34 shows an example which combines the modification of the first embodiment shown in FIG. 3A and the fourth embodiment shown in FIG. 13, it is needless to say that the sensor portion can also be applied to other embodiments. Specifically, such an imaging apparatus includes a sensor portion unit configured to detect a temperature based on infrared light, wherein
the sensor portion unit is made up of two sensor portions 16 vertically arranged along an incidence of infrared light, and
in the sensor portion unit, wavelengths of infrared light to be detected by the respective sensor portions 16 are the same or differ from each other or amounts of infrared absorption of the respective sensor portions 16 differ from each other. It should be noted that the two temperature detecting elements (sensor portions 16) may be connected to a same drive line and a same signal line or may be connected to different drive lines and different signal lines.

In addition, a temperature detecting element can be constituted by one of the temperature detecting elements that constitute the imaging apparatus according to the present disclosure, and an imaging apparatus can be adopted in which the temperature detecting elements that constitute the imaging apparatus according to the present disclosure are arranged one-dimensionally. In other words, generally, an imaging apparatus in which Q-number (where Q≥1) of the temperature detecting element constituting the imaging apparatus according to the present disclosure are arranged one-dimensionally or, in other words, an imaging apparatus including Q-number (where Q≥1) of one-dimensionally arranged temperature detecting elements can be adopted as the imaging apparatus according to the present disclosure.

Figure 32:
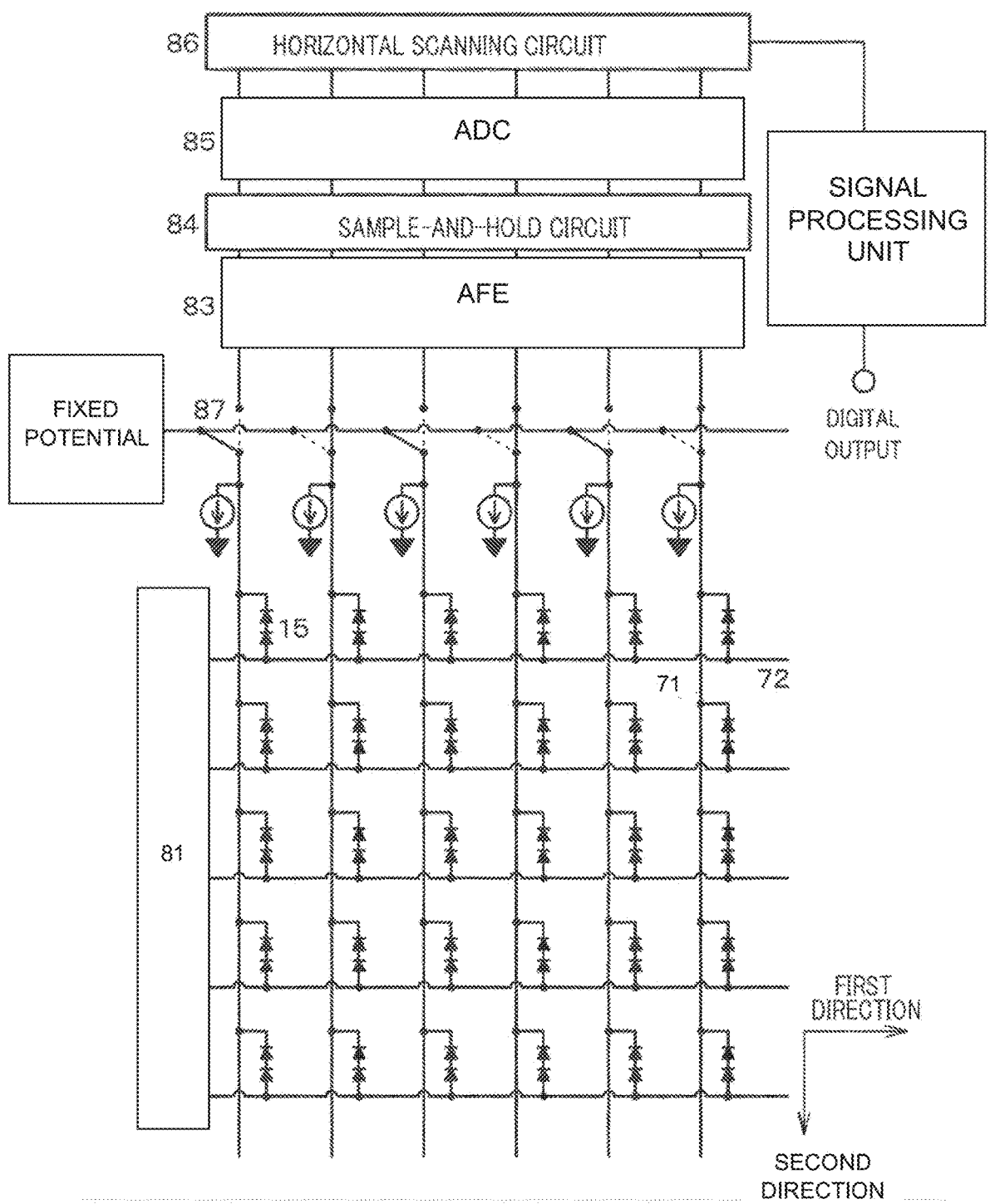
FIG. 32 is an equivalent circuit diagram of a modification of the imaging apparatus according to the seventh embodiment.

The imaging apparatus described in the seventh embodiment includes a temperature detecting element unit having a plurality of temperature detecting elements. In this case, when operating a single temperature detecting element in the temperature detecting element unit may suffice, as shown in the equivalent circuit diagram in FIG. 32, switching means 87 that controls a continuity state between a differential integrator circuit and the signal line 71 may be provided between the AFE 83 (specifically, the differential integrator circuit) and the signal line 71. In addition, in this case, when placing the differential integrator circuit and the signal line 71 in a non-continuity state, the switching means 87 preferably switches the signal line 71 to a fixed potential. Accordingly, a reduction in power consumption of the imaging apparatus can be achieved. Moreover, such a circuit configuration can also be applied to other embodiments. In other words, by decimating temperature detecting elements to be operated, although resolution drops, a reduction in power consumption of the imaging apparatus can be achieved. In a similar manner, in the ninth embodiment, by operating one of odd-numbered drive lines and even-numbered drive lines (or operating any of a set of a plurality of drive lines) and decimating the temperature detecting elements to be operated, although resolution drops, a reduction in power consumption of the imaging apparatus can be achieved. In addition, an amount of data to be read can be reduced and an increase in a data output rate can be achieved. When a high resolution is required, all of the temperature detecting elements need only be operated.

As shown in the schematic partial end view in FIG. 35A of the imaging apparatus according to the modification of the first embodiment shown in FIG. 3A, a configuration can be adopted in which a first infrared absorbing layer 61C is formed on a side of the sensor portion 16 to which infrared light is incident, an infrared reflecting layer 62 is formed in a region of the coating layer 43 that is positioned in a bottom portion of the void 50, and a second infrared absorbing layer 61D is formed on a side of the sensor portion 16 that opposes the void 50. In the illustrated example, the first infrared absorbing layer 61C is formed on an insulating film 26 having been formed on the sensor portion 16, and the second infrared absorbing layer 61D is formed on a surface of the temperature detecting element 15 that opposes the void 50 (more specifically, on a surface of a diaphragm portion 25A that opposes the void 50). Since the infrared absorbing layers 61C and 61D not only absorb infrared light but also partially transmit and partially reflect infrared light, adopting a structure that reduces transmission and reflection enables sensitivity to be further improved. In other words, since such a configuration causes a part of infrared light having been transmitted through the first infrared absorbing layer 61C to be further absorbed by the second infrared absorbing layer 61D, transmission can be reduced. In addition, due to infrared light reflected by the first infrared absorbing layer 61C and infrared light reflected by the second infrared absorbing layer 61D canceling out each other in opposite phases, reflection can be reduced. Furthermore, due to infrared light reflected by the second infrared absorbing layer 61D and infrared light reflected by the infrared reflecting layer 62 canceling out each other in opposite phases, reflection can be reduced. Moreover, when a wavelength of infrared light to be absorbed by the first infrared absorbing layer 61C and the second infrared absorbing layer 61D is denoted by $\lambda_{IR}$, an optical distance between the first infrared absorbing layer 61C and the second infrared absorbing layer 61D is denoted by $L_1$, and an optical distance between the second infrared absorbing layer 61D and the infrared reflecting layer 62 is denoted by $L_2$, $L_1$ and $L_2$ preferably satisfy $$0.75 \times \lambda_{IR}/4 \leq L_1 \leq 1.25 \times \lambda_{IR}/4 \text{ and}$$

$$0.75 \times \lambda_{IR}/4 \leq L_2 \leq 1.25 \times \lambda_{IR}/4.$$

It is needless to say that a configuration including the first infrared absorbing layer 61C and the second infrared absorbing layer 61D can be applied to other imaging apparatuses according to the first embodiment and to imaging apparatuses according to the other embodiments as deemed appropriate.

Alternatively, as shown in the schematic partial end view in FIG. 35B of the imaging apparatus according to the modification of the fourth embodiment shown in FIG. 15B, a configuration can be adopted in which a first infrared absorbing layer 61C is formed on a side of the sensor portion 16 to which infrared light is incident, an infrared reflecting layer 62 is formed in a region of the coating layer 43 that is positioned in a bottom portion of the void 50, and a second infrared absorbing layer 61D is formed on a side of the sensor portion 16 that opposes the void 50. The infrared reflecting layer 62 is formed in a part of the portion of the coating layer 43 that is positioned in the bottom portion of the void 50. The first infrared absorbing layer 61C is provided on a side of the first surface of the first substrate 121. Specifically, the first infrared absorbing layer 61 is provided on an infrared incidence side of the diaphragm portion 25A. The second infrared absorbing layer 61D is formed so as to oppose the void 50 on the insulating film 26 having been formed on the temperature detecting element 115. Since the respective infrared absorbing layers 61C and 61D not only absorb infrared light but also partially transmit and partially reflect infrared light, adopting a structure that reduces transmission and reflection enables sensitivity to be further improved. In other words, since such a configuration causes a part of infrared light having been transmitted through the first infrared absorbing layer 61C to be further absorbed by the second infrared absorbing layer 61D, transmission can be reduced. In addition, due to infrared light reflected by the first infrared absorbing layer 61C and infrared light reflected by the second infrared absorbing layer 61D canceling out each other in opposite phases, reflection can be reduced. Furthermore, due to infrared light reflected by the second infrared absorbing layer 61D and infrared light reflected by the infrared reflecting layer 62 canceling out each other in opposite phases, reflection can be reduced. Moreover, in this case, when a wavelength of infrared light to be absorbed by the first infrared absorbing layer 61C and the second infrared absorbing layer 61D is denoted by $\lambda_{IR}$, an optical distance between the first infrared absorbing layer 61C and the second infrared absorbing layer 61D is denoted by $L_1$, and an optical distance between the second infrared absorbing layer 61D and the infrared reflecting layer 62 is denoted by $L_2$, $L_1$ and $L_2$ preferably satisfy $$0.75 \times \lambda_{IR}/4 \leq L_1 \leq 1.25 \times \lambda_{IR}/4 \text{ and}$$

$$0.75 \times \lambda_{IR}/4 \leq L_2 \leq 1.25 \times \lambda_{IR}/4.$$

It is needless to say that a configuration including the first infrared absorbing layer 61C and the second infrared absorbing layer 61D can be applied to other imaging apparatuses according to the fourth embodiment and to imaging apparatuses according to the other embodiments as deemed appropriate.

Instead of providing partition walls 23 and 123 as shown in FIG. 36A, a columnar member 23A may be arranged in four corners of a temperature detecting element as shown in FIG. 36B which presents a schematic arrangement of a temperature detecting element, a first light-collecting portion, a second light-collecting portion, and the like. Arranging the columnar members 23A in this manner eliminates a risk of light collected by the first light-collecting portion 101 being scattered by the partition walls 23 and 123, and an improvement in light collection efficiency can be achieved without a size of the second light-collecting portion 102 being constrained by the partition walls 23 and 123. Moreover, such a modification can also be applied to other embodiments.

Fixed pattern noise correction processing by measuring noise in advance, noise reduction processing based on a noise model, and resolution correction processing based on a lens imaging model can be included in a signal processing circuit. In addition, an image obtained by an infrared camera can be composited with an image captured based on ordinary visible light. While an outline of the various types of signal processing will be described below, it is to be understood that signal processing is not limited thereto.

Examples of fixed pattern noise correction processing include processing that involves generating differential data in accordance with a difference between fixed pattern noise data obtained in a previous imaging frame and fixed pattern noise data obtained in a present imaging frame, adding up the differential data and the fixed pattern noise data obtained in a previous imaging frame, and adopting the sum data as new fixed pattern noise data.

In addition, examples of noise reduction processing using an infinite impulse response (IIR) filter include noise reduction processing constituted by:
  a first step of calculating an average value of signal values of reference pixels in a vicinity of a correction object pixel by IIR filter processing;
  a second step of calculating a variance value of the signal values of the reference pixels in the vicinity of the correction object pixel by IIR filter processing;
  a third step of inputting the average value and the variance value of the reference pixels and executing edge-preserving smoothing processing to which the average value and the variance value are applied; and
  a fourth step of updating the IIR filter coefficients applied in the first step and the second step in accordance with signal values of pixels that constitute an image.

Furthermore, examples of resolution correction processing include a method of acquiring a filter for performing blur correction that is set to each of a plurality of image heights and correcting a pixel value of a pixel at an image height having been set as a correction object using the acquired filter. In this case, the correction can take the form of processing involving applying a filter being set to an image height that is adjacent to an image height having been set as a correction object to a pixel value of a pixel having been set as a correction object, calculating a coefficient from a positional relationship between the image height having been set as a correction object and the adjacent image height, and calculating a pixel value after correction using the pixel value after applying the filter and the coefficient. Alternatively, the correction can take the form of processing involving calculating a coefficient from a positional relationship between an image height having been set as a correction object and an adjacent image height, generating a filter to be applied to a pixel value of a pixel having been set as a correction object using a filter being set to the image height that is adjacent to the image height having been set as a correction object and the coefficient, and calculating a pixel value after correction using the generated filter and the pixel value of the pixel having been set as a correction object. Furthermore, the coefficient of the filter can be a coefficient that is obtained by calculating PSF (Point Spread Function) data from a plurality of image points on a first image height, averaging the PSF data, approximating the averaged PSF data with a predetermined function, and calculating the coefficient from the approximated PSF data, and the coefficient of the filter can be calculated using the Wiener filter.

The present disclosure can also be configured as follows.

[A01]<Temperature Detecting Element>

A temperature detecting element, including:
- a light-collecting portion constituted by a first light-collecting portion to which infrared light is incident and a second light-collecting portion to which infrared light having been exited from the first light-collecting portion is incident; and
- a sensor portion to which infrared light having been exited from the second light-collecting portion is incident, wherein
- at least one of the first light-collecting portion and the second light-collecting portion is provided on a base configured to cover the temperature detecting element.

[A02] The temperature detecting element according to [A01], wherein the first light-collecting portion is provided on a first surface of the base that is an infrared incident surface and the second light-collecting portion is provided on a second surface that opposes the first surface of the base.

[A03] The temperature detecting element according to [A01], wherein the first light-collecting portion and the second light-collecting portion are provided on a first surface of the base that is an infrared incident surface.

[A04] The temperature detecting element according to any one of [A01] to [A03], wherein an orthogonally projected image of a center of the first light-collecting portion to the sensor portion, an orthogonally projected image of a center of the second light-collecting portion to the sensor portion, and a center of the sensor portion are at different positions.

[A05] The temperature detecting element according to [A04], wherein the orthogonally projected image of the center of the first light-collecting portion, the orthogonally projected image of the center of the second light-collecting portion, and the center of the sensor portion are positioned on a single straight line.

[A06] The temperature detecting element according to any one of [A01] to [A05], wherein the sensor portion is configured to detect a temperature based on infrared light.

[B01]<Imaging Apparatus>

An imaging apparatus having a temperature detecting element array region which is constituted by a plurality of temperature detecting elements and which is covered by the base through which infrared light passes, wherein
each temperature detecting element includes:
- a light-collecting portion constituted by a first light-collecting portion to which infrared light is incident and a second light-collecting portion to which infrared light having been exited from the first light-collecting portion is incident; and
- a sensor portion to which infrared light having been exited from the second light-collecting portion is incident, and
- at least one of the first light-collecting portion and the second light-collecting portion is provided on the base.

[B02] The imaging apparatus according to [B01], wherein in each temperature detecting element, when $DT_1$ denotes a distance between an orthogonally projected image of the center of the first light-collecting portion to the sensor portion and the center of the sensor portion and $DT_2$ denotes a distance between an orthogonally projected image of the center of the second light-collecting portion to the sensor portion and the center of the sensor portion, values of $DT_1$ and $DT_2$ differ depending on a position occupied by the temperature detecting element in the temperature detecting element array region.

[B03] The imaging apparatus according to [B02], wherein the orthogonally projected image of the center of the first light-collecting portion, the orthogonally projected image of the center of the second light-collecting portion, and the center of the sensor portion are positioned on a single straight line.

[B04] The imaging apparatus according to [B02] or [B03], wherein the more distant a position of the temperature detecting element is from a center portion of the temperature detecting element array region, the larger the value of $DT_1$.

[B05] The imaging apparatus according to any one of [B01] to [B04], wherein a single first light-collecting portion is provided so as to straddle a plurality of temperature detecting elements.

[B06] The imaging apparatus according to [B05], wherein a single first light-collecting portion is provided so as to straddle two temperature detecting elements.

[B07] The imaging apparatus according to [B06], wherein
an imaging lens (an imaging optical system) is provided on an infrared light incidence side of the base, and
one first light-collecting portion is configured to form a real image in a first region of a pupil of the imaging lens (an exit pupil of the imaging optical system) in the second light-collecting portion of one of the two temperature detecting elements, and configured to form a real image in a second region of the pupil of the imaging lens in the second light-collecting portion of the other of the two temperature detecting elements.

[B08] The imaging apparatus according to [B07], wherein a parallax (or a deviation) exists in images obtained by the two temperature detecting elements.

[B09] The imaging apparatus according to [B05], wherein a single first light-collecting portion is provided so as to straddle four temperature detecting elements.

[B10] The imaging apparatus according to [B09], wherein
an imaging lens (an imaging optical system) is provided on an infrared light incidence side of the base, and
one first light-collecting portion is configured to form a real image in a first region of a pupil of the imaging lens in the second light-collecting portion of a first temperature detecting element among the four temperature detecting elements, configured to form a real image in a second region of the pupil of the imaging lens in the second light-collecting portion of a second temperature detecting element among the four temperature detecting elements, configured to form a real image in a third region of the pupil of the imaging lens in the second light-collecting portion of a third temperature detecting element among the four temperature detecting elements, and configured to form a real image in a fourth region of the pupil of the imaging lens in the second light-collecting portion of a fourth temperature detecting element among the four temperature detecting elements.

[B11] The imaging apparatus according to [B10], wherein a parallax (or a deviation) exists in images obtained by the four temperature detecting elements.

[B12] The imaging apparatus according to any one of [B01] to [B11], wherein
the first light-collecting portion is provided on a first surface of the base that is an infrared incident surface and
the second light-collecting portion is provided on a second surface that opposes the first surface of the base.

[B13] The imaging apparatus according to any one of [B01] to [B11], wherein the first light-collecting portion and the second light-collecting portion are provided on a first surface of the base that is an infrared incident surface.

[B14] The imaging apparatus according to any one of [B01] to [B13], wherein the sensor portion is configured to detect a temperature based on infrared light.

[C01] <Imaging Apparatus: First Aspect>
The imaging apparatus according to any one of [B01] to [B14], the imaging apparatus being constituted by
a first structure and a second structure, wherein
the first structure includes
a first substrate,
a temperature detecting element which is provided on the first substrate and which is configured to detect a temperature based on infrared light, and
a drive line and a signal line connected to the temperature detecting element, the second structure includes
a second substrate and
a drive circuit which is provided on the second substrate and which is coated by a coating layer,
the first substrate is joined to the coating layer, and
a void is provided between the temperature detecting element and the coating layer.

[C02] The imaging apparatus according to any one of [B01] to [B14], the imaging apparatus including
a plurality of temperature detecting elements arranged in a first direction and a second direction that differs from the first direction, wherein
the imaging apparatus further includes
a plurality of drive lines which are arranged along the first direction and to which a plurality of temperature detecting elements are respectively connected and
a plurality of signal lines which are arranged along the second direction and to which a plurality of temperature detecting elements are respectively connected, the first structure has a temperature detecting element array region including temperature detecting elements and a peripheral region that encloses the temperature detecting element array region, and
the drive lines and the signal lines are electrically connected to the drive circuit in the peripheral region.

[C03] The imaging apparatus according to any one of [B01] to [B14], including Q-number (where Q≥1) of one-dimensionally arranged temperature detecting elements.

[C04] The imaging apparatus according to any one of [B01] to [C03], wherein a partition wall is formed in a portion of the first substrate that is positioned between a temperature detecting element and another temperature detecting element, and
a bottom portion of the partition wall is joined to the coating layer.

[C05] The imaging apparatus according to [C04], wherein
an exposed surface of the coating layer that is exposed to a void is constituted by at least one type of material layer selected from a group consisting of an insulating material layer, a metal material layer, an alloy material layer, and a carbon material layer, and
a side wall among the partition wall is constituted by at least one type of material layer selected from a group consisting of an insulating material layer, a metal material layer, an alloy material layer, and a carbon material layer.

[C06] The imaging apparatus according to [C04], wherein an exposed surface of the coating layer that is exposed to the void is constituted by at least one type of material layer selected from a group consisting of an insulating material layer, a metal material layer, an alloy material layer, and a carbon material layer.

[C07] The imaging apparatus according to [C04] or [C06], wherein a side wall of the partition wall is constituted by at least one type of material layer selected from a group consisting of an insulating material layer, a metal material layer, an alloy material layer, and a carbon material layer.

[C08] The imaging apparatus according to any one of [C04] to [C07], wherein
an infrared absorbing layer is formed on a side of the temperature detecting element to which infrared light is incident, and
an infrared reflecting layer is formed in a region of the coating layer that is positioned in a bottom portion of the void.

[C09] The imaging apparatus according to [C08], wherein the infrared absorbing layer is formed above the temperature detecting element.

[C10] The imaging apparatus according to [C08] or [C09], wherein the infrared reflecting layer is formed on a top surface of the coating layer or formed inside the coating layer.

[C11] The imaging apparatus according to any one of [C08] to [C10], wherein when a wavelength of infrared light to be absorbed by the infrared absorbing layer is denoted by $\lambda_{IR}$, an optical distance $L_0$ between the infrared absorbing layer and the infrared reflecting layer satisfies $$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4.$$

[C12] The imaging apparatus according to any one of [C04] to [C07], wherein
a first infrared absorbing layer is formed on a side of the temperature detecting element to which infrared light is incident,
an infrared reflecting layer is formed in a region of the coating layer that is positioned in a bottom portion of the void, and
a second infrared absorbing layer is formed on a side of the temperature detecting element that opposes the void.

[C13] The imaging apparatus according to [C12], wherein
when a wavelength of infrared light to be absorbed by the first infrared absorbing layer and the second infrared absorbing layer is denoted by $\lambda_{IR}$, an optical distance between the first infrared absorbing layer and the second infrared absorbing layer is denoted by $L_1$, and an optical distance between the second infrared absorbing layer and the infrared reflecting layer is denoted by $L_2$, $L_1$ and $L_2$ satisfy $$0.75 \times \lambda_{IR}/4 \leq L_1 \leq 1.25 \times \lambda_{IR}/4 \text{ and}$$

$$0.75 \times \lambda_{IR}/4 \leq L_2 \leq 1.25 \times \lambda_{IR}/4.$$

[C14] The imaging apparatus according to any one of [B01] to [C03], wherein
a partition wall is formed independent of the first substrate between a portion of the first substrate that is positioned between a temperature detecting element and another temperature detecting element and the coating layer, and
the bottom portion of the partition wall is joined to the coating layer.

[C15] The imaging apparatus according to [C14], wherein an exposed surface of the coating layer that is exposed to the void is constituted by at least one type of material layer selected from a group consisting of an insulating material layer, a metal material layer, an alloy material layer, and a carbon material layer, and
the partition wall is constituted by at least one type of material layer selected from a group consisting of an insulating material layer, a metal material layer, an alloy material layer, and a carbon material layer.

[C16] The imaging apparatus according to [C14], wherein an exposed surface of the coating layer that is exposed to the void is constituted by at least one type of material layer selected from a group consisting of an insulating material layer, a metal material layer, an alloy material layer, and a carbon material layer.

[C17] The imaging apparatus according to [C14] or [C16], wherein the partition wall is constituted by at least one type of material layer selected from a group consisting of an insulating material layer, a metal material layer, an alloy material layer, and a carbon material layer.

[C18] The imaging apparatus according to any one of [C14] to [C17], wherein
an infrared absorbing layer is formed on a side of the temperature detecting element to which infrared light is incident, and
an infrared reflecting layer is formed in a region of the coating layer that is positioned in a bottom portion of the void.

[C19] The imaging apparatus according to [C18], wherein the infrared reflecting layer is formed on a top surface of the coating layer or formed inside the coating layer.

[C20] The imaging apparatus according to [C18] or [C19], wherein
when a wavelength of infrared light to be absorbed by the infrared absorbing layer is denoted by $\lambda_{IR}$, an optical distance $L_0$ between the infrared absorbing layer and the infrared reflecting layer satisfies $$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4.$$

[C21] The imaging apparatus according to any one of [C14] to [C17], wherein
a first infrared absorbing layer is formed on a side of the temperature detecting element to which infrared light is incident,
an infrared reflecting layer is formed in a region of the coating layer that is positioned in a bottom portion of the void, and
a second infrared absorbing layer is formed on a side of the temperature detecting element that opposes the void.

[C22] The imaging apparatus according to [C21], wherein when a wavelength of infrared light to be absorbed by the first infrared absorbing layer and the second infrared absorbing layer is denoted by $\lambda_{IR}$, an optical distance between the first infrared absorbing layer and the second infrared absorbing layer is denoted by $L_1$, and an optical distance between the second infrared absorbing layer and the infrared reflecting layer is denoted by $L_2$, $L_1$ and $L_2$ satisfy $$0.75 \times \lambda_{IR}/4 \leq L_1 \leq 1.25 \times \lambda_{IR}/4 \text{ and}$$

$$0.75 \times \lambda_{IR}/4 \leq L_2 \leq 1.25 \times \lambda_{IR}/4.$$

[C23] The imaging apparatus according to any one of [C14] to [C20], wherein a protective member is arranged on a side of a surface of the first substrate to which infrared light is incident.

[C24] The imaging apparatus according to any one of [B01] to [C03], including
a temperature detecting element unit configured to detect a temperature based on infrared light;
the temperature detecting element unit is made up of two temperature detecting elements vertically arranged along an incidence of infrared light; and
in the temperature detecting element unit, wavelengths of infrared light detected by the respective temperature detecting elements are the same or differ from each other or amounts of infrared absorption of the respective temperature detecting elements differ from each other.

[C25] The imaging apparatus according to any one of [B01] to [C23], wherein a thermally conductive layer is formed in the coating layer.

[C26] The imaging apparatus according to any one of [B01] to [C25], wherein a temperature control layer is formed in the coating layer, and
the imaging apparatus further includes temperature detecting means.

[C27] The imaging apparatus according to [C26], wherein the temperature control layer functions as a heater.

[C28] The imaging apparatus according to [C27], wherein the temperature control layer doubles as a wiring.

[C29] The imaging apparatus according to any one of [C26] to [C28], wherein the drive circuit controls the temperature control layer based on a temperature detection result of the temperature detecting means.

[C30] The imaging apparatus according to any one of [C26] to [C29], wherein
the first structure includes a temperature detecting element array region including a plurality of temperature detecting elements and a peripheral region that encloses the temperature detecting element, and
the temperature control layer is formed in the temperature detecting element array region.

[C31] The imaging apparatus according to any one of [C26] to [C29], wherein the temperature control layer is formed in a region of the coating layer in which an orthogonally projected image of the temperature detecting element array region exists.

[C32] The imaging apparatus according to any one of [B01] to [C29], wherein the drive circuit includes an analog-digital converter circuit and the analog-digital converter circuit is not arranged in a region of the drive substrate in which an orthogonally projected image of the temperature detecting element array region exists.

[C33] The imaging apparatus according to any one of [B01] to [C32], including a plurality of temperature detecting elements, wherein the void is shared between 2×k-number of adjacent temperature detecting elements (where k is an integer equal to or larger than 1).

[C34]<Imaging Apparatus: Second Aspect>
An imaging apparatus including a temperature detecting element unit configured to detect a temperature based on infrared light, wherein the temperature detecting element unit is made up of a plurality of juxtaposed temperature detecting elements, and wavelengths of infrared light to be detected by the respective temperature detecting elements differ from each other in the temperature detecting element unit.

[C35] The imaging apparatus according to [C34], wherein
each temperature detecting element includes an infrared absorbing layer on an infrared incidence side and an infrared reflecting layer on an opposite side to the infrared incidence side and, in the temperature detecting element unit, optical distances $L_0$ between the infrared absorbing layer and the infrared reflecting layer among the respective temperature detecting elements differ from each other, and when a wavelength of infrared light to be absorbed by the infrared absorbing layer that constitutes each temperature detecting element is denoted by $\lambda_{IR}$, the optical distance $L_0$ in each temperature detecting element satisfies $$0.75 \times \lambda_{IR}/2 \le L_0 \le 1.25 \times \lambda_{IR}/2$$

or $$0.75 \times \lambda_{IR}/4 \le L_0 \le 1.25 \times \lambda_{IR}/4.$$

[C36] The imaging apparatus according to [C34] or [C35], wherein each temperature detecting element has an infrared absorbing layer on an infrared incidence side and has an infrared reflecting layer on an opposite side to the infrared incidence side and, in the temperature detecting element unit, a material that constitutes the infrared absorbing layer, a material, a configuration, or a structure that constitutes the infrared reflecting layer, or a material, a configuration, or a structure that constitutes the infrared absorbing layer and a material, a configuration, or a structure that constitutes the infrared reflecting layer differs among the respective temperature detecting elements.

[C37]<Imaging Apparatus: Third Aspect>
An imaging apparatus including a temperature detecting element unit configured to detect a temperature based on infrared light, wherein the temperature detecting element unit is made up of a plurality of juxtaposed temperature detecting elements, and amounts of infrared absorption by the respective temperature detecting elements differ from each other in the temperature detecting element unit.

[C38] The imaging apparatus according to [C37], wherein
each temperature detecting element has an infrared absorbing layer on an infrared incidence side and has an infrared reflecting layer on an opposite side to the infrared incidence side and, in the temperature detecting element unit, a material that constitutes the infrared absorbing layer, a material that constitutes the infrared reflecting layer, or a material that constitutes the infrared absorbing layer and a material that constitutes the infrared reflecting layer differs among the respective temperature detecting elements.

[C39] The imaging apparatus according to [C37] or [C38], wherein each temperature detecting element has an infrared absorbing layer on an infrared incidence side and has an infrared reflecting layer on an opposite side to the infrared incidence side and, in the temperature detecting element unit, an area, a thickness, or an area and a thickness of the infrared absorbing layer, the infrared reflecting layer, or the infrared absorbing layer and the infrared reflecting layer differs among the respective temperature detecting elements.

[C40] The imaging apparatus according to any one of [B01] to [C39], wherein in the drive circuit, each signal line is connected to an analog front end and an analog-digital converter circuit.

[C41] The imaging apparatus according to [C40], wherein
the analog front end has a differential integrator circuit, and switching means configured to control a continuity state of the differential integrator circuit and the signal line is provided between the differential integrator circuit and the signal line.

[C42] The imaging apparatus according to [C41], wherein the switching means is configured to set the signal line to a fixed potential when creating a non-continuity state between the differential integrator circuit and the signal line.

[C43]<Imaging Apparatus: Fourth Aspect>
An imaging apparatus including:

$M_0 \times N_0$ (where $M_0 \ge 2$, $N_0 \ge 2$) number of temperature detecting elements which are arranged in a first direction and a second direction that differs from the first direction and which are configured to detect a temperature based on infrared light;

a plurality of drive lines which are arranged along the first direction;

$N_0 \times P_0$ (where $P_0 \ge 2$) number of signal lines which are arranged along the second direction;

a first drive circuit to which the plurality of drive lines are connected; and a second drive circuit to which the $N_0 \times P_0$ number of signal lines are connected, wherein each temperature detecting element includes a first terminal portion and a second terminal portion, the first terminal portion of each temperature detecting element is connected to a drive line, and an (n, p)-th signal line (where n=1, 2, . . . , $N_0$, p=1, 2, . . . , $P_0$) is connected to the second terminal portion of a $\{(q-1)P_0+p\}$-th temperature detecting element (where, q=1, 2, 3, . . . ) in a temperature detecting element group constituted by $N_0$-number of an n-th temperature detecting element arranged along the second direction.

[C44] The imaging apparatus according to [C43], wherein the number of the plurality of drive lines is $M_0/P_0$, and an m-th drive line (where m=1, 2, ..., $M_0/P_0$) is shared in a temperature detecting element group constituted by $M_0$-number of a $\{(m-1)P_0+p'\}$-th temperature detecting element (where p'=1, 2, ..., all values of $P_0$) arranged along the first direction.

[C45] The imaging apparatus according to [C43] or [C44], wherein
in the second drive circuit, each signal line is connected to an analog front end and an analog-digital converter circuit, and
the analog front end has a differential integrator circuit.

[C46] The imaging apparatus according to [C43] or [C44], wherein in the second drive circuit, each signal line is connected to an analog front end and an analog-digital converter circuit.

[C47] The imaging apparatus according to [C46], wherein the analog front end has a differential integrator circuit.

[C48] The imaging apparatus according to any one of [C43] to [C47], wherein
the temperature detecting element is arranged above a void provided in a temperature detecting element substrate,
a first connecting portion provided in the temperature detecting element substrate and a first terminal portion of the temperature detecting element are connected via a first stud portion (a supporting leg or an elongated beam), and
a second connecting portion provided in the temperature detecting element substrate and a second terminal portion of the temperature detecting element are connected via a second stud portion (a supporting leg or an elongated beam).

[C49] The imaging apparatus according to [C48], wherein $P_0=2$,
respective second terminal portions of two temperature detecting elements adjacent to each other in the second direction are connected to a second connecting portion provided in the temperature detecting element substrate via a single second stud portion (a supporting leg or an elongated beam), and
respective first terminal portions of a total of four temperature detecting elements including two temperature detecting elements adjacent to each other in the first direction and two temperature detecting elements adjacent to each other in the second direction are connected to a first connecting portion provided in the temperature detecting element substrate via a single first stud portion (a supporting leg or an elongated beam).

[C50]<Imaging Apparatus: Fifth Aspect>
An imaging apparatus including:
$S_0 \times T_0$ (where $S_0 \geq 2$, $T_0 \geq 2$) number of temperature detecting elements which are arranged in a first direction and a second direction that differs from the first direction and which are configured to detect a temperature based on infrared light;
$S_0 \times U_0$ (where $U_0 \geq 2$) number of drive lines which are arranged along the first direction;
a plurality of signal lines which are arranged along the second direction;
a first drive circuit to which the $S_0 \times U_0$ number of drive lines are connected; and
a second drive circuit to which the plurality of signal lines are connected, wherein each temperature detecting element includes a first terminal portion and a second terminal portion,
the second terminal portion of each temperature detecting element is connected to a signal line, and
an (s, u)-th drive line (where s=1, 2, ..., $S_0$, u=1, 2, ..., $U_0$) is connected to the first terminal portion of a $\{(t-1)U_0+u\}$-th temperature detecting element (where, t=1, 2, 3, ...) in a temperature detecting element group constituted by $S_0$-number of an s-th temperature detecting element arranged along the first direction.

[C51] The imaging apparatus according to [C50], wherein in the second drive circuit, each signal line is connected to an analog front end and an analog-digital converter circuit.

[C52]<Imaging Apparatus: Sixth Aspect>
An imaging apparatus constituted by
a first structure and a second structure, wherein
the first structure includes
a first substrate,
a plurality of temperature detecting elements which are provided on the first substrate, which are arranged in a first direction and a second direction that differs from the first direction, and which are configured to detect a temperature based on infrared light,
a plurality of drive lines which are arranged along the first direction and to which a plurality of temperature detecting elements are respectively connected, and
a plurality of signal lines which are arranged along the second direction and to which a plurality of temperature detecting elements are respectively connected, the second structure has
a second substrate and
a drive circuit provided on the second substrate,
the first structure further includes a temperature detecting element array region including a plurality of temperature detecting elements and a peripheral region that encloses the temperature detecting element array region,
the second structure is attached to a side of the first substrate to which infrared light is incident, and
the drive lines and the signal lines are electrically connected to the drive circuit in the peripheral region.

[C53] The imaging apparatus according to any one of [B01] to [C52], wherein the temperature detecting element is made of a p-n junction diode, a bolometer element, a thermopile element, a metal film resistive element, a metal oxide resistive element, a ceramic resistive element, or a thermistor element.

[C54] The imaging apparatus according to any one of [B01] to [C53], further including a light-shielding portion.

[D01]<Noise Reduction Method in Imaging Apparatus>
A noise reduction method in an imaging apparatus including
a temperature detecting element which detects a temperature based on infrared light,
a drive line to which the temperature detecting element is connected, and
a signal line to which the temperature detecting element is connected,
the imaging apparatus further including
a first drive circuit to which the drive line is connected, a second drive circuit to
which the signal line is connected, and a storage apparatus, and
in the second drive circuit, the signal line being connected to a differential integrator circuit and an analog-digital converter circuit, the noise reduction method including the steps of;
placing the temperature detecting element in a non-operating state and resetting the differential integrator circuit; next placing the temperature detecting element in a non-operating state, passing a constant current through the signal line for a same time $TM_0$ as a time $TM_0$ during which the temperature detecting element is in an operating state, integrating voltage of the signal line by the differential integrator circuit, converting the obtained integral value into a digital value at the analog-digital converter circuit, and storing the obtained digital value as an offset value in the storage apparatus; and placing the temperature detecting element in an operating state only for a time $TM_0$, integrating voltage of the signal line by the differential integrator circuit, converting the obtained integral value into a digital value at the analog-digital converter circuit to obtain a digital signal value, and subsequently subtracting the offset value from the digital signal value.

REFERENCE SIGNS LIST 10, 10A Imaging apparatus
11 Temperature detecting element array region
13 Central region
12, 14 Peripheral region
15, $15_1$, $15_2$, 15A, 15B, 15C, 115, 215A, 215B, 315A, 315B Temperature detecting element (thermal image sensor)
20 First structure
21, 121 First substrate (temperature detecting element substrate)
21A, 121A First surface of first substrate
21B, 121B Second surface of first substrate
122 Protective member (protective substrate)
22 Silicon layer
22A Convex portion extending from silicon layer
23, 123 Partition wall
23A Columnar member
24 Side wall of partition wall
24A Side wall of convex portion
25A Diaphragm portion (overhead portion, overhead thin layer portion)
25B Insulating material layer
25C First stud portion
25D Second stud portion
26 Insulating film
30 p-n junction diode
31 Wiring
40 Second structure
41 Second substrate
42 Layer on which drive circuit is formed
43 Coating layer (interlayer insulating layer)
50 Void
51 Cavity
61, 61A, 61B, 61C, 61D Infrared absorbing layer
62, 62A, 62B Infrared reflecting layer
63 Thermally conductive layer
64 Temperature control layer (heater)
71, 71A, $71_{1,1}$, $71_{2,1}$, $71_{3,1}$, 71B, $71_{1,2}$, $71_{2,2}$, $71_{3,2}$ Signal line
72, 72A, $72_{1,1}$, $72_{2,1}$, $72_{3,1}$, 72B, $72_{1,2}$, $72_{2,2}$, $72_{3,3}$ Drive line
73 Contact hole
81 Vertical scanning circuit
82 Constant current circuit
83, 83a, 83b Analog front end (AFE)
83A Differential integrator circuit
83B Wiring
83C Constant current circuit
83D Switching means
84 Sample-and-hold circuit
85, 85a, 85b Analog-digital converter circuit (ADC)
86 Horizontal scanning circuit
90 SOI substrate
91 First silicon layer
92 $SiO_2$ layer
93 Second silicon layer
94 First sacrificial layer
95 Second sacrificial layer
96 Supporting substrate
97 Sacrificial layer
100 Base
101 First light-collecting portion
102 Second light-collecting portion
103 Light-shielding portion
301 Imaging lens (imaging optical system)
302 Shutter
303 Imaging apparatus
304 Drive circuit 304
305 Power source portion
306 Storage medium
307 Video output portion
308 Various interfaces

The invention claimed is:

1. A first temperature detecting element, comprising:
a light-collecting portion that includes:
  a first light-collecting portion to which infrared light is incident, wherein the first light-collecting portion straddles the first temperature detecting element and a second temperature detecting element; and
  a second light-collecting portion to which the infrared light that exits the first light-collecting portion is incident;
a base configured to cover the first temperature detecting element and the second temperature detecting element, wherein the first light-collecting portion and the second light-collecting portion are on the base;
an imaging lens on an infrared light incidence side of the base, wherein
  the first light-collecting portion is configured to generate a first real image in a first region of a pupil of the imaging lens in the second light-collecting portion,
  the first region is different from a second region,
  the second region corresponds to a region of the pupil of the imaging lens in a third light-collecting portion of the second temperature detecting element, where a second real image is generated by the first light-collecting portion, and
  the third light-collecting portion of the second temperature detecting element corresponds to the second light-collecting portion of the first temperature detecting element; and
a sensor portion to which the infrared light that exits second light-collecting portion is incident.

2. The first temperature detecting element according to claim 1, wherein
the first light-collecting portion is on a first surface of the base,
the first surface is an infrared incident surface,
the second light-collecting portion is on a second surface of the base, and
the second surface opposes the first surface of the base.

3. The first temperature detecting element according to claim 1, wherein
the first light-collecting portion and the second light-collecting portion are on a first surface of the base, and
the first surface is an infrared incident surface.

4. The first temperature detecting element according to claim 1, wherein an orthogonally projected image of a center of the first light-collecting portion to the sensor portion, an orthogonally projected image of a center of the second light-collecting portion to the sensor portion, and a center of the sensor portion are at different positions.

5. The first temperature detecting element according to claim 4, wherein the orthogonally projected image of the center of the first light-collecting portion, the orthogonally projected image of the center of the second light-collecting portion, and the center of the sensor portion are positioned on a single straight line.

6. The first temperature detecting element according to claim 1, wherein the sensor portion is configured to detect a temperature based on the infrared light.

7. An imaging apparatus, comprising:
a temperature detecting element array region that includes a plurality of temperature detecting elements, wherein
the plurality of temperature detecting elements includes a first temperature detecting element and a second temperature detecting element,
a base is configured to cover each of the plurality of temperature detecting elements,
the base is configured to allow infrared light to pass through, and
each temperature detecting element of the plurality of temperature detecting elements includes:
a light-collecting portion that includes:
a first light-collecting portion to which the infrared light is incident, wherein the first light-collecting portion straddles the first temperature detecting element and the second temperature detecting element; and
a second light-collecting portion to which the infrared light that exits the first light-collecting portion is incident;
an imaging lens on an infrared light incidence side of the base, wherein the first light-collecting portion is configured to:
generate a first real image in a first region of a pupil of the imaging lens in the second light-collecting portion of the first temperature detecting element; and
generate a second real image in a second region of the pupil of the imaging lens in the second light-collecting portion of the second temperature detecting element; and
a sensor portion to which the infrared light that exits from the second light-collecting portion is incident.

8. The imaging apparatus according to claim 7, wherein, in each temperature detecting element of the plurality of temperature detecting elements,
in a case where DT1 denotes a distance between an orthogonally projected image of a center of the first light-collecting portion to the sensor portion and a center of the sensor portion and DT2 denotes a distance between an orthogonally projected image of a center of the second light-collecting portion to the sensor portion and a center of the sensor portion, values of DT1 and DT2 differ based on a position of the temperature detecting element in the temperature detecting element array region.

9. The imaging apparatus according to claim 8, wherein the orthogonally projected image of the center of the first light-collecting portion, the orthogonally projected image of the center of the second light-collecting portion, and the center of the sensor portion are positioned on a single straight line.

10. The imaging apparatus according to claim 8, wherein, more distant a position of the temperature detecting element is from a center portion of the temperature detecting element array region, larger is a value of DT1.

11. The imaging apparatus according to claim 7, wherein a parallax exists in images obtained by the plurality of temperature detecting elements.

12. The imaging apparatus according to claim 7, wherein
the plurality of temperature detecting elements includes four temperature detecting elements,
the four temperature detecting elements includes the first temperature detecting element, the second temperature detecting element, a third temperature detecting element, and a fourth temperature detecting element, and
a single first light-collecting portion straddles the four temperature detecting elements.

13. The imaging apparatus according to claim 12, wherein the first light-collecting portion is further configured to:
generate a third real image in a third first region of the pupil of the imaging lens in the second light-collecting portion of the third temperature detecting element, and
generate a fourth real image in a fourth region of the pupil of the imaging lens in the second light-collecting portion of the fourth temperature detecting element.

14. The imaging apparatus according to claim 13, wherein a parallax exists in images obtained by the four temperature detecting elements.

15. The imaging apparatus according to claim 7, wherein
the first light-collecting portion is on a first surface of the base,
the first surface is an infrared incident surface,
the second light-collecting portion is on a second surface of the base, and
the second surface opposes the first surface of the base.

16. The imaging apparatus according to claim 7, wherein
the first light-collecting portion and the second light-collecting portion are on a first surface of the base, and
the first surface is an infrared incident surface.

17. The imaging apparatus according to claim 7, wherein the sensor portion is configured to detect a temperature based on the infrared light.

* * * * *